United States Patent
Iwata et al.

(10) Patent No.: US 7,079,414 B2
(45) Date of Patent: Jul. 18, 2006

(54) MAGNETIC RANDOM ACCESS MEMORY DEVICE

(75) Inventors: Yoshihisa Iwata, Yokohama (JP); Yuui Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 190 days.

(21) Appl. No.: 10/765,131

(22) Filed: Jan. 28, 2004

(65) Prior Publication Data

US 2004/0252551 A1 Dec. 16, 2004

(30) Foreign Application Priority Data

Apr. 25, 2003 (JP) ............... 2003-121633

(51) Int. Cl.
*G11C 11/00* (2006.01)

(52) U.S. Cl. ............... 365/158; 365/157; 365/171; 365/209; 365/213

(58) Field of Classification Search ............... 365/158, 365/157, 171, 209, 213
See application file for complete search history.

(56) References Cited

U.S. PATENT DOCUMENTS

| | | | |
|---|---|---|---|
| 6,081,445 A | 6/2000 | Shi et al. | |
| 6,163,477 A | 12/2000 | Tran | |
| 6,205,051 B1 | 3/2001 | Brug et al. | |
| 6,865,104 B1 * | 3/2005 | Perner | 365/158 |
| 2005/0128793 A1 * | 6/2005 | Ho et al. | 365/158 |

FOREIGN PATENT DOCUMENTS

| | | |
|---|---|---|
| JP | 2003-109374 | 4/2003 |
| JP | 2003-173672 | 6/2003 |
| JP | 2003-267175 | 9/2003 |

OTHER PUBLICATIONS

Roy Scheuerlein, et al., "A 10ns Read and Write Non-Volatile Memory Array Using a Magnetic Tunnel Junction and FET Switch in each Cell", 2000 IEEE International Solid-State Circuits Conference, ISSCC 2000, Digest of Technical Papers, TD: Emerging Memory & Device Technologies, Session 7, Paper TA 7.2, Feb. 2000, 6 pages.

(Continued)

*Primary Examiner*—Richard Elms
*Assistant Examiner*—N. Nguyen
(74) *Attorney, Agent, or Firm*—Oblon, Spivak, McClelland, Maier & Neustadt, P.C.

(57) ABSTRACT

A memory cell array is constructed by two-dimensionally arranging a plurality of memory cells each composed of a magnetoresistive element, in a row and column directions. Write word lines are provided along the row direction of the memory cell array. Write bit lines are provided along the column direction of the memory cell array. To write data, a pulse-like write current is applied to an appropriate word and bit lines to generate magnetic fields in the column and row directions. A combined magnetic field of the magnetic fields in the column and row directions is applied to a memory cell to write data. A control circuit controls the pulse width of the pulse-like write current applied to the word and bit lines so that the pulse width has a predetermined temperature dependence.

31 Claims, 42 Drawing Sheets

OTHER PUBLICATIONS

M. Durlam, et al., "Nonvolatile RAM based on Magnetic Tunnel Junction Elements*", 2000 IEEE International Solid-State Circuits Conference, ISSCC 2000, Digest of Technical Papers, TD: Emerging Memory & Device Technologies, Session 7, Paper TA 7.3, Feb. 2000, 6 pages.

Takeshi Honda, et al., "MRAM-Writing Circuitry to Compensate for Thermal-Variation of Magnetization-Reversal Current", 2002 Symposium on VLSI Circuits Digest of Technical Papers, 12-3, Jun. 2002, 2 pages.

M. Motoyoshi, et al., "High-Performance MRAM Technology with an Improved Magnetic Tunnel Junction Material", 2002 Symposium on VLSI Digest of Technical Papers, 21.4 Jun. 2002, pp. 212-213.

Manoj Bhattacharyya, et al., "Thermal Variations in Switching Fields for Sub-Micron MRAM Cells", IEEE Transactions on Magnetics, vol. 37, No. 4, Jul. 2001, pp. 1970-1972.

Ricardo C. Sousa, et al., "Dynamic Switching of Tunnel Junction MRAM Cell with Nanoseconf Field Pulses", IEEE Transactions on Magnetics, vol. 36, No. 5, Sep. 2000, pp. 2770-2772.

Paul R. Gray, et al., "Analysis and Design of Analog Integrated Circuits-$2^{nd}$ Edition" Japanese Edition, $1^{st}$ Y. Iwata Volume, pp. 270-276.

* cited by examiner

PARALLEL
(SMALLER RESISTANCE)

ANTI-PARALLEL
(LARGER RESISTANCE)

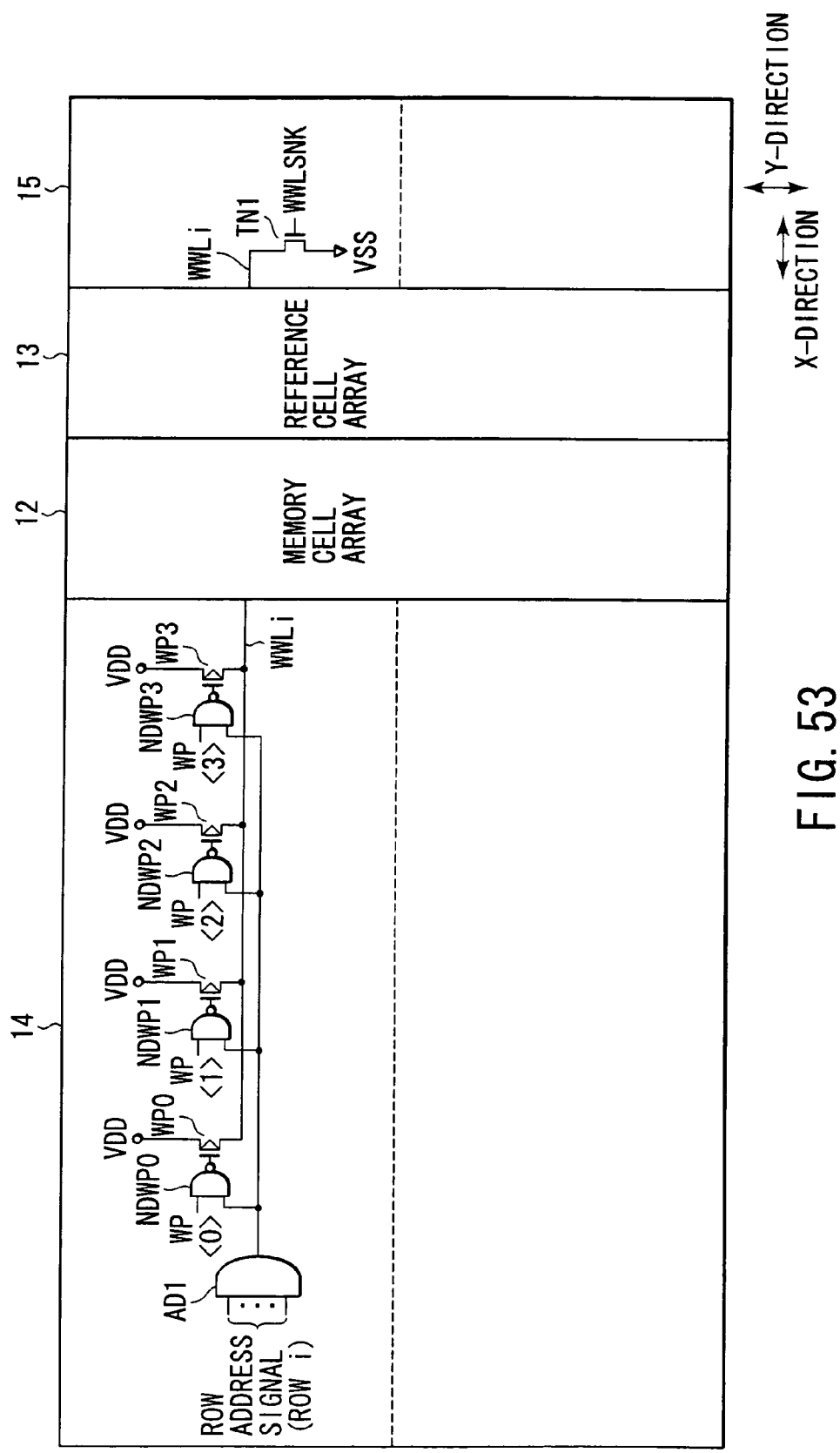
F I G. 53

TO FIRST MRAM DATA REWRITE CONTROLLER

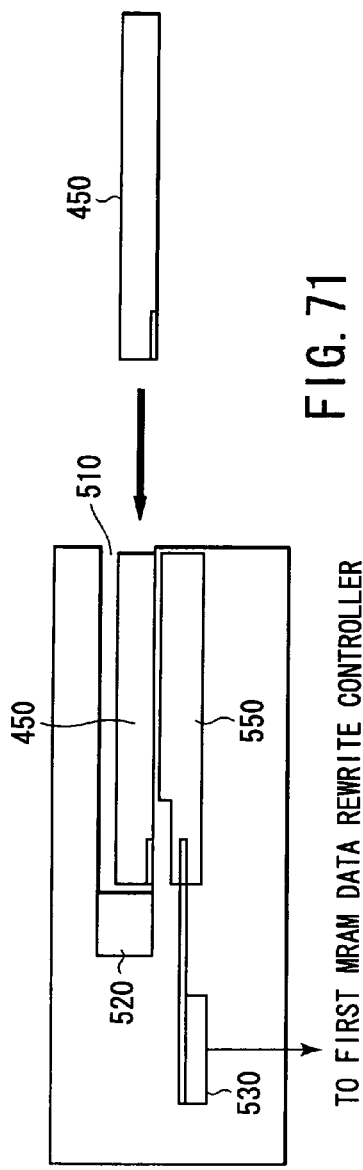
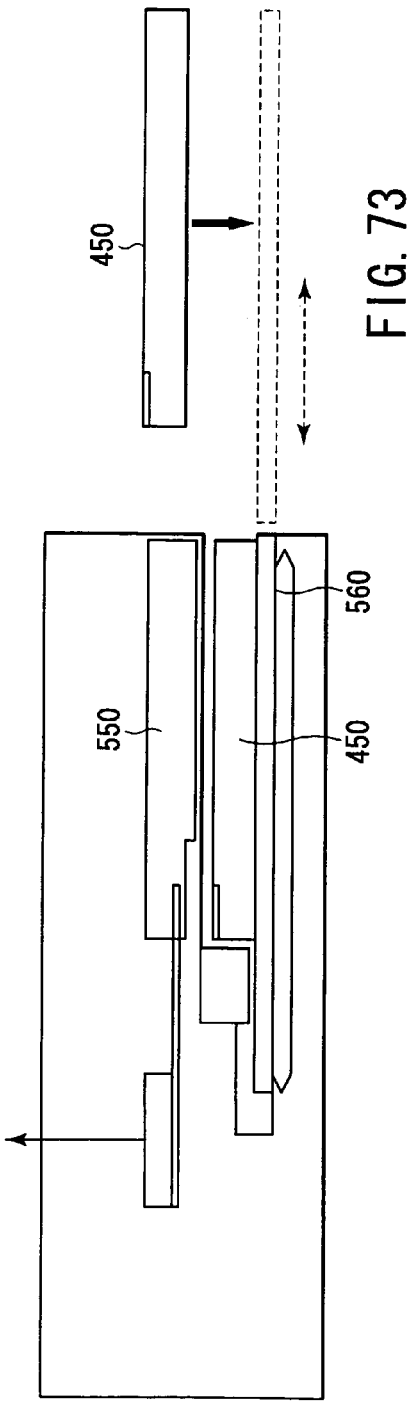

MAGNETIC RANDOM ACCESS MEMORY DEVICE

CROSS-REFERENCE TO RELATED APPLICATIONS

This application is based upon and claims the benefit of priority from the prior Japanese Patent Application No. 2003-121633, filed Apr. 25, 2003, the entire contents of which are incorporated herein by reference.

BACKGROUND OF THE INVENTION

1. Field of the Invention

The present invention relates to a magnetic random access memory (MRAM) device, and in particular, to a circuit that adjusts the pulse width of a write current through an MRAM device that uses magnetic memory cells storing data on the basis of the tunneling magnetoresistive effect.

2. Description of the Related Art

In recent years, a large number of memories have been proposed which store information on the basis of new principles. One of them is a non-volatile and high-speed MRAM device having magnetic memory cells arranged in a matrix and each composed of a magnetic tunnel junction (hereinafter referred to as an "MTJ") element that stores "1"/"0" information using the tunneling magnetoresistive effect. Such an MRAM device is disclosed in, for example, Roy Scheuerlein et. al. "A 10 ns Read and Write Non-Volatile Memory Array Using a Magnetic Tunnel Junction and FET Switch in each Cell", ISSCC2000 Technical Digest pp. 128 to pp. 129.

The MTJ element has two magnetization layers. To program data in the MTJ element, a magnetic field in a predetermined direction is applied to the MTJ element to change the orientation of magnetization in one of the two magnetization layers.

A switching magnetic field required to program data in the MTJ element is dependent on temperature. The magnitude of the switching magnetic field decreases at high temperature. The dependence of the switching magnetic field on temperature is disclosed in, for example, M. Bhattacharyya, et. al., "Thermal Variations in Switching Fields for Sub-Micron MRAM Cells", IEEE TRANSACTIONS ON MAGNETICS, VOL. 37, NO. 4, JULY 2001, pp. 1970–1972.

Further, the following point is disclosed in T. Honda, et. al., "MRAM-Writing Circuitry to Compensate for Thermal-Variation of Magnetization-Reversal Current", 2002 Symposium on VLSI Circuits Digest of Technical Papers: the magnitude of a write magnetic field is desirably varied depending on temperature in order to prevent miswrites.

Furthermore, the following point is disclosed in M. Motoyoshi, et. al., "High-Performance MRAM Technology with an Improved Magnetic Tunnel Junction Material" 2002 Symposium on VLSI Technology Digest of Technical Papers: the switching magnetic field applied to the MTJ element for a write is dependent on the time for which the magnetic field is applied, and its magnitude increases inconsistently with decreasing pulse width of a pulse-like write current.

In connection with the dependence of the switching magnetic field on its applied time and temperature, even if the write current remains unchanged, writes can be achieved at a higher temperature even with a reduced pulse width of the pulse-like write current. Accordingly, miswrites are more likely to occur. If a circuit used to determine the pulse width of the write current is simply composed of CMOS inverter circuits, the CMOS inverter circuits operate at a reduced speed at a higher temperature and then the pulse width is increased. This increases the pulse width of the write current to make miswrites more likely to occur.

P. R. Gray and R. G. Mayor, in "Analysis and Design of Analog Integrated Circuits, Second Edition" John Wiley & Sons, Inc., 1984, p.289 to 296, disclose a circuit that adds an output from a first current source providing a current having a value increasing in proportion to temperature to an output from a second current source characterized by providing a current having a value decreasing in proportion to temperature, in order to provide a current source that is independent of temperature.

Further. U.S. Pat. No. 6,081,445 discloses a method of reproducibly rewriting the directions of magnetization in the MTJ element. With this method, data is written by applying a magnetic field Hy in a hard-axis direction to adjust the direction of magnetization in a magnetic domain at an end of a storage layer, and then applying a magnetic field Hx in an easy-axis direction.

When data is programmed in the MTJ element and if the write current remains unchanged, writes can be achieved at a higher temperature even with a reduced pulse with of the pulse-like write current. Accordingly, miswrites are more likely to occur.

If the circuit used to determine the pulse width of the write current is composed of CMOS inverter circuits, CMOS inverter circuits operate at a reduced speed at a higher temperature and then the pulse width is increased. This increases the pulse width of the write current, making miswrites more likely to occur.

As described above, if the circuit used to determine the pulse width of the write current is simply composed of CMOS inverter circuits, miswrites are more likely to occur at a higher temperature. Consequently, it has hitherto been desirable to allow the write current to be controlled to be independent of temperature or to have a desired temperature dependence. This prevents data miswrites over a wide temperature range to enable stable writes.

BRIEF SUMMARY OF THE INVENTION

According to an aspect of the present invention, there is provided a magnetic random access memory device including; a memory cell array in which a plurality of memory cells two-dimensionally arranged in a row direction and a column direction and each composed of a magnetoresistive effect element, a plurality of first write lines each of which is provided along a row direction of the memory cell array and generates a magnetic field in a row direction of the memory cell array when a pulse-like first write current is applied to the plurality of first write lines along the row direction, a plurality of second write lines each of which is provided along a column direction of the memory cell array and generates a magnetic field in a column direction of the memory cell array when a pulse-like second write current is applied to the plurality of second write lines along the column direction of the memory cell array, data being written in each memory cell by applying a synthetic magnetic field of the magnetic field generated in the column direction and the magnetic field generated in the row direction, and a control circuit connected to the plurality of first and second write lines to control a dependence on temperature of a pulse width of at least one of the first write current and second write current.

BRIEF DESCRIPTION OF THE SEVERAL VIEWS OF THE DRAWING

FIG. 53 is a circuit diagram of a row decoder and write word line driver/sinker in FIG. 52;

FIG. 71 is a sectional view corresponding to FIG. 70;

FIG. 73 is a sectional view showing a slide type data transfer apparatus as yet another example of the electronic apparatus that uses the MRAM card.

DETAILED DESCRIPTION OF THE INVENTION

Figure 1:
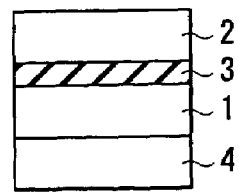
FIG. 1 is a sectional view schematically showing the structure of an MTJ element used in an MRAM device.

First, before describing embodiments of the present invention, description will be given of an MTJ element used in an MRAM device according to the embodiments of the present invention. FIG. 1 schematically shows the sectional structure of an MTJ element.

The MTJ element has a structure in which one non-magnetic layer (tunnel barrier layer) 3 sandwiched between two magnetic layers 1 and 2 each composed of a ferromagnetic layer. The MTJ element stores "1" or "0" information depending on whether the orientations of magnetization in the two magnetic layers 1 and 2 are parallel or anti-parallel.

Typically, an anti-ferromagnetic layer 4 is arranged adjacent to the magnetic layer 1. The anti-ferromagnetic layer 4 is a member that fixes the orientation of the magnetization in the magnetic layer 1 so as to allow data to be easily rewritten by changing only the orientation of the magnetization in the magnetic layer 2. Here, the magnetic layer 1 with a fixed magnetization orientation is called a "fixed layer (or pinned layer)". The magnetic layer 2 with a variable magnetization orientation is called a "free layer (or recording layer)".

Figure 2A:
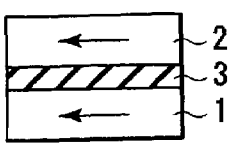
FIGS. 2A and 2B are diagrams illustrating two states of the orientations of magnetization in two magnetic layers in the MTJ element in FIG. 1.
Figure 2B:
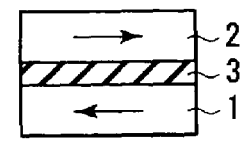

FIGS. 2A and 2B show two states of the orientations of magnetization in the two magnetic layers 1 and 2 in the MTJ element shown in FIG. 1.

If the orientations of magnetization (the directions of arrows in the figure) in the two magnetic layers 1 and 2 are parallel (the same) as shown in FIG. 2A, the tunnel resistance of the tunnel barrier film 3, sandwiched between the magnetic layers 1 and 2, is lowest. In this case, a tunnel current is highest.

If the orientations of magnetization in the two magnetic layers 1 and 2 are anti-parallel as shown in FIG. 2B, the tunnel resistance of the tunnel barrier film 3, sandwiched between the magnetic layers 1 and 2, is highest. In this case, the tunnel current is lowest.

In the MRAM device, the two states in which the MTJ element has different resistance values correspond to the state in which logical "1" level data is stored (a "1" state) and the state in which logical "0" level data is stored (a "0" state), respectively.

Figure 3:
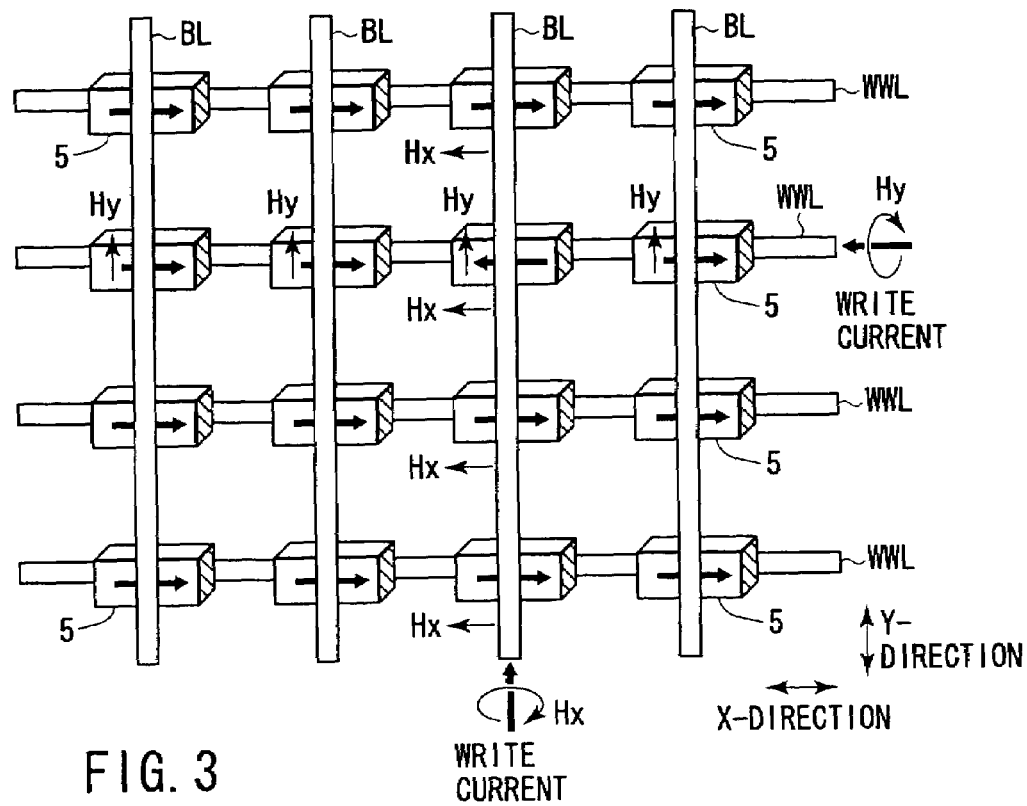
FIG. 3 is a perspective view schematically showing an example of a planar layout of a cell array of MRAMs.

FIG. 3 schematically shows an example of a planar layout of a cell array in which a plurality of MRAMs are two-dimensionally arranged in a row direction and a column direction.

A plurality of write/read bit lines BL and a plurality of write word lines WWL are disposed so as to cross at right angles. MTJ elements 5 are disposed at the respective intersection points between the bit lines and the write word lines. Each MTJ element 5 is shaped like a rectangle the long sides of which extend along the write word lines WWL and the short sides of which extend along the bit lines BL. Magnetization is directed along the long sides of the rectangle. Each bit line BL is connected to one (reference numeral 1 or 2 in FIG. 1) of the magnetic layers of each of the plurality of MTJ elements 5 in the same row (or column). Each write word line WWL is arranged close to and opposite the other magnetic layer (reference numeral 2 or 1 in FIG. 1) of each of the plurality of MTJ elements 5 in the same column (or row).

Figure 4:
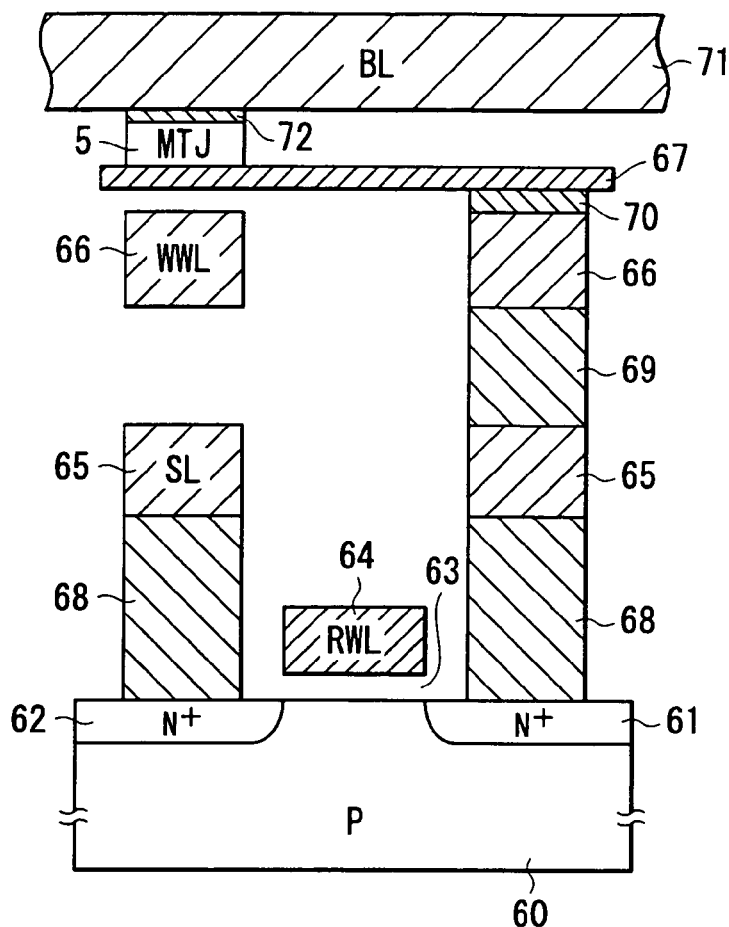
FIG. 4 is a sectional view showing an example of the structure of one memory cell in a cross section perpendicular to write word lines in FIG. 3.

FIG. 4 is a sectional view showing an example of the structure of one memory cell in a cross section perpendicular to the write word lines. In this case, the memory cell is constructed by connecting an NMOS transistor as a read cell selection switch element in series with each MTJ element 5 in FIG. 3.

In FIG. 4, an impurity diffusion layer ($N^+$) that composes a drain region 61 or a source region 62 is selectively formed in a surface layer of a semi-conductor substrate composed of, for example, a P-type Si substrate. A gate electrode 64 is formed on a channel area via a gate oxide film 63. Reference numerals 65 and 66 denote a first metal interconnect layer and a second metal interconnect layer, respectively. Reference numeral 67 denotes an MTJ connecting interconnect composed of a third metal interconnect layer. Reference numeral 68 denotes a contact that electrically connects the first metal interconnect layer 65 to the impurity diffusion layer ($N^+$). Reference numeral 69 denotes a contact that electrically connects the second metal interconnect layer 66 to the first metal interconnect layer 65. Reference numeral 70 denotes a contact that electrically connects the third metal interconnect layer 67 to the second metal interconnect layer 66. Reference numerals 50 and 71 denote an MTJ element and a fourth interconnect layer, respectively. Reference numeral 72 denotes a contact that electrically connects a fourth metal interconnect layer 71 to the MTJ element 5. An interlayer insulating film is formed between each pair of interconnect layers.

In FIG. 4, in connection with the applications of interconnects, reference characters BL, WWL, SL, and RWL denote a write/read bit line, a write word line, a source line, and a read word line, respectively. The source line SL is connected to a ground potential.

Now, with reference to FIGS. 3 and 4, description will be given of the principle of operations of the MTJ element 5.

A write to the MTJ element 5 is achieved by conducting currents through the corresponding write word line WWL and bit line BL and using a combined magnetic field generated by the currents conducting through both interconnects to make the orientations of magnetization in the MTJ element 5 parallel or anti-parallel.

Specifically, when information is written in the MTJ element 5, a current flowing in a first direction or second direction opposite to the first direction depending on write data is conducted through the bit lines BL to generate a magnetic field Hx. On the other hand, only a current flowing through a fixed direction is conducted through the write word lines WWL to generate a magnetic field Hy. Thus, the combined magnetic field generated is used to write information in the selected MTJ element 5. On this occasion, when a current flowing in the first direction is conducted through the bit line BL, the orientations in magnetization in the MTJ element are parallel. When a current flowing in the second direction is conducted through the bit line BL, the orientations in magnetization in the MTJ element are anti-parallel.

To read information from the selected MTJ element 5, the corresponding read word line RWL is activated to turn on only the NMOSFET in FIG. 4 connected to the selected MTJ element. Thus, a current path is created. Then, a current is conducted through the selected bit line BL to the source line SL. As a result, only through the selected MTJ element 5, a current based on its resistance values flows. Information can be read by detecting this current value.

Then, with reference to FIGS. 5 and 6, a brief description will be given of a mechanism that varies the orientations of magnetization in the MTJ element.

Figure 5:
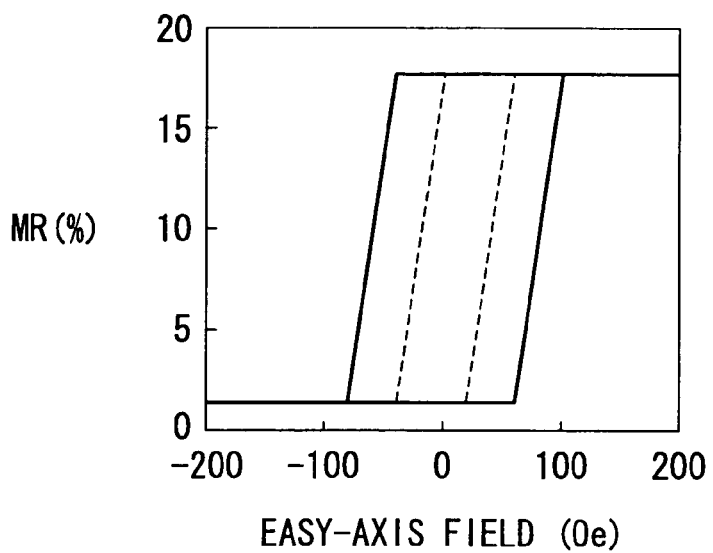
FIG. 5 is a diagram shown a TMR characteristic curve for the MTJ element.

FIG. 5 shows a TMR characteristics curve of the magnetic field applied of the MTJ element and the resistance value of the MTJ element. FIG. 6 shows an asteroid curve which shows the minimum magnetic magnitude to change the orientation of the free layer magnetization of the MTJ element.

As shown in the curve in FIG. 5, when the magnetic field Hx is applied to the MTJ element in an easy-axis direction, the resistance value of the MTJ element changes by, for example, about 17%. This change rate, i.e. a ratio of the resistance difference between two states and the parallel state resistance is referred to as an "MR ratio". The MR ratio varies depending on the properties of the magnetic layer in the MTJ element. At present, an MTJ element has the MR ratio of approximately 50% is available. The MTJ element is subjected to a magnetic field obtained by combining the magnetic field Hx in the easy-axis direction with the magnetic field Hy in the hard-axis direction.

As shown by the solid and dotted lines in FIG. 5, the magnitude of the magnetic field Hx in the easy-axis direction required to change the resistance value of the MTJ element also varies depend on the magnitude of the magnetic field Hy in the hard-axis direction. In the memory cells arranged as an array, this phenomenon can be utilized to write data only in the MTJ element arranged at the intersection point between the selected write word line WWL and the selected bit line BL.

Figure 6:
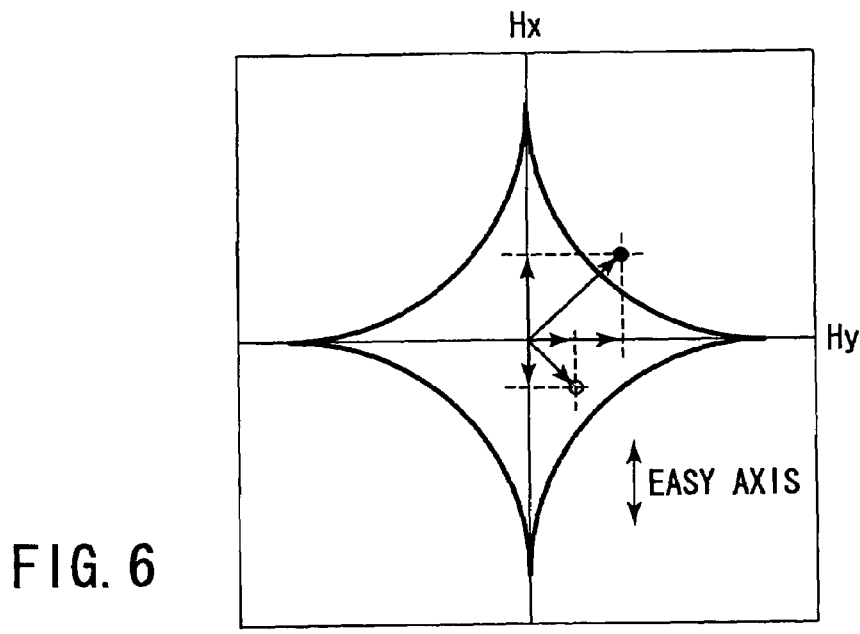
FIG. 6 is a switching characteristic diagram showing a symmetrical asteroid curve for the MTJ element.

Specifically, as shown in FIG. 6, the orientation of the magnetization in the magnetic field of the MTJ element can be switched if the each magnitude of the magnetic field Hx in the easy-axis direction is larger than the magnitude of the magnetic field Hx in the easy-axis direction on the asteroid curve and the magnetic field Hy in the hard-axis direction is larger than the magnetic field Hy in the hard-axis direction on the asteroid curve, e.g. at the solid point in the figure. That is, data writes are enabled.

In contrast, the orientation of the magnetization in the magnetic field of the MTJ element cannot be switched if the magnitude of the magnetic field Hx in the easy-axis direction is smaller than the magnitude of the magnetic field Hx in the easy-axis direction on the asteroid curve or the magnetic field Hy in the hard-axis direction is smaller than the magnitude of the magnetic field Hy in the hard-axis direction on the asteroid curve, e.g. at the hollow point in the figure. That is, data writes are disabled.

Consequently, data writes to the MTJ element can be controlled by varying the magnitude of the combined magnetic field of the magnetic field Hx in the easy-axis direction and the magnetic field Hy in the hard-axis direction and varying the position of the magnitude of the combined magnetic field in an Hx-Hy plane.

On the other hand, if the MTJ element is subjected to only the magnetic field Hx in the easy-axis direction, i.e. only the magnetic field Hx induced by the write word line current or only the magnetic field Hy in the hard-axis direction, i.e. only the magnetic field Hy induced by the write bit line current, then the magnitude of the magnetic field is not located outside the asteroid curve. Consequently, data writes are disabled.

For write operations in the MRAM, it is necessary to write always accurately write data in the MTJ element, i.e. to stabilize a write characteristic. The stabilized write characteristic is important particularly if the data stored in the MTJ element is different from the write data. In such a case, the direction of the magnetization in the recording layer of the MTJ element must be stably switched.

As shown in FIG. 6, if the asteroid curve is symmetric with respect to the X and Y axes, the orientation of the magnetization in the free layer (recording layer) of the MTJ element can be switched by applying a specified combined magnetic field required to switch the magnetization, regardless of the direction of the switching (upward or downward).

However, if the shapes of the asteroid curves of the MTJ elements are greatly different, undesirable write operations may cause. Because the necessary magnitude of the magnetic field Hy in the hard-axis direction alone to write one MTJ element is smaller than the necessary magnitude of the magnetic field Hy in the hard-axis direction to write the arbitrarily selected MTJ element by combining with the magnetic field Hx in the easy-axis direction, or the necessary magnitude of the magnetic field Hx in the easy-axis direction alone to write one MTJ element is smaller than the necessary magnitude of the magnetic field Hx in the easy-axis direction to write the arbitrarily selected MTJ element by combining with the magnetic field Hy in the hard-axis direction. That is, the magnetic field generating from only the word line current or the bit line current causes a write. Accordingly, a write state is established by selecting only one of the word and bit lines. Here, it is assumed that MTJ elements are arranged on a two-dimensional array as shown in FIG. 3. Then, some MTJ elements are in a half-selected state in which a certain write word line WWL has been selected for them and the current flow through the write word line WL, whereas no write bit lines BLs have been selected for them and the no current flow through the write bit lines BLs. A data write occurs when such MTJ elements in the half-selected state are subjected to a magnetic field that causes only with the current through the write word line WWL, if the applied magnetic field is larger than the magnetic field on the asteroid curve shown the switching characteristics of those MTJs. Therefore, there is a limit to the maximum current that can be conducted through the write word line WWL. Above discussion is applied not only for the write word line but also for the write bit line.

First Embodiment

Figure 7:
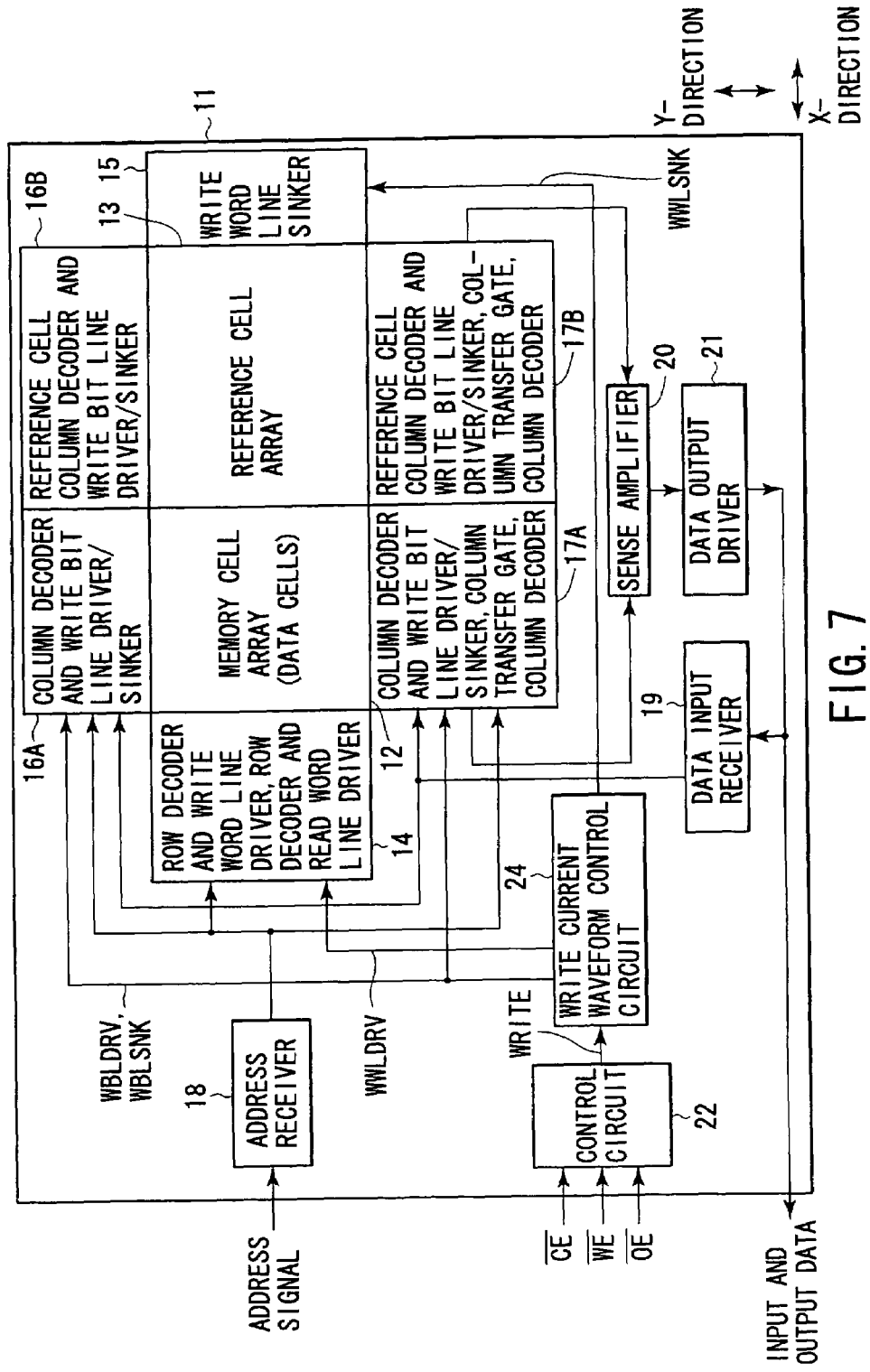
FIG. 7 is a block diagram showing an example of the whole configuration of an MRAM device according to a first embodiment of the present invention.

FIG. 7 is a block diagram shows an example of the whole configuration of an MRAM device according to a first embodiment of the present invention.

An MRAM 11, shown in FIG. 7, may in itself constitute one memory chip or may be one block within a chip which block has a particular function. A memory cell array (data cell) 12 has a function of actually storing data. A reference cell array 13 has a function of determining a reference level used to determine read data, during a data read operation.

A row decoder and driver 14 composed of a row decoder and write word line driver, and a row decoder and read word line driver is arranged at one of the two ends of a cell array in the X direction (easy-axis direction), the cell array being composed of the memory cell array 12 and the reference cell array 13. A write word line sinker 15 is arranged at the other end.

The row decoder and driver 14 has a function of operating during a data write to select one of a plurality of write word lines, for example, on the basis of a row address signal and supplying a write current to the selected write word line. The write word line sinker 15 has a function of operating during a data write to, for example, absorb a write current supplied to the selected write word line.

The row decoder and driver 14 has a function of operating during a data read to select one of a plurality of read word lines, for example, on the basis of a row address signal and supplying a read current to the selected read word line. The write word line may also be used as a read word line. A sense amplifier 20 detects the read current through the read word line to determine read data.

A column decoder and write bit line driver/sinker 16A is arranged at one of the two ends of the memory array 12 in the Y direction (hard-axis direction). On the other hand, a column decoder and write bit line driver/sinker 17A including a column transfer gate and a column decoder is arranged at the other end.

The column decoder and write bit drivers/sinkers 16A and 17A have a function of operating during a data write to select one of a plurality of write bit lines or data select lines, for example, on the basis of a column address signal and supplying the selected write bit line with a write current having an orientation based on write data. The column transfer gate and the column decoder have a function of operating during a read to connect electrically a data selection line selected by the column address signal to the sense amplifier 20.

A reference cell column decoder and write bit line driver/sinker 16B is arranged at one of the two ends of the reference cell array 13 in the Y direction. On the other hand, a reference cell column decoder and write bit line driver/sinker 17B including a column transfer gate and a column decoder is arranged at the other end.

The reference cell column decoder and write bit line drivers/sinkers 16B and 17B have a function of storing reference data in the reference cell array 13. The column transfer gate and the column decoder have a function of operating during a read to read reference data from the reference cell array and transfer the data to the sense amplifier 20.

An address receiver 18 receives an address signal and transfers, for example, a row address signal to the row decoder and driver 14, while transferring a column address signal to the column decoder and write bit line drivers/sinkers 16A and 17A. A data input receiver 19 transfers write data to the column decoder and write bit line drivers/sinkers 16A and 17A. Further, a data output driver 21 outputs read data detected by the sense amplifier 20 to equipment located outside the MRAM chip.

A control circuit 22 receives a chip enable signal /CE, a write enable signal /WE, and an output enable signal /OE to generate various control signals that control the operation of the whole MRAM. For a data write operation, the control circuit 22 provides a write signal WRITE to a write current waveform control circuit 24.

On receiving the write signal WRITE, the write current waveform control circuit 24 generates a write word line drive signal WWLDRV, a write word line sink signal WWLSNK, a write bit line drive signal WBLDRV, and a write bit line sink signal WBLSNK.

The write word line drive signal WWLDRV is supplied to the row decoder and driver 14. The write word line sink signal WWLSNK is supplied to the write word line sinker 15. The write bit line drive signal WBLDRV and the write bit line sink signal WBLSNK are supplied to the column decoder and write bit line drivers/sinkers 16A and 17A.

When the write word line drive signal WWLDRV is "H" and the write word line sink signal WWLSNK is "H", the row decoder and driver 14 conducts a write current through the write word line selected by the row address signal.

When the write bit line drive signal WBLDRV is "H" and the write bit line sink signal WBLSNK is "H", the write word line sinker 15 and the column decoder and write bit line drivers/sinkers 16A and 17A conduct a write current through the write bit line selected by the column address signal.

In connection with a current sinking timing for a write current, the potentials across the write word/bit lines can be completely zeroed by, for example, allowing the sink signals WWLSNK and WBLSNK to change from "H" to "L" after the drive signals WWLDRV and WBLDRV have changed from "H" to "L".

In the present embodiment, the write current waveform control circuit 24 has a function of adjusting the pulse width of a pulse-like write current in accordance with temperature in order to prevent miswrites. For example, control is provided such that the pulse width of the write current (the time for which the write current is applied) decreases consistently with increasing temperature. Alternatively, control may be provided by combining the variation of the pulse width of the write current with the variation of the magnitude of the write current. Further, if a switching magnetic field required to switch the magnetization in the MTJ element from a parallel state to an anti-parallel state differs from a switching magnetic field required to switch the magnetization in the MTJ element from the anti-parallel state to the parallel state, control is provided such that the pulse width of the write current is changed in accordance with the write data so as to reduce the pulse width of the smaller switching magnetic field. This will be described below in detail.

Figure 8:
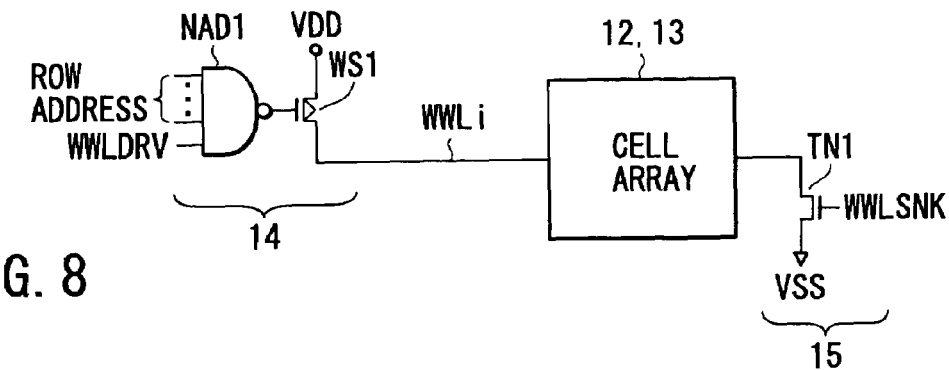
FIG. 8 is a circuit diagram of a write word line driver/sinker in FIG. 7.

FIG. 8 shows a specific example of circuits in one row of the row decoder and driver 14 and write word line sinker 15 in FIG. 7.

One row of the row decoder and write word line driver 14 is composed of a NAND gate circuit NAD1 and a P channel MOS transistor WS1.

The write word line drive signal WWLDRV and a row address signal composed of a plurality of bits are input to the NAND gate circuit NAD1. The row address signal varies with rows.

A gate of the P channel MOS transistor WS1 is connected to an output terminal of the NAND gate circuit NAD1. Its source is connected to a power node VDD. Its drain is connected to one end of a write word line WWLi (i=1, . . . ).

One row of the write word line sinker 15 is composed of an N channel MOS transistor TN1. A source of the N channel MOS transistor TN1 is connected to a ground node VSS. Its drain is connected to the other end of the write word line WWLi. The write word line sink signal WWLSNK is input to a gate of the N channel MOS transistor TN1.

For a write operation, the write word line drive signal WWLDRV changes to "H". For the selected row i, all the bits of the row address signal change to "H". That is, for the selected row i, an output signal from the NAND circuit NAD1 changes to "L". Accordingly, the P channel MOS transistor WS1 is turned on to supply the write word line WWLi with a write word line current with a predetermined value.

On the other hand, when the write word line sink signal WWLSNK changes to "H", the N channel MOS transistor TN1 is turned on. Thus, a write current flowing through the write word line WWLi is sunk by the ground node VSS via the N channel MOS transistor TN1.

By setting the write word line drive signal WWLDRV to "L" and then setting the write word line sink signal WWLSNK to "L", the potential across the write word line WWLi can be completely zeroed after a write operation. This is convenient for initialization.

Figure 9:
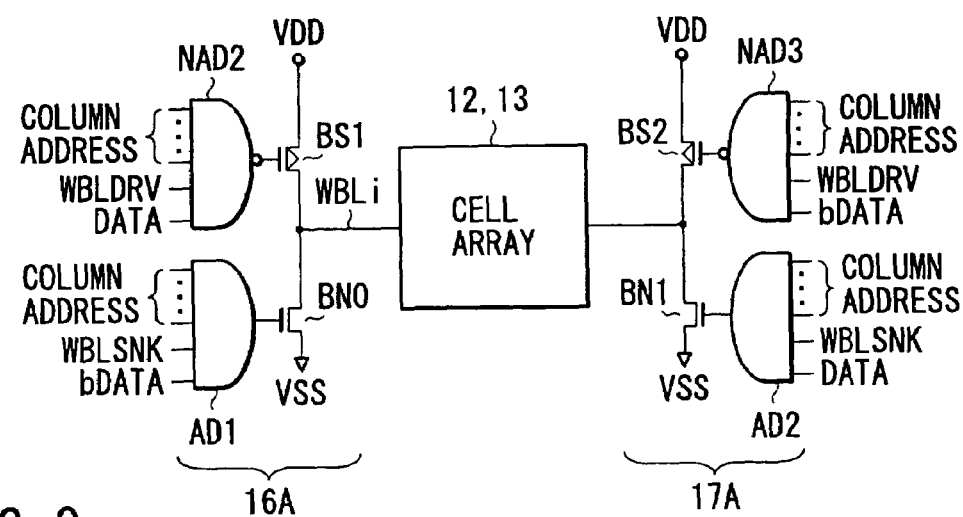
FIG. 9 is a circuit diagram of a write bit line driver/sinker in FIG. 7.

FIG. 9 shows an example of circuits in one column of the column decoder and write bit drivers/sinkers 16A and 17A in FIG. 7.

One column of the column decoder and write bit line driver/sinker 16A is composed of a NAND gate circuit NAD2, an AND gate circuit AD1, a P channel MOS transistor BS1, and an N channel MOS transistor BN0.

The write bit line drive signal WBLDRV, a column address signal composed of a plurality of bits, and write data DATA are input to the AND gate circuit AD2. The column address signal varies with columns i.

A gate of the P channel MOS transistor BS1 is connected to an output terminal of the NAND gate circuit NAD2. Its source is connected to the power node VDD. Its drain is connected to one end of a write bit line WBLi (i=1, . . . ).

The write bit line sink signal WBLSNK, a column address signal composed of a plurality of bits, and an inversion data bDATA of the write data are input to the AND gate circuit AD1.

A gate of the N channel MOS transistor BN0 is connected to an output terminal of the AND gate circuit AD1. Its source is connected to the ground node VSS. Its drain is connected to one end of the write bit line WBLi (i=1, . . . ).

One column of the column decoder and write bit line driver/sinker 17A is composed of a NAND gate circuit NAND3, an AND gate circuit AD2, a P channel MOS transistor BS2, and an N channel MOS transistor BN1.

The write bit line drive signal WBLDRV, a column address signal composed of a plurality of bits, and the inversion data bDATA of the write data are input to the NAND gate circuit NAD3.

A gate of the P channel MOS transistor BS2 is connected to an output terminal of the NAND gate circuit NAD3. Its source is connected to the power node VDD. Its drain is connected to the other end of the write bit line WBLi.

The write bit line sink signal WBLSNK, a column address signal composed of a plurality of bits, and the write data DATA are input to the AND gate circuit AD2.

A gate of the N channel MOS transistor BN1 is connected to an output terminal of the AND gate circuit AD2. Its source is connected to the ground node VSS. Its drain is connected to the other end of the write bit line WBLi.

For a write operation, both the write bit line drive signal WBLDRV and the write bit line sink signal WBLSNK change to "H". For the selected column i, all the bits of the column address signal change to "H".

Accordingly, for the selected column i, a current flows through the write bit line between the column decoder and write bit line driver/sinker 16A and the column decoder and write bit line driver/sinker 17A. At this time, the magnitude of the current through the write bit line is determined by the P channel MOS transistor BS1 and the P channel MOS transistor BS2.

The value of the write data DATA determines the orientation of a write current flowing through the write bit line WBLi. For example, if the write data DATA is "1" (="H"), an output signal from the NAND gate circuit NAD2 changes to "L" to turn on the P channel MOS transistor BS1. Further, an output signal from the AND gate circuit AD2 changes to "H" to turn on the N channel MOS transistor BN1. Thus, a write current flows from the column decoder and write bit line driver/sinker 16A to the column decoder and write bit line driver/sinker 17A.

On the other hand, if the write data DATA is "0" (="L"), an output signal from the NAND gate circuit NAD3 changes to "L" to turn on the P channel MOS transistor BS2. Further, an output signal from the AND gate circuit AD1 changes to "H" to turn on the N channel MOS transistor BN0. Thus, a write current flows from the column decoder and write bit line driver/sinker 17A to the column decoder and write bit line driver/sinker 16A.

Further, by setting the write bit line drive signal WBLDRV to "L" and then setting the write bit line sink signal WBLSNK to "L", the potential across the write bit line WBLi can be completely zeroed after a write operation. This is convenient for initialization.

Figure 10:
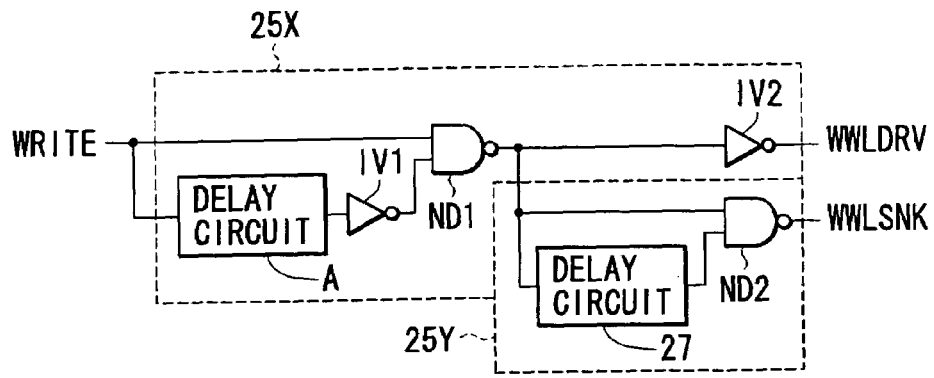
FIG. 10 is a circuit diagram of a trigger circuit for the write word line driver/sinker in FIG. 8.

FIG. 10 shows an example of a trigger circuit for the write word line driver/sinker that generates a write word line drive signal WWLDRV and a write word line sink signal WWLSNK, shown in FIG. 8.

This trigger circuit is composed of a WWLDRV signal generating circuit 25X and a WWLSNK signal generating circuit 25Y.

The WWLDRV signal generating circuit 25X is composed of a NAND gate circuit ND1, a delay circuit A, and inverters IV1 and IV2. The WWLDRV signal generating circuit 25X generates a write word line drive signal WWLDRV on the basis of a write signal WRITE and supplies this signal to the write word line driver. The write signal WRITE is an internal control signal indicating that a write is to be started. In a write mode, the write signal WRITE is "H".

The WWLSNK signal generating circuit 25Y is composed of a delay circuit 27 and a NAND gate circuit ND2. The WWLSNK signal generating circuit 25Y generates a write word line sink signal WWLSNK on the basis of an output signal from the NAND gate circuit ND1 in the WWLDRV signal generating circuit 25X and supplies this signal to the write word line sinker.

Figure 11:
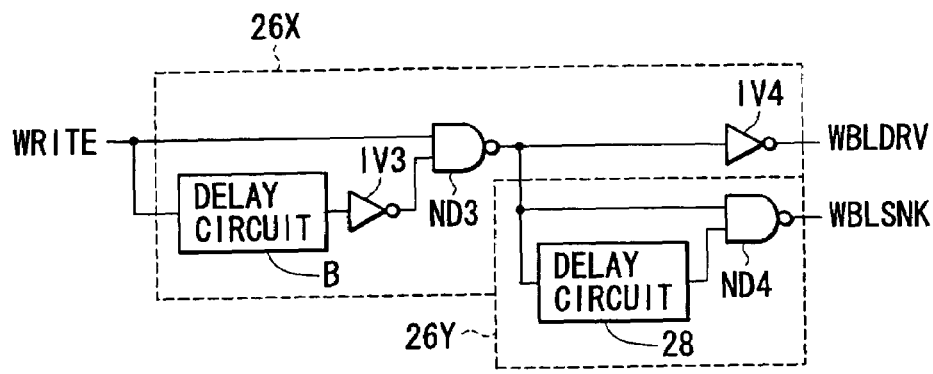
FIG. 11 is a circuit diagram of a trigger circuit for the write bit line driver/sinker in FIG. 9.

FIG. 11 shows an example of a trigger circuit for the write bit line driver/sinker that generates a write bit line drive signal WBLDRV and a write bit line sink signal WBLSNK, shown in FIG. 9.

This trigger circuit is composed of a WBLDRV signal generating circuit 26X and a WBLSNK signal generating circuit 26Y.

The WBLDRV signal generating circuit 26X is composed of a NAND gate circuit ND3, a delay circuit B, and inverters IV3 and IV4. The WBLDRV signal generating circuit 26X generates a write bit line drive signal WBLDRV on the basis of the write signal WRITE and supplies this signal to the write bit line driver.

The WBLSNK signal generating circuit 26Y is composed of a delay circuit 28 and a NAND gate circuit ND4. The WBLSNK signal generating circuit 26Y generates a write bit line sink signal WBLSNK on the basis of an output signal from the NAND gate circuit ND3 in the WWLDRV signal generating circuit 26X and supplies this signal to the write bit line sinker.

When the write signal WRITE changes from "L" to "H", the write word line drive signal WWLDRV, the write bit line drive signal WBLDRV, the write word line sink signal WWLSNK, and the write bit line sink signal WBLSNK change almost simultaneously from "L" to "H".

Figure 12:
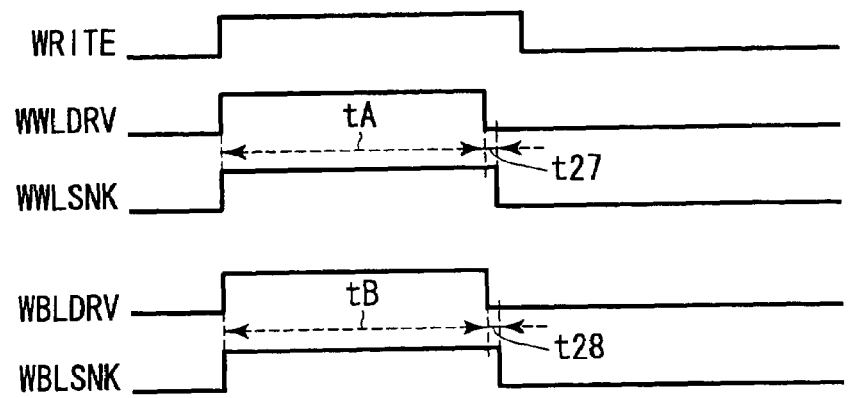
FIG. 12 is a waveform diagram showing an example of operations of the trigger circuits shown in FIGS. 10 and 11.

FIG. 12 shows an example of operation waveforms of the trigger circuits shown in FIGS. 10 and 11.

As shown in this waveform diagram, the delay circuits A and B in FIGS. 10 and 11, respectively, determine the pulse widths of output signals in accordance with respective delay times tA and tB and control the pulse widths of the output signals on the basis of the temperature dependence of the delay times. The delay circuits A and B thus control the pulse widths of write currents supplied to the write word line driver/sinker and the write bit line driver/sinker, respectively.

Further, the delay circuits 27 and 28 in FIGS. 10 and 11, respectively, determine intervals t27 and t28, respectively, corresponding to the periods after the write signal WRITE has changed from "H" to "L" and the write word line drive signal WWLDRV or write bit line drive signal WBLDRV has changed from "H" to "L" and before the write word line sink signal WWLSNK or write bit line sink signal WBLSNK changes from "H" to "L". The intervals t27 and t28 are periods required to set the potential across the write word line WWLi or the write bit line WBLi to 0V.

Now, description will be given of specific examples of the delay circuit A in FIG. 10 and the delay circuit B in FIG. 11 which examples realize the temperature dependence of the delay times as desired.

Figure 13:
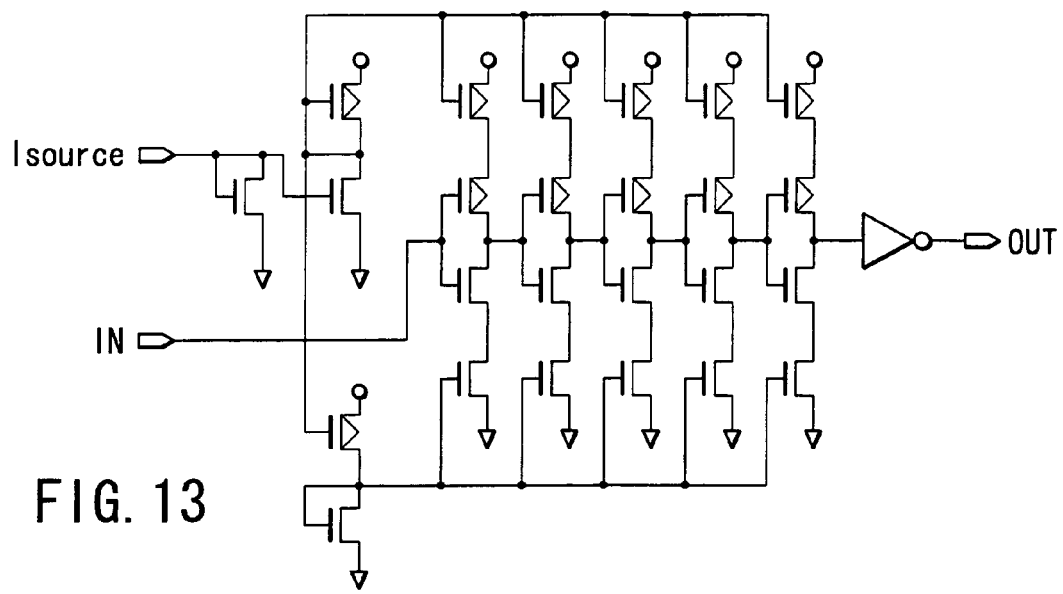
FIG. 13 is a circuit diagram showing an example of a current control type delay circuit.

FIG. 13 shows an example of a current control type delay circuit.

With this delay circuit, the delay time decreases in proportion to a current Isource generated by a current source. Accordingly, when this delay circuit is used as each of the delay circuits A and B in FIGS. 10 and 11, respectively, the pulse width of an output signal from the trigger circuit decreases in proportion to the amount of current.

In this case, when the current Isource is substantially independent of the power voltage, it is possible to eliminate substantially the dependence of the delay time on the power voltage.

By using such a delay circuit as is substantially independent of temperature, as each of the delay circuits A and B in FIGS. 10 and 11, respectively, it is possible to eliminate substantially the temperature dependence the pulse width of an output signal from the trigger circuit.

Figure 14:
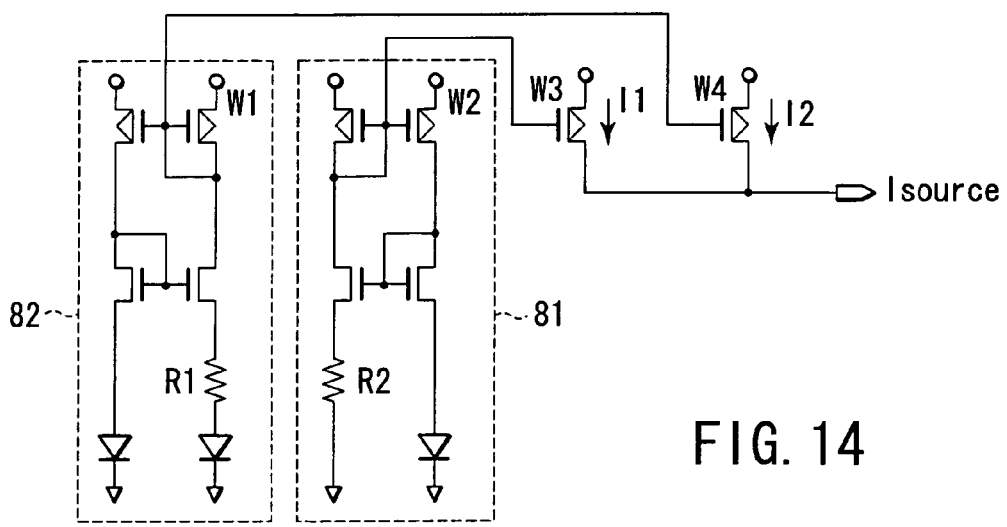
FIG. 14 is a circuit diagram of a current source circuit that supplies a current to the delay circuit in FIG. 13.

FIG. 14 shows an example of a current source circuit that generates a current Isource substantially independent of temperature.

Figure 15:
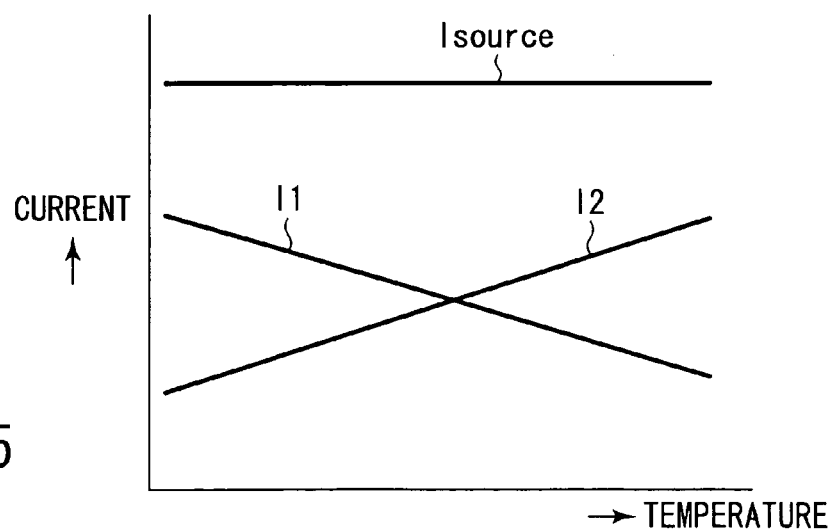
FIG. 15 is a characteristic diagram of the current source circuit in FIG. 14.

This current source circuit is composed of a BGR (Band Gap Reference) circuit. The current source circuit eliminates the dependence on temperature by adding up a current I1 obtained by copying a current from a first current source 81 the amount of which decreases in proportion to temperature and a current I2 obtained by copying a current from a second current source 82 characterized in that the amount of current increases in proportion to temperature. FIG. 15 is a characteristic diagram showing the temperature dependence of the circuit in FIG. 14.

A current source circuit that outputs a current having a value increasing consistently with temperature may be used to provide a current input to the current control type delay circuit shown in FIG. 13. In this case, the delay time in the delay circuit decreases in keeping with increasing temperature. When this delay circuit is used as each of the delay circuits A and B in FIGS. 10 and 11, respectively, the pulse width of an output signal from the trigger circuit decreases in proportion to the amount of input current supplied by the current source circuit.

Figure 16:
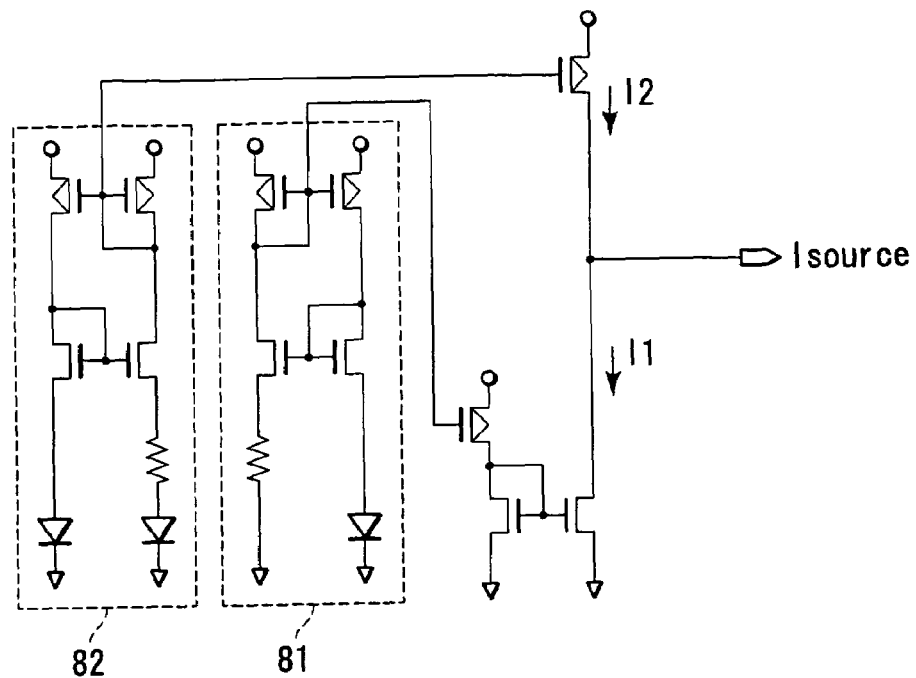
FIG. 16 is a circuit diagram showing another example of the configuration of the current source circuit that supplies a current to the delay circuit in FIG. 13.

FIG. 16 shows an example of a current source circuit that outputs a current having a value increasing in keeping with temperature.

Figure 17:
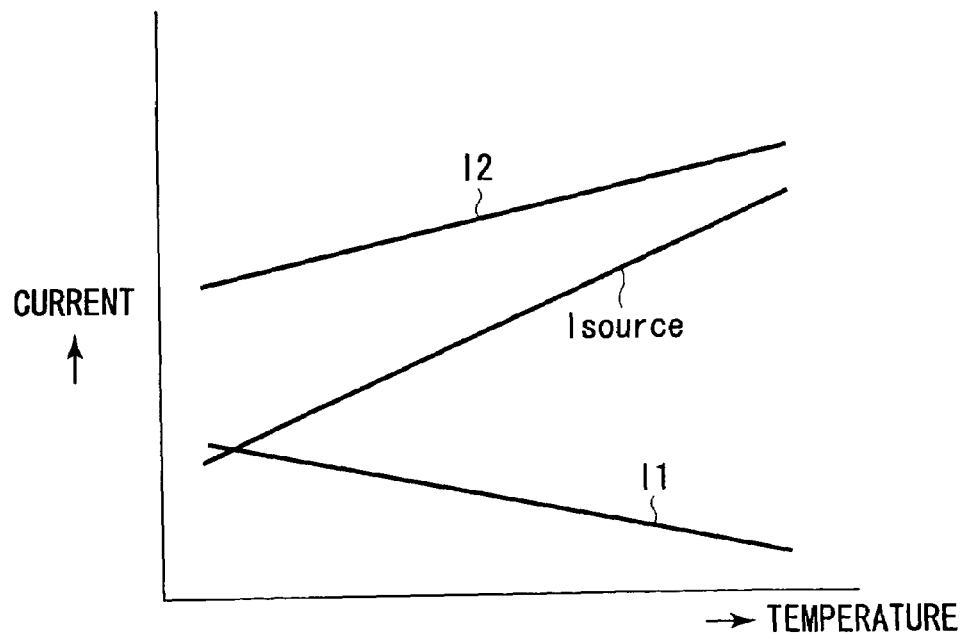
FIG. 17 is a characteristic diagram of the current source circuit in FIG. 16.

This current source circuit realizes the characteristic that the value of the output current increases consistently with temperature, by subtracting the current I1 obtained by copying a current from the first current source 81 characterized in that the value of the current decreases in proportion to temperature from the current I2 obtained by copying a current from the second current source 82 which increases in proportion to temperature. FIG. 17 indicates the temperature dependence of the circuit in FIG. 16.

A current source circuit that outputs a current exhibiting its temperature dependency as a folded line may be used to provide a current input to the current control type delay circuit shown in FIG. 13. In this case, the dependency of the delay time on temperature can be exhibited as a folded line. By using this delay circuit as each of the delay circuits A and B in FIGS. 10 and 11, respectively, the temperature dependence of the pulse width can be exhibited as a folded line.

Figure 18:
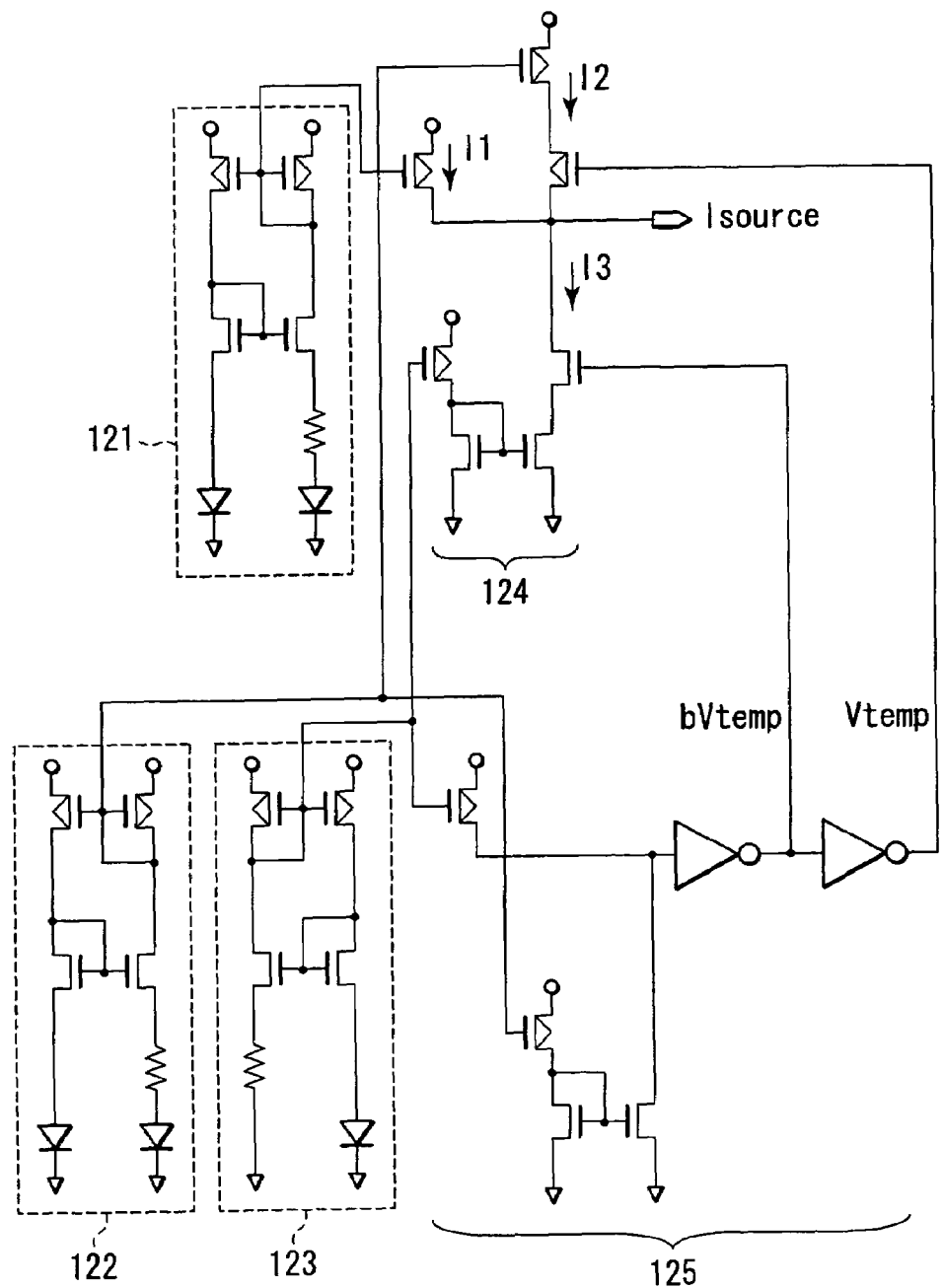
FIG. 18 is a circuit diagram showing yet another example of the configuration of the current source circuit that supplies a current to the delay circuit in FIG. 13.
Figure 19:
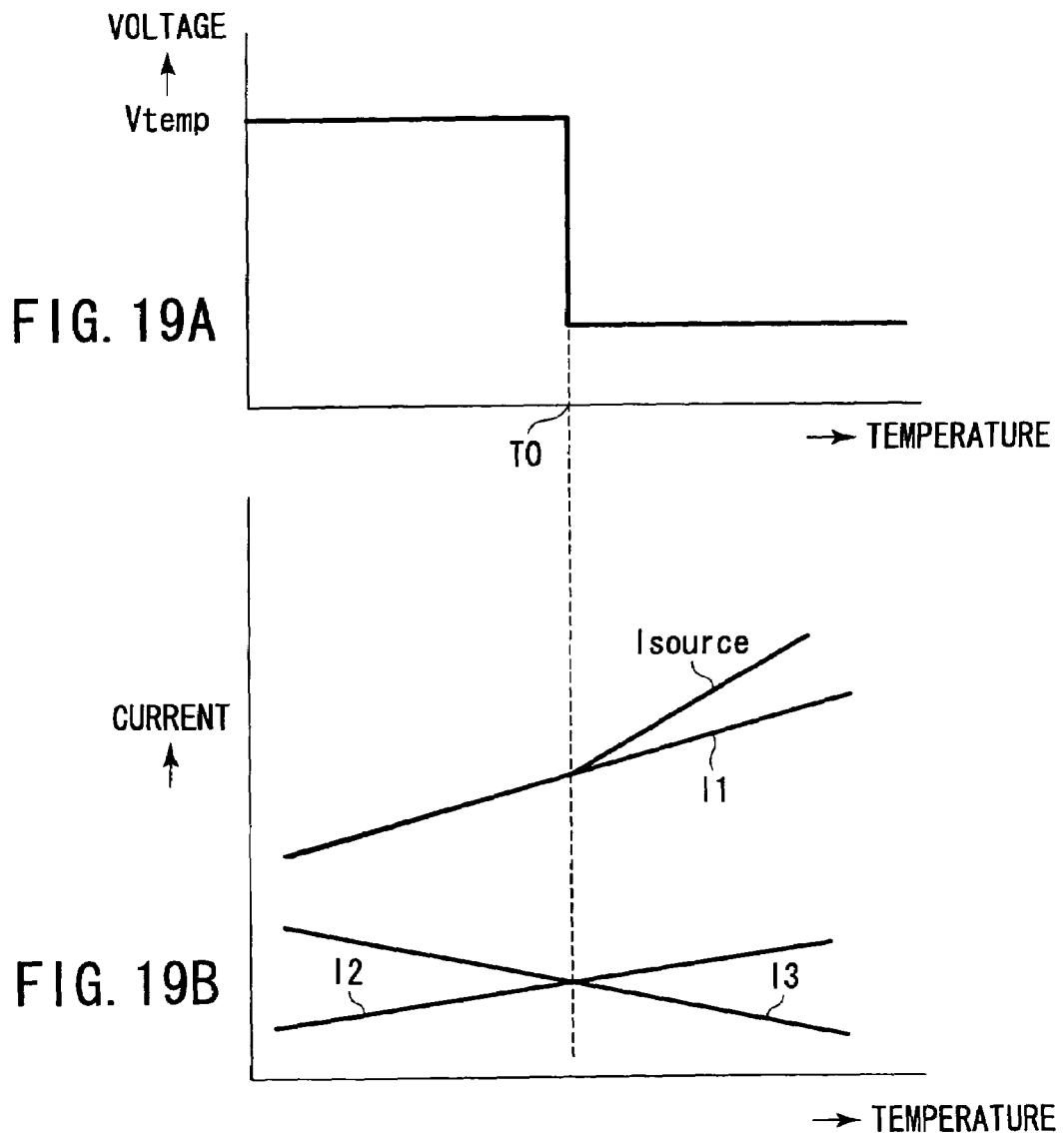
FIGS. 19A and 19B are characteristic diagrams of the current source circuit in FIG. 18.

FIG. 18 shows an example of a current source circuit that outputs a current exhibiting its temperature dependence as a folded line. Further, FIGS. 19A and 19B show the signal waveform and temperature dependence of the current source circuit in FIG. 18.

The current source circuit in FIG. 18 is composed of a first current source 121 and a second current source 122 each of which provides a current having a value increasing in proportion to temperature, a third current source 123 that provides a current having a value decreasing in proportion to temperature, a combinatorial circuit 124 that can select one of the combinations of outputs from the above three circuits, and a temperature sensor circuit 125 that detects temperature to control the combination.

At a specified temperature T0 or lower, the combinatorial circuit 124 outputs a current I1 obtained by copying a current through the first current source 121. On the other hand, in a temperature region exceeding T0, the combinatorial circuit 124 adds a current I2 obtained by copying a current through the second current source 122 to the current I1 obtained by copying the current through the first current source 121, then subtracts a current I3 obtained by copying a current through the third current source 123, from the synthetic current (I1+I2), and finally outputs the resultant current.

An example of the temperature sensor circuit 125 can be implemented by combining an output current from the circuit providing a current having a value increasing in proportion to temperature with an output current from the circuit providing a current having a value decreasing in proportion to temperature.

Specifically, at the first temperature T0 or lower, the temperature sensor circuit 125 in FIG. 18 outputs "H" and "L" as complementary binary signals Vtemp and bVtemp, for example, as shown in FIG. 19A. In the temperature region exceeding T0, the complementary binary signals Vtemp and bVtemp change to "L" and "H", respectively. These complementary binary signals are used to switch and control paths for the current I2 obtained by copying the current through the second current source 122 and the current I3 obtained by copying the current through the third current source 123.

A switch point (temperature T0) for the characteristics of the temperature sensor circuit 125 is set on the basis of the ratio of the amount of current output by the circuit providing a current having a value increasing in proportion to temperature to the amount of current output by the circuit providing a current having a value decreasing in proportion to temperature.

The temperature dependence of an input current to the current control type delay circuit shown in FIG. 13 can be exhibited as a line with two folds. In this case, the temperature dependence of the delay time can be exhibited as a line with two folds. By using this delay circuit as each of the delay circuits A and B in FIGS. 10 and 11, respectively, the temperature dependence of the pulse width can be exhibited as a line with two folds.

Figure 20:
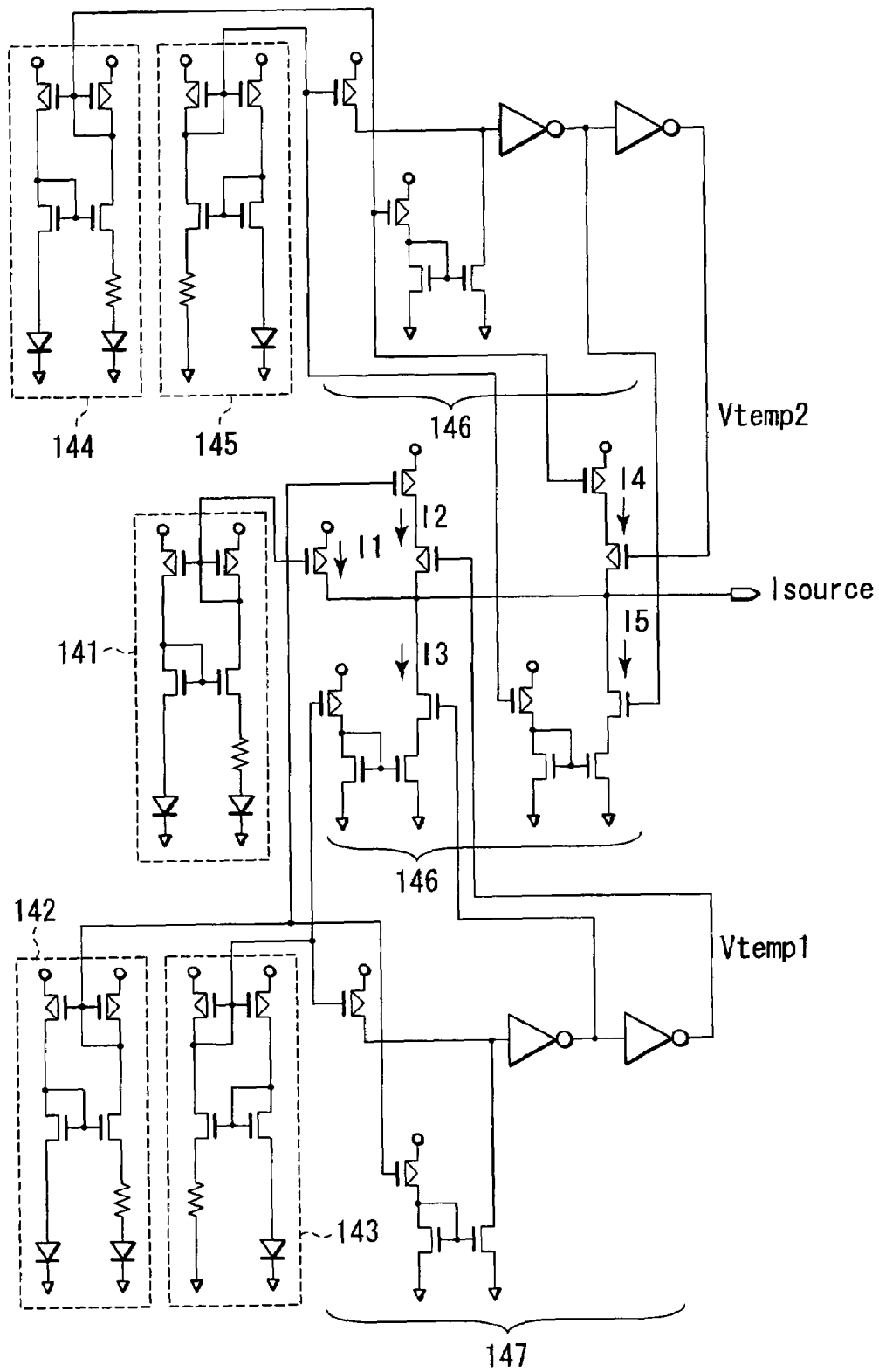
FIG. 20 is a circuit diagram showing further another example of the configuration of the current source circuit that supplies a current to the delay circuit in FIG. 13.

FIG. 20 shows an example of a current source circuit that outputs a current exhibiting its temperature dependence as a line with two folds. Further, FIGS. 21A and 21B show the signal waveform and temperature dependence of the current source circuit in FIG. 20.

The current source circuit in FIG. 20 is composed of a first current source 141, a second current source 142, and a fourth current source 144 each of which provides a current having a value increasing in proportion to temperature, a third current source 143 and a fifth current source 145 each of which provides a current having a value decreasing in proportion to temperature, a combinatorial circuit 146 that allows the selection of a combination of outputs from the above five circuits, and a first temperature sensor circuit 147 and a second temperature sensor circuit 148 each of which detects temperature to control the combination.

At a specified temperature T1 or lower, the combinatorial circuit 146 outputs a current I1 obtained by copying a current through the first current source 141. On the other hand, in a temperature region exceeding T1, the combinatorial circuit 146 adds a current I2 obtained by copying a current through the second current source 142 to the current I1 obtained by copying the current through the first current source 141, then subtracts a current I3 obtained by copying a current through the third current source 143, from the synthetic current (I1+I2), and finally outputs the resultant current (I1+I2−I3). Further, in a temperature region exceeding a second temperature T2 higher than the temperature T1, the combinatorial circuit 146 adds a current I4 obtained by copying a current through the fourth current source 144 to the current (I1+I2−I3), then subtracts a current I5 obtained by copying a current through the fifth current source 145, from the synthetic current (I1+I2−I3+I4), and finally outputs the resultant current (I1+I2−I3+I4−I5).

Figure 21A:
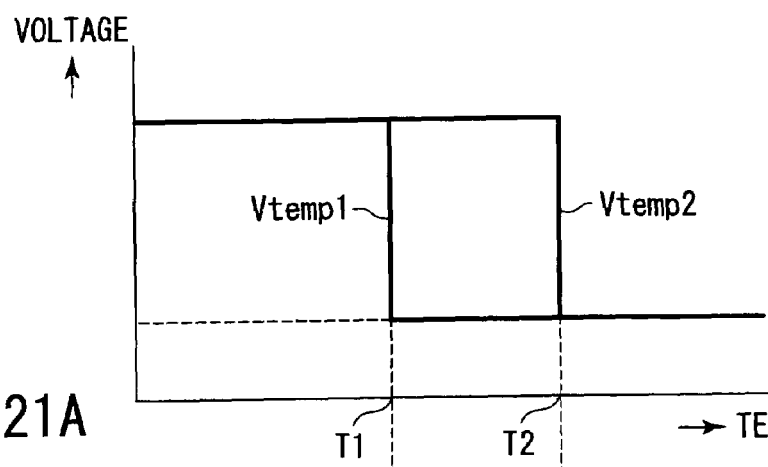
FIGS. 21A and 21B are characteristic diagrams of the current source circuit in FIG. 20.
Figure 21B:
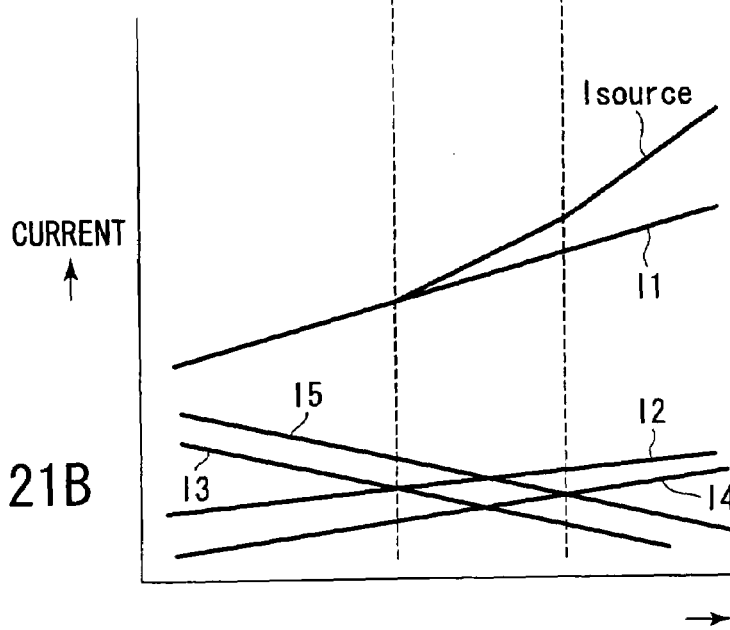

As shown in FIG. 21A, a signal Vtemp1 is "H" at the first temperature T1 or lower, while the signal Vtemp1 is "L" in the temperature region exceeding the temperature T1. The first temperature sensor circuit 147 complementary binary signals Vtemp1 and Vtemp2 on the basis of these signals. These complementary binary signals are used to switch and control paths for the output current I4 from the fourth current source 144 and the output current I5 from the fifth current source 145.

Figure 22:
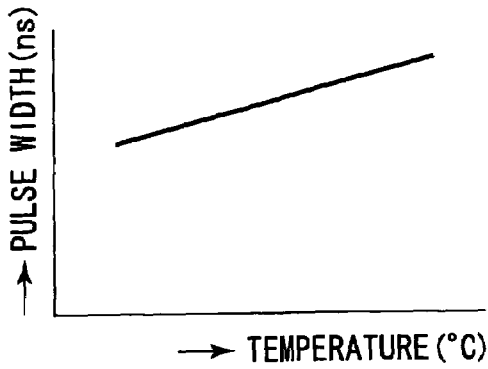
FIG. 22 is a characteristic diagram showing the relationship between the temperature and pulse width of the delay circuit in the trigger circuits in FIGS. 10 and 11.

FIG. 22 shows the relationship between temperature and the pulse width of the signal WWLDRV or WBLDRV observed if CMOS inverter circuits are used as each of the delay circuits A and B. In this case, the characteristic obtained is that the pulse width increases consistently with temperature.

Figure 23:
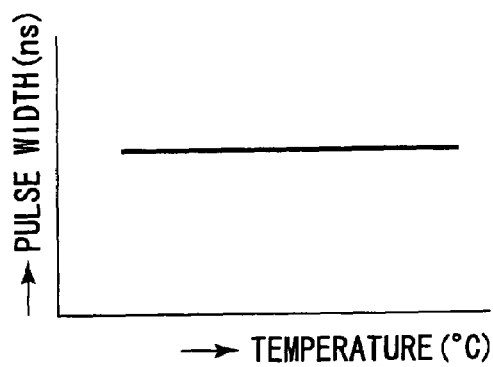
FIG. 23 is a characteristic diagram of the delay circuit in the trigger circuits in FIGS. 10 and 11, the diagram being different from FIG. 22.

FIG. 23 shows the relationship between temperature and the pulse width of the signal WWLDRV or WBLDRV observed if the current control type delay circuit in FIG. 13 using the current source circuit shown in FIG. 14 is used as each of the delay circuits A and B. In this case, the characteristic obtained in that the pulse width is independent of temperature.

Figure 24:
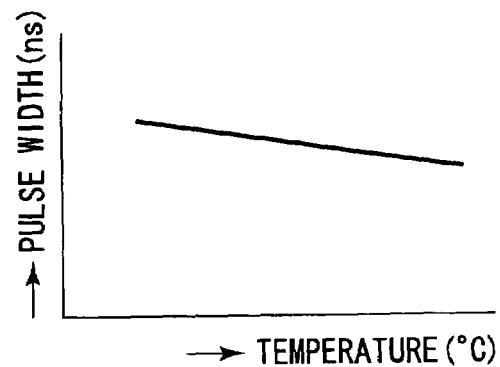
FIG. 24 is a characteristic diagram of the delay circuit in the trigger circuits in FIGS. 10 and 11, the diagram being different from FIGS. 22 and 23.

FIG. 24 shows the relationship between temperature and the pulse width of the signal WWLDRV or WBLDRV observed if the current control type delay circuit in FIG. 13 using the current source circuit shown in FIG. 16 is used as each of the delay circuits A and B. In this case, the characteristic obtained in that the pulse width decreases with increasing temperature.

Figure 25:
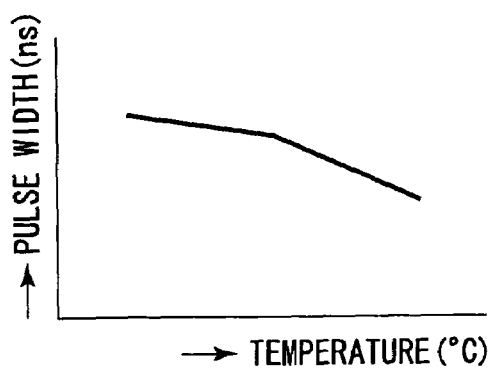
FIG. 25 is a characteristic diagram of the delay circuit in the trigger circuits in FIGS. 10 and 11, the diagram being different from FIGS. 22 to 24.

FIG. 25 shows the relationship between temperature and the pulse width of the signal WWLDRV or WBLDRV observed if the current control type delay circuit in FIG. 13 using the current source circuit shown in FIG. 18 is used as each of the delay circuits A and B. In this case, the characteristic obtained in that the pulse width decreases with increasing temperature, and exhibits its temperature dependence as a line folded at one temperature point.

Figure 26:
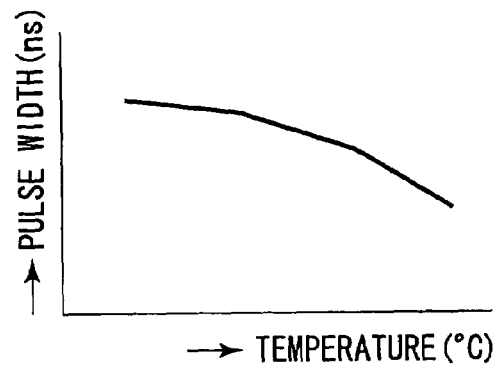
FIG. 26 is a characteristic diagram of the delay circuit in the trigger circuits in FIGS. 10 and 11, the diagram being different from FIGS. 22 to 25.

FIG. 26 shows the relationship between temperature and the pulse width of the signal WWLDRV or WBLDRV observed if the current control type delay circuit in FIG. 13 using the current source circuit shown in FIG. 20 is used as each of the delay circuits A and B. In this case, the characteristic obtained in that the pulse width decreases with increasing temperature, and exhibits its temperature dependence as a line folded at two temperature points.

As described above, the MRAM device according to the first embodiment is characterized by having a function of appropriately setting the temperature characteristics of the delay circuit A in the write word line driver/sinker trigger circuit and the delay circuit B in the write bit line driver/sinker trigger circuit so that the pulse width of the pulse-like write current is independent of temperature or varies with temperature. This prevents miswrites in high temperature regions.

Second Embodiment

With an MRAM device according to a second embodiment, the temperature dependence of the delay circuit A used in the write word line driver/sinker trigger circuit shown in FIG. 10 differs from the temperature dependence of the delay circuit B used in the write bit line driver/sinker trigger circuit shown in FIG. 11. Specific examples will be described below.

If the delay circuits A and B are each composed of the current control type delay circuit shown in FIG. 13, the current sources in these two delay circuits have difference temperature dependences. The two current sources with different temperature dependences can be implemented by making the amount of current from the first current source 81, providing a current having a value decreasing in proportion to temperature, different from the amount of current from the second current source 82, providing a current having a value increasing in proportion to temperature, each current source being provided in the current source circuit shown in FIG. 16.

Thus, the pulse width of a write current from the write word line driver/sinker shown in FIG. 8 can be made different from the pulse width of the write current from the write bit line driver/sinker shown in FIG. 9.

The temperature dependence shown in FIG. 15 may be exhibited as a line with one or more folded points.

Third Embodiment

U.S. Pat. No. 6,081,445, described previously, describes a method of reproducibly rewriting the direction of magnetization in the MTJ element. This method writes data by applying the magnetic field Hy in the hard-axis direction to the MTJ element to set the direction of magnetization in the magnetic domain at the end of the recording layer and then applying the magnetic field Hx in the easy-axis direction. That is, a write current is conducted through the write word line and then a write current is conducted through the write bit line. The switching of magnetization in the recording layer of the MTJ element is known to proceed from the end of a ferromagnetic layer. It is also known that when the magnetization at the end is set to the hard-axis direction so as to be unstable, data can be written with a small amount of magnetic field Hx in the easy-axis direction, i.e. with a small amount of write current. In this case, the switching of magnetization at the end of the recording layer is dependent on temperature. Thus, the magnetization is easily inversed at a high temperature.

However, the above method increases the time required for a write. This means that a miswrite stress is more likely to occur in a half-selected memory cell to which only the magnetic field from the write word line has been applied. Thus, undesirably, the magnetization is easily switched in high temperature regions.

Accordingly, it is desirable to reduce the interval between a timing for starting the application of a magnetic field in the hard-axis direction and a timing for starting the application of a magnetic field in the easy-axis direction.

In the MRAM device according to the third embodiment, the configuration of the write bit line driver/sinker trigger circuit shown in FIG. 11 is partly changed. This will be specifically described below.

Figure 27:
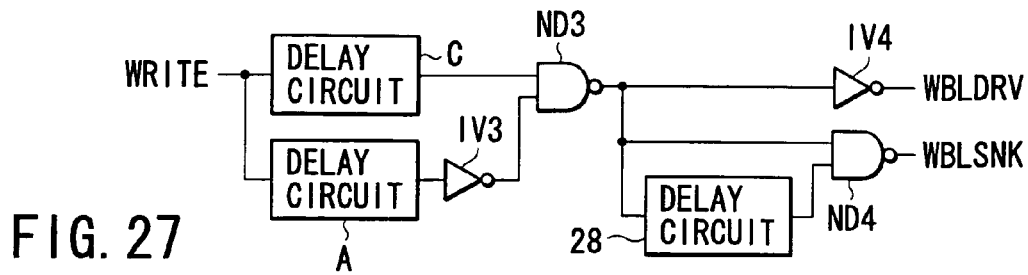
FIG. 27 is a circuit diagram showing another example of the configuration of the trigger circuit for the write bit line driver/sinker in FIG. 11.

FIG. 27 shows the specific configuration of the write bit line driver/sinker trigger circuit. This circuit is configured partly differently from the circuit shown in FIG. 11. That is, the trigger circuit in FIG. 27 is the same as the trigger circuit shown in FIG. 11 except that the delay circuit B is replaced with a delay circuit C and that the write signal WRITE is transmitted to one of the inputs of the NAND gate circuit ND3 via the delay circuit C. Thus, the same components as those in FIG. 11 are denoted by the same reference numerals.

Figure 28:
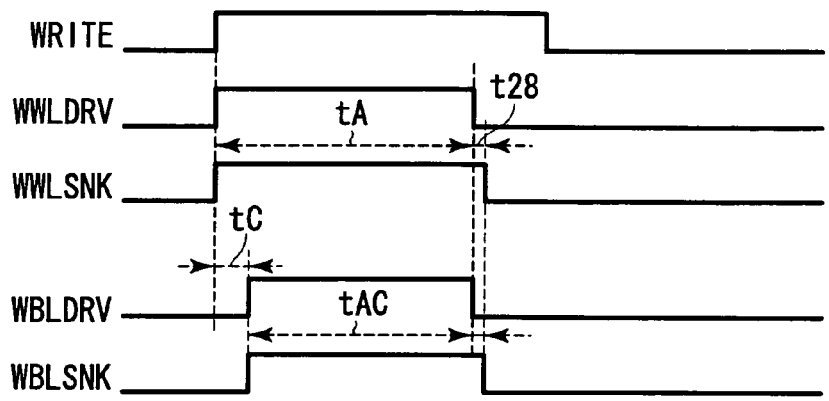
FIG. 28 is a waveform diagram showing an example of operations of the trigger circuits in FIGS. 27 and 10.

FIG. 28 shows an example of operation waveforms obtained if the write bit line driver/sinker trigger circuit in FIG. 27 is combined with the write word line driver/sinker trigger circuit in FIG. 10. In FIG. 28, reference characters tA and tC denote a delay time in the delay circuit A and a delay time in the delay circuit C, respectively. Reference character tAC denotes a delay time determined by the difference in delay time between the delay circuits A and C. Reference character t28 denotes a delay time in the delay circuit 28.

In the third embodiment, the delay circuit C is provided, so that the level of an output signal from the delay circuit C changes after an output signal from the write word line driver/sinker trigger circuit shown in FIG. 10 has changed. Furthermore, the delay circuit C has a temperature dependence such that the delay time decreases in high temperature regions. Consequently, the temperature dependence of the pulse width of an output signal from the trigger circuit in FIG. 27 is different from the temperature dependence of the pulse width of an output signal from the write word line driver/sinker trigger circuit shown in FIG. 10. This reduces the difference between the time when the output signal from the trigger circuit in FIG. 27 changes and the time when the output signal from the trigger circuit in FIG. 10 changes. It is thus possible to allow the write bit line driver/sinker to start the application of a magnetic field in the easy-axis direction earlier.

The delay circuit C can be provided with a temperature dependence such that the delay time decreases in high temperature regions, by, for example, using the current control type delay circuit shown in FIG. 13 and setting the temperature dependence of the current Isource, supplied to this delay circuit, so that the delay time decreases in high temperature regions.

Fourth Embodiment

In an MRAM device according to a fourth embodiment, the write bit line driver/sinker trigger circuit shown in FIG. 11 is replaced with a write bit line driver/sinker trigger circuit such as the one shown in FIG. 11

This trigger circuit is the same as the trigger circuit shown in FIG. 11 except that the write signal WRITE is transmitted to one of the inputs of the NAND gate circuit ND3 and to the delay circuit A, via the delay circuit C. Thus, the same components as those in FIG. 11 are denoted by the same reference numerals.

Figure 29:
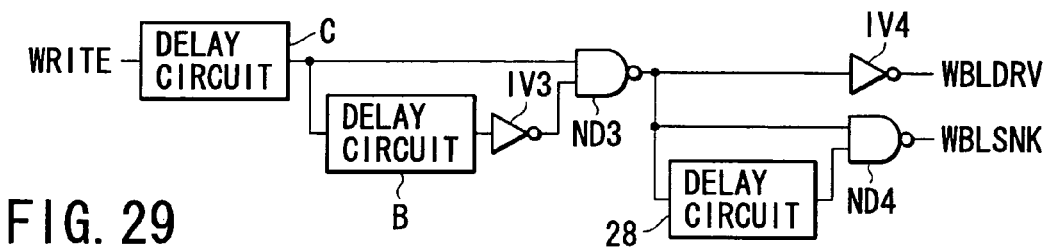
FIG. 29 is a circuit diagram of a trigger circuit for a write bit line driver/sinker used in an MRAM device according to a fourth embodiment.
Figure 30:
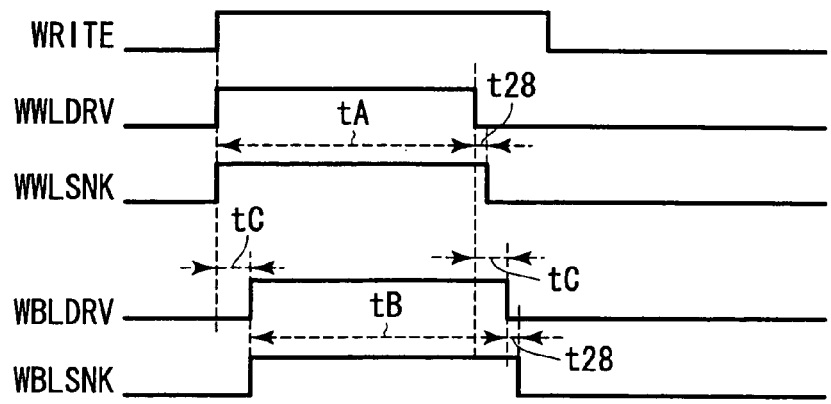
FIG. 30 is a waveform diagram showing an example of operations performed by a combination of the trigger circuit in FIG. 29 with the trigger circuit in FIG. 10.

FIG. 30 shows an example of operation waveforms obtained if the write bit line driver/sinker trigger circuit in FIG. 29 is combined with the write word line driver/sinker trigger circuit in FIG. 10. In FIG. 30, reference characters tA and tB denote a delay time in the delay circuit A and a delay time in the delay circuit B, respectively. Reference characters tC and t28 denote a delay time in the delay circuit C and a delay time in the delay circuit 28, respectively.

According to the trigger circuit in FIG. 29, the delay circuit C is provided, so that the pulse width of an output signal from the trigger circuit decreases. Further, the output signal changes after an output signal from the write word line driver/sinker trigger circuit shown in FIG. 10 has changed.

Furthermore, the delay circuit C has a temperature dependence such that the delay time decreases in high temperature regions. Consequently, the temperature dependence of the pulse width of an output signal from the trigger circuit in FIG. 29 is different from the temperature dependence of the pulse width of an output signal from the trigger circuit shown in FIG. 10. This reduces the difference between the time when the output signal from the trigger circuit in FIG. 29 changes and the time when the output signal from the trigger circuit in FIG. 10 changes. It is thus possible to allow the write bit line driver/sinker shown in FIG. 9 to start the application of a magnetic field in the easy-axis direction earlier.

Variation of Fourth Embodiment

Now, description will be given of an MRAM device according to a variation of the fourth embodiment. In the MRAM device according to the present variation, the interval between the time to start applying a magnetic field in the hard-axis direction and the time to start applying a magnetic field in the easy-axis direction is different from the interval between the time to end the application of the magnetic field in the hard-axis direction and the time to end the application of the magnetic field in the easy-axis direction.

Figure 31:
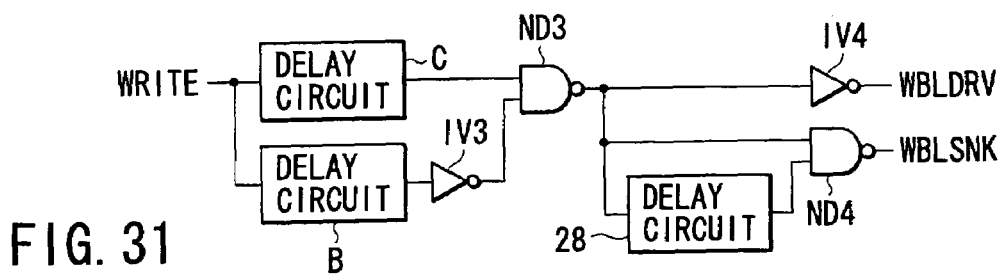
FIG. 31 is a circuit diagram showing a variation of the trigger circuit for the write bit line driver/sinker shown in FIG. 29.

FIG. 31 shows the configuration of a write bit line driver/sinker trigger circuit according to the present variation. The trigger circuit in FIG. 31 is the same as the trigger circuit shown in FIG. 11 except that the write signal WRITE is transmitted to one of the inputs of the NAND gate circuit ND3 via the delay circuit C. Thus, the same components as those in FIG. 11 are denoted by the same reference numerals.

Figure 32:
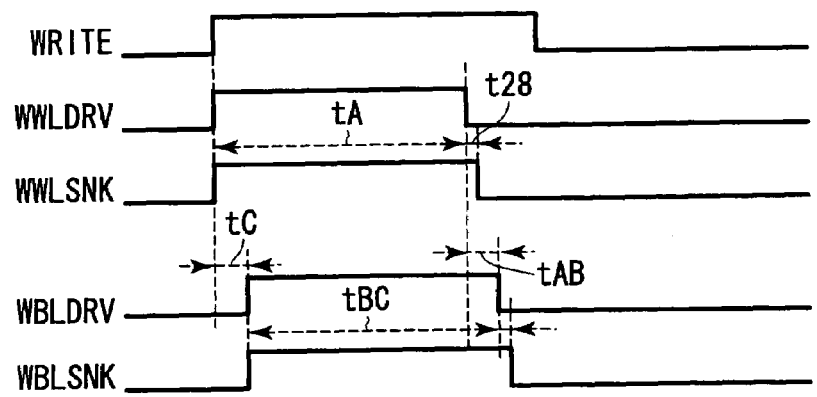
FIG. 32 is a waveform diagram showing an example of operations performed by a combination of the trigger circuit in FIG. 31 with the trigger circuit in FIG. 10.

FIG. 32 shows an example of operation waveforms obtained if the write bit line driver/sinker trigger circuit in FIG. 31 is combined with the write word line driver/sinker trigger circuit in FIG. 10. In FIG. 32, reference characters tA and tC denote a delay time in the delay circuit A and a delay time in the delay circuit C, respectively. Reference character tAB denotes a delay time determined by the difference in delay time between the delay circuits A and B. Reference character tBC denotes a delay time determined by the difference in delay time between the delay circuits B and C. Reference character t28 denotes a delay time in the delay circuit 28.

The temperature dependence of the pulse width of an output signal from the trigger circuit in FIG. 31 is dependent on the temperature dependence of the delay circuit C. It is different from the temperature dependence of the pulse width of an output signal from the write word line driver/sinker trigger circuit in FIG. 10. Furthermore, the temperature dependence of the delay circuit C in the trigger circuit in FIG. 31 affects the pulse width of an output signal from the write bit line driver/sinker shown in FIG. 9 in order to conduct a current through the write bit line.

Fifth Embodiment

The asteroid curve for the MTJ element may be shifted in the easy-axis direction owing to a magnetic stray field from the fixed layer in the MTJ element or the ferromagnetic coupling with the fixed and the recording layer causing by the surface roughness of the fixed and recording layers which lie opposite the tunnel barrier film.

Figure 33:
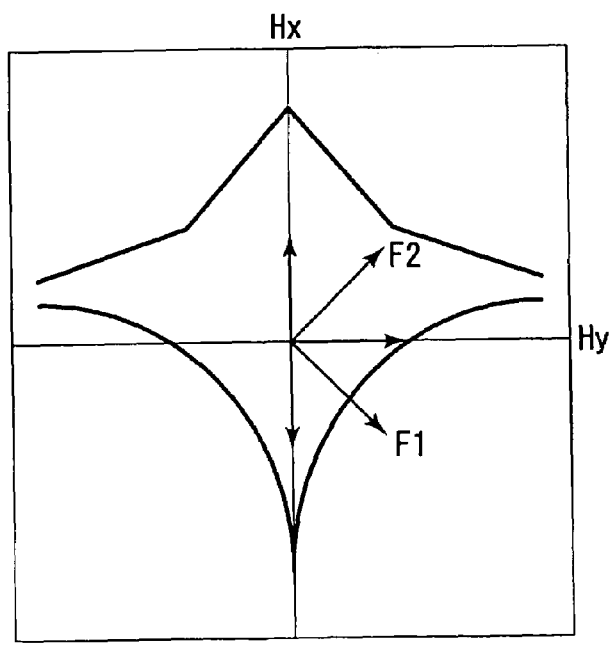
FIG. 33 is a characteristic diagram showing an example of a distorted asteroid curve for an MTJ element.

FIG. 33 shows an example of a distorted asteroid curve for the MTJ element.

In FIG. 33, a combined magnetic field F1 is larger than the switching threshold magnetic field shown in the asteroid curve, the combined magnetic field F1 being composed of a magnetic field in the easy-axis direction obtained if a write current is applied to the write bit line in a first direction and a magnetic field in the hard-axis direction obtained if a write current is applied to the write word line in a specified direction. However, a combined magnetic field F2 is smaller than the switching threshold magnetic field shown in the asteroid curve, the combined magnetic field F2 being composed of a magnetic field in the easy-axis direction obtained if a write current of the same value is applied to the write bit line in the direction opposite to the first direction and a magnetic field in the hard-axis direction obtained if the write current is applied to the write word line in the specified direction. In this case, writes are disabled unless the value of the required write current is varied depending on the write data, i.e. the direction of the write current.

With an MRAM device according to a fifth embodiment, on the basis of the relationship that the required amount of pulse-like write current increases with decreasing pulse width of it, the pulse width of the pulse-like current, flowing through the write bit line, is varied depending on the direction of the write current which is required to generates a magnetic field in the easy-axis direction. Furthermore, as in the case with the MRAM device according to the first embodiment, the pulse width is dependent on temperature.

Figure 34:
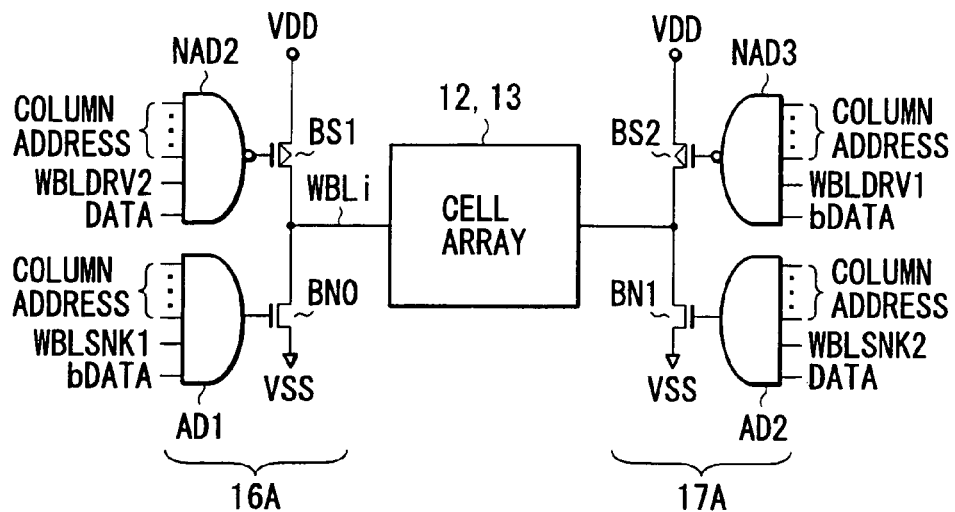
FIG. 34 is a circuit diagram of a write bit line driver/sinker used in an MRAM device according to a fifth embodiment.

FIG. 34 shows the configuration of circuits in the write bit line drivers/sinkers 16A and 17A used in the MRAM device according to the fifth embodiment.

These two write bit line drivers/sinkers 16A and 17A are the same as the write bit line driver/sinker previously described with reference to FIG. 9 except for the use of control signals WBLDRV1 and WBLSNK1 for a first direction of the write current and control signals WBLDRV2 and WBLSNK2 for a second direction of the write current.

Figure 35A:
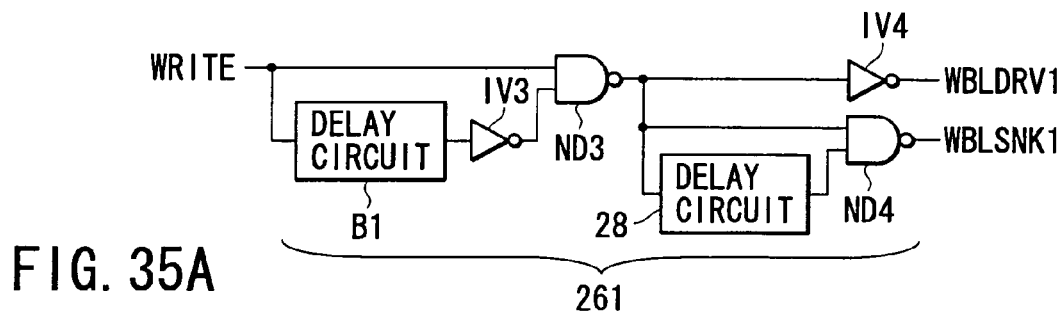
FIGS. 35A and 35B are circuit diagrams of a trigger circuit for the write bit line driver/sinker shown in FIG. 34.
Figure 35B:
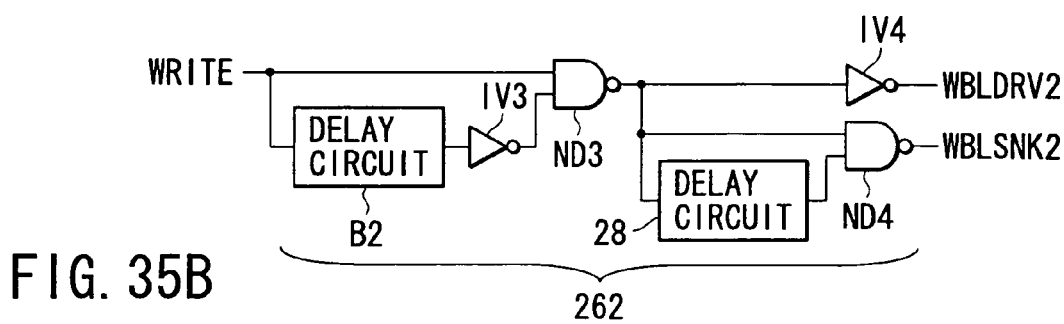
Figure 36:
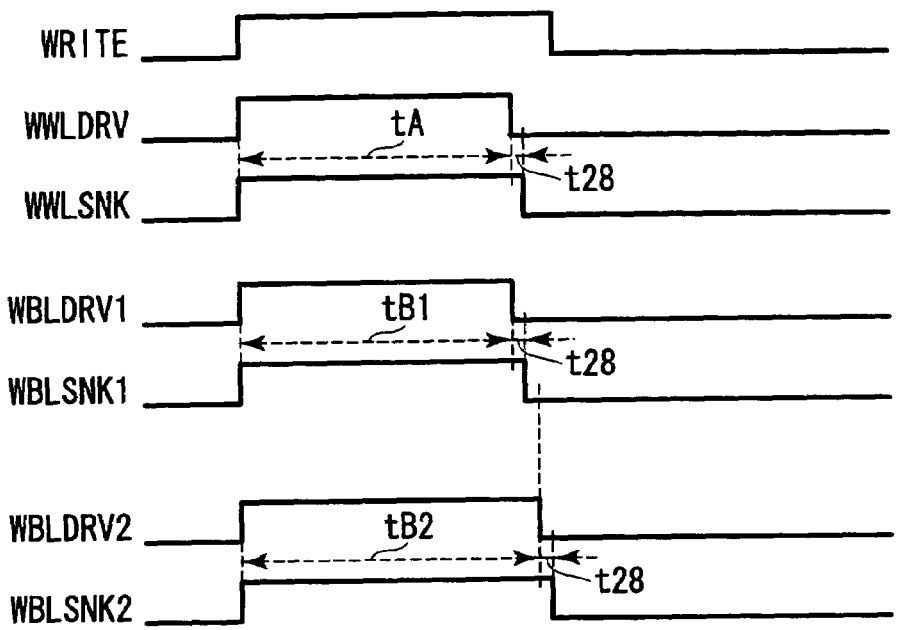
FIG. 36 is a waveform diagram showing an example of operations performed by a combination of the trigger circuits in FIGS. 35A and 35B with the trigger circuit in FIG. 10.

FIGS. 35A and 35B shows an example of the configuration of a trigger circuit for the write bit line driver/sinker in FIG. 34. Further, FIG. 36 shows an example of operation waveforms obtained if the write bit line driver/sinker trigger circuits in FIGS. 35A and 35B are combined with the write word line driver/sinker trigger circuit in FIG. 10. In FIG. 36, reference characters tB1 and tB2 denote a delay time in a delay circuit B1 and a delay time in a delay circuit B2, respectively. Reference character t28 denotes a delay time in the delay circuit 28.

The first trigger circuit 261 shown in FIG. 35A generates control signals WBLDRV1 and WBLSNK1 for the first direction. The second trigger circuit 262 shown in FIG. 35B generates control signals WBLDRV2 and WBLSNK2 for the second direction. Each of the two trigger circuits 261 and 262 are the same as the trigger circuit previously described with reference to FIG. 11 except that the corresponding delay circuits B1 and B2 use different delay times.

Specifically, the delay time in the delay circuit provided in one of the trigger circuits which must increase a write current, e.g. the delay circuit B1, provided in the trigger circuit 261, is set to be longer than the delay circuit in the other trigger circuit, e.g. the delay circuit B2, provided in the trigger circuit 262. This sets the pulse width of a pulse signal output by the one 261 of the trigger circuits to be longer than the pulse width of a pulse signal output by the other trigger circuit 262. This in turn sets the time required to apply a write current in one of the directions to be longer than the time required to apply a write current in the other direction.

As a variation of the fifth embodiment, the fifth embodiment may be combined with one of the previously described first to fourth embodiments.

Sixth Embodiment

With an MRAM device according to a sixth embodiment, the pulse width and temperature dependence of a write current can be adjusted by enabling the programmable setting of timings for starting and ending the supply of write currents to the write word line/bit line.

Figure 37:
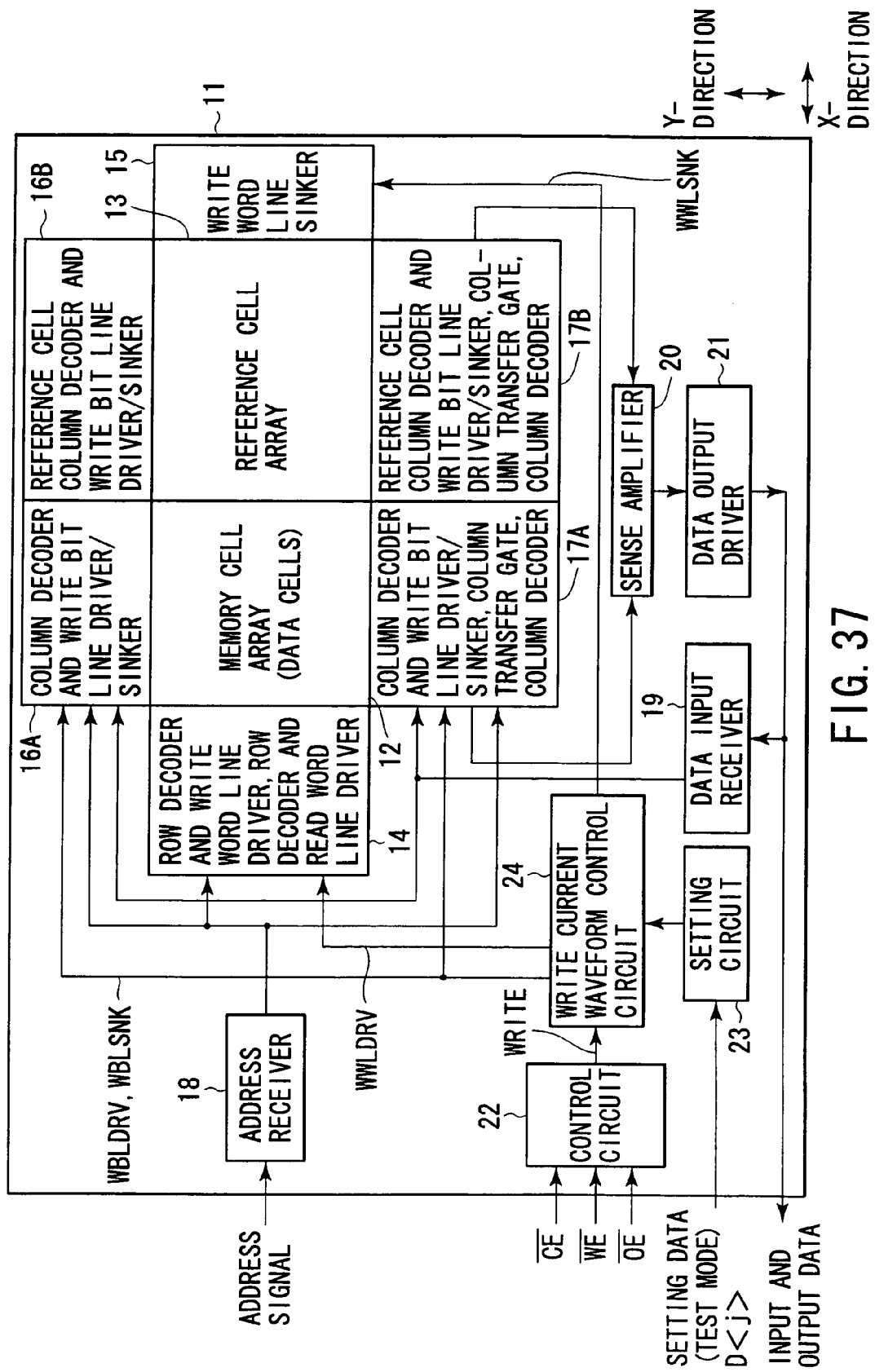
FIG. 37 is a block diagram showing an example of the whole configuration of an MRAM device according to a sixth embodiment of the present invention.

FIG. 37 shows the whole configuration of the MRAM device according to the sixth embodiment.

This MRAM device is the same as the MRAM device according to the first embodiment except that (1) a setting circuit 23 is added and (2) the write current waveform control circuit 24 provides different functions. The same components as those in FIG. 7 are denoted by the same reference numerals. Thus, their description is omitted.

The newly added setting circuit 32 is provided with programming elements composed of, for example, laser blow fuses, MTJ elements, anti-fuses that destroy the tunnel barriers of MTJ elements, or the like. Setting data is pre-programmed in these programming elements. Alternatively, in an MRAM test mode, the write current waveform control circuit 24 may be supplied with setting data input through, for example, a data I/O terminal or an address terminal.

Figure 38:
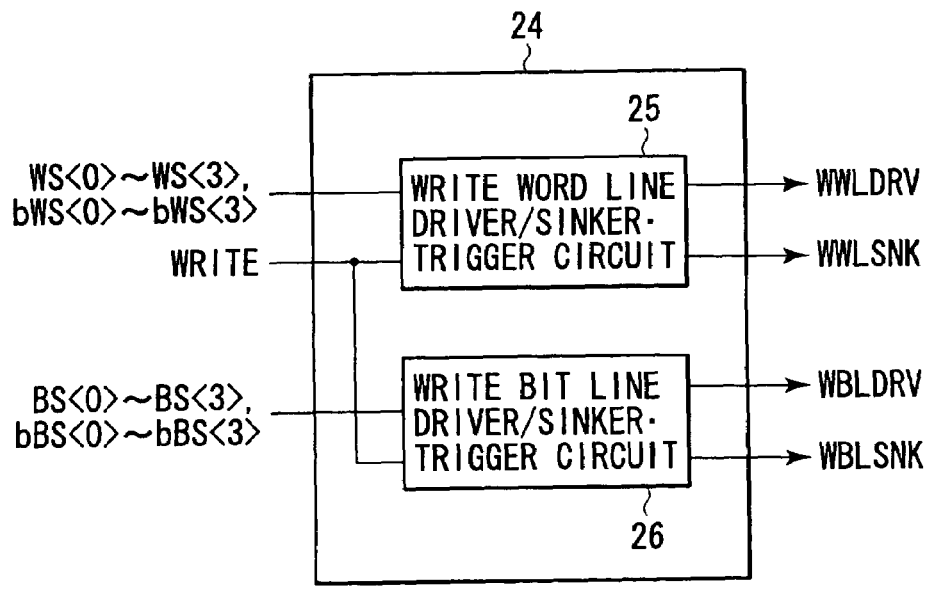
FIG. 38 is a circuit diagram of a write current waveform control circuit in FIG. 37.

FIG. 38 shows an example of the write current waveform control circuit 24 in FIG. 37.

The write current waveform control circuit 24 is composed of a write word line driver/sinker trigger circuit 25 and a write bit line driver/sinker trigger circuit 26. The write current waveform control circuit 24 generates a write word line drive signal WWLDRV, a write word line sink signal WWLSNK, a write bit line drive signal WBLDRV, and a write bit line sink signal WBLSNK.

The write word line driver/sinker trigger circuit 25 generates a write word line drive signal WWLDRV and a write word line sink signal WWLSNK on the basis of the write signal WRITE and timing control signals WS<0> to WS<3> and bWS<0> to bWS<3>.

The write bit line driver/sinker trigger circuit 26 generates a write bit line drive signal WBLDRV and a write bit line sink signal WBLSNK on the basis of the write signal WRITE and timing control signals BS<0> to BS<3> and bBS<0> to bBS<3>. The write signal WRITE signal changes to "H" for a write operation.

The timing control signals WS<0> to WS<3> and bWS<0> to bWS<3> determine timings for starting and ending the supply of a write current to the write word line WWLi, i.e. timings used to change the write word line drive signal WWLDRV and the write word line sink signal WWLSNK to "H" or "L".

The timing control signals BS<0> to BS<3> and bBS<0> to bBS<3> determine timings for starting and ending the supply of a write current to the write bit line WBLi, i.e. timings used to change the write bit line drive signal WBLDRV and the write bit line sink signal WBLSNK to "H" or "L".

The setting circuit 23 generates timings control signals WS<0> to WS<3>, bWS<0> to bWS<3>, BS<0> to BS<3>, and bBS<0> to bBS<3>.

Figure 39:
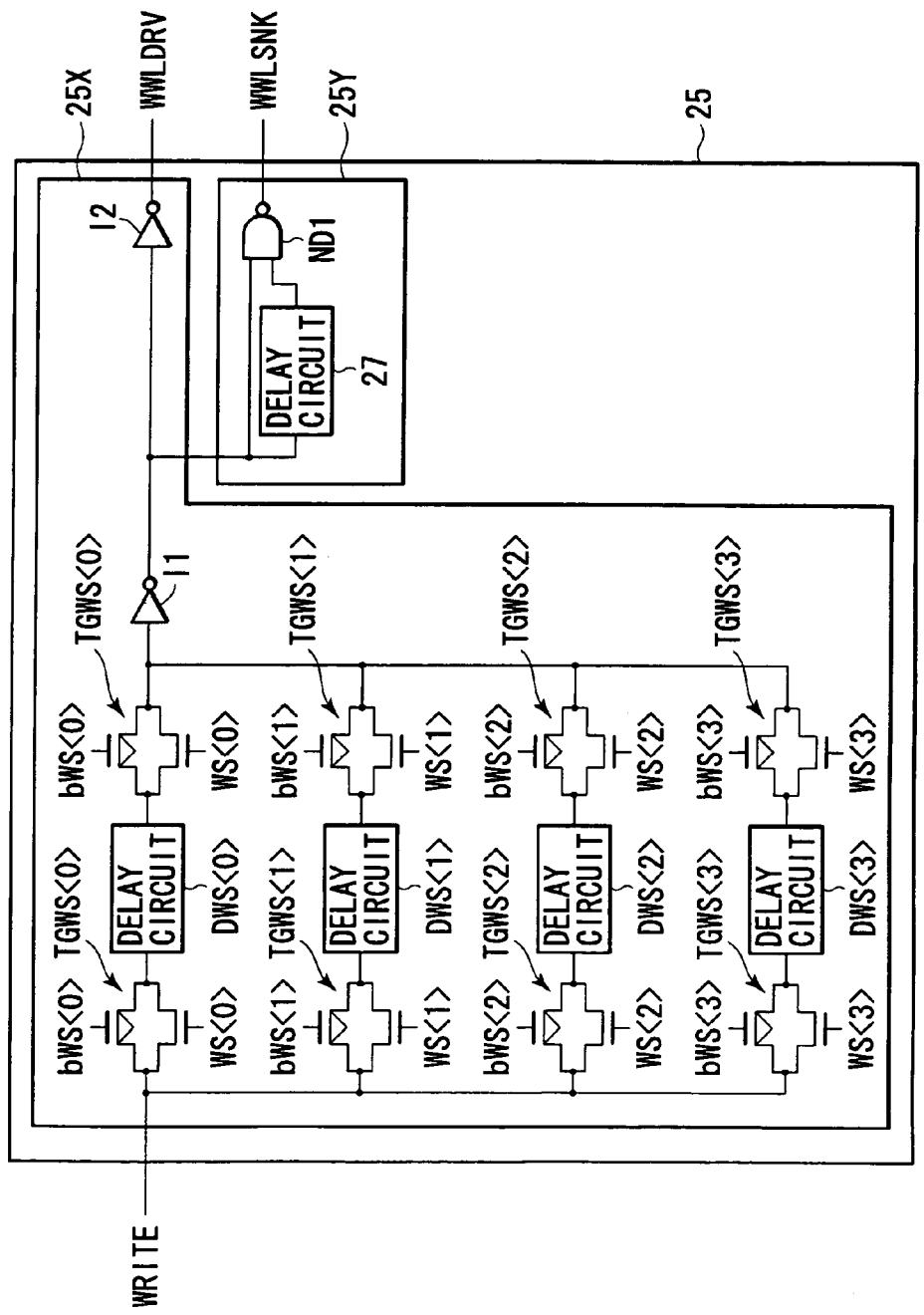
FIG. 39 is a circuit diagram of a trigger circuit for the write word line driver/sinker in FIG. 38.

FIG. 39 shows an example of the write word line driver/sinker trigger circuit 25 in FIG. 38.

The write word line driver/sinker trigger circuit 25 is composed of a current supply start/end timing determining circuit 25X that determines timings for starting and ending the supply of a write current and a current sink timing determining circuit 25Y that determines a timing for sinking a write current.

The current supply start/end timing determining circuit 25X determines a timing for changing the write word line drive signal WWLDRV to "H" after the write signal WRITE has changed to "H". It also determines a timing for changing the write word line drive signal WWLDRV to "L" after the write signal WRITE has changed to "L".

The current supply start/end timing determining circuit 25X is composed of a plurality of, in the present example, four delay circuits DWS<0> to DWS<3>, transfer gates TGWS<0> to TGWS<3>, and inverters I1 and I2.

The delay circuits DWS<0> to DWS<3> have different amounts of delay with respect to the write signal WRITE as an input signal. The amounts of delay in the delay circuits DWS<0> to DWS<3> may be set to have specified differences or to vary regularly or randomly.

The transfer gates TGWS<0> to TGWS<3> are provided in the current supply start/end timing determining circuit 25X to select one the plurality of delay circuits DWS<0> to DWS<3>. That is, for a write operation, one of a plurality of complementary timing control signal pairs WS<j> and bWS<j> (j=0, 1, 2, 3) is selected.

For the selected complementary signal pair, WS<j>="H" and bWS<j>="L". For the other complementary signal pairs, WS<j>="L" and bWS<j>="H". Accordingly, the write signal WRITE is output by the write word line driver/sinker trigger circuit 25 via the selected delay circuit DWS<j> as the write word line drive signal WWLDRV.

By thus using one of the delay circuits DWS<0> to DWS<3> to delay the time when the write signal WRITE changes to "H" or "L", a specified period, it is possible to control the timing for changing the write word line drive signal WWLDRV to "H" or "L", i.e. timings for starting and ending the supply of a write current.

In the description of the present example, the four delay circuits DWS<0> to DWS<3> are provided. Naturally, the number of selectable delay amounts increases consistently with the number of delay circuits. An increased number of selectable delay amounts enable the precise control of the timings for starting and ending the supply of a write current. However, in this case, the number of timing control signals used to select one of the delay circuits also increases.

The current sink timing determining circuit 25Y is composed of the NAND gate ND1 and the delay circuit 27. The current sink timing determining circuit 25Y changes the write word line sink signal WWLSNK to "H" at almost the same time when the write word line drive signal WWLDRV changes to "H" and then after a delay time determined by the delay circuit 27, changes the write word line sink signal WWLSNK to "L".

By thus changing the write word line drive signal WWLDRV to "L" and after a specified interval, changing the write word line sink signal WWLSNK to "L", the voltage across the write word line WWLi can be completely zeroed after a write operation.

Figure 40:
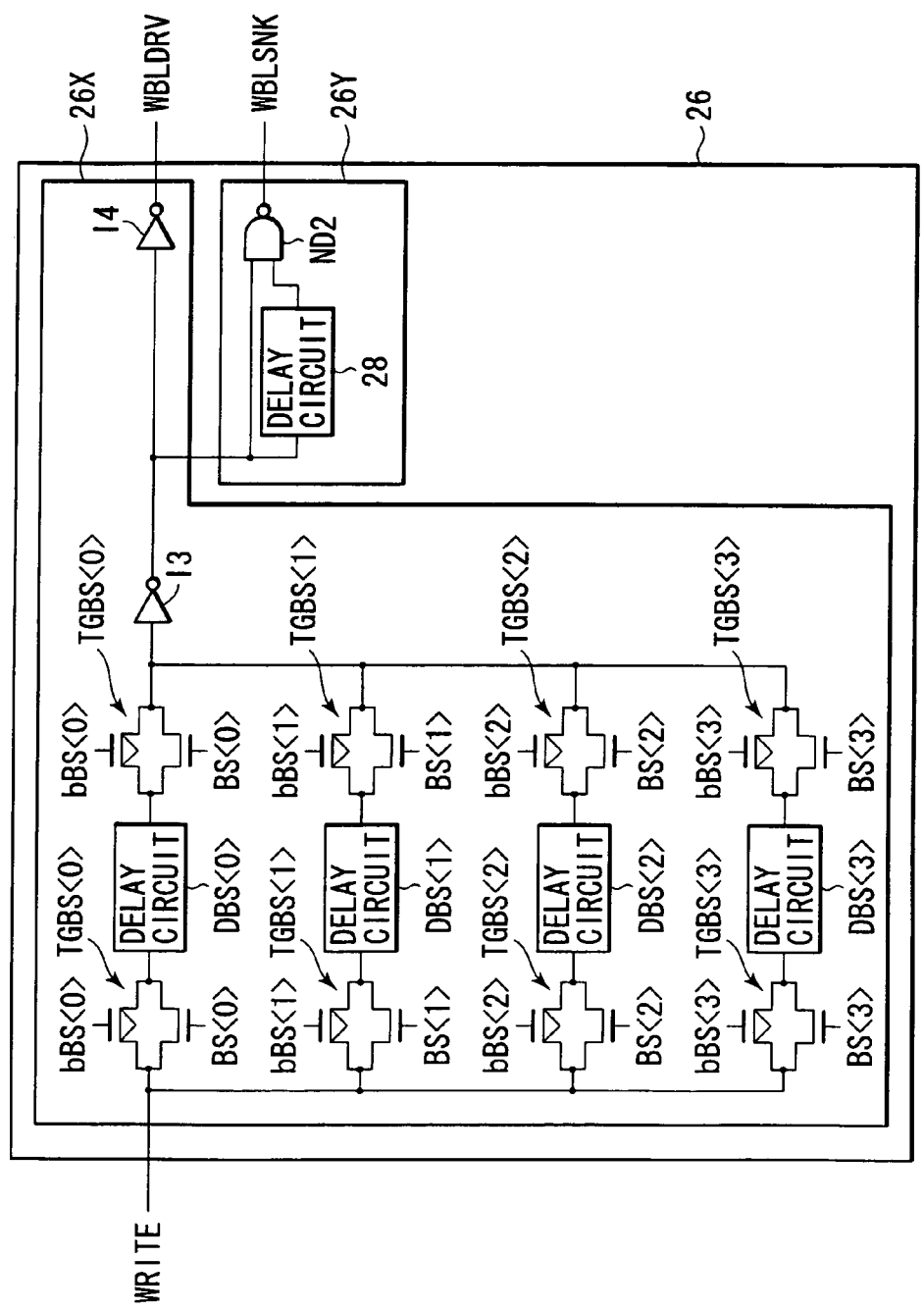
FIG. 40 is a circuit diagram of a trigger circuit for the write bit line driver/sinker in FIG. 38.

FIG. 40 shows an example of the write bit line driver/sinker trigger circuit 26 in FIG. 38.

The write bit line driver/sinker trigger circuit 26 is composed of a current supply start/end timing determining circuit 26X that determines timings for starting and ending the supply of a write current and a current sink timing determining circuit 26Y that determines a timing for sinking a write current.

The current supply start/end timing determining circuit 26X determines a timing for changing the write bit line drive signal WBLDRV to "H" after the write signal WRITE has changed to "H". It also determines a timing for changing the write bit line drive signal WBLDRV to "L" after the write signal WRITE has changed to "L".

The current supply start/end timing determining circuit 26X is composed of a plurality of, in the present example, four delay circuits DBS<0> to DBS<3>, transfer gates TGBS<0> to TGBS<3>, and inverters I3 and I4.

The delay circuits DBS<0> to DBS<3> have different amounts of delay with respect to an input signal, i.e. the write signal WRITE. The amounts of delay in the delay circuits DBS<0> to DBS<3> may be set to have specified differences or to vary regularly or randomly.

The transfer gates TGBS<0> to TGBS<3> are provided in the current supply start/end timing determining circuit 26X to select one the plurality of delay circuits DBS<0> to DBS<3>. That is, for a write operation, one of a plurality of complementary timing control signal pairs BS<j> and bBS<j> (j=0, 1, 2, 3) is selected.

For the selected complementary signal pair, BS<j>="H" and bBS<j>="L". For the other complementary signal pairs, BS<j>="L" and bBS<j>="H". Accordingly, the write signal WRITE is output by the write bit line driver/sinker trigger circuit 25 via the selected delay circuit DBS<j> as the write bit line drive signal WBLDRV.

By thus using one of the delay circuits DBS<0> to DBS<3> to delay the time when the write signal WRITE changes to "H" or "L", a specified period, it is possible to control the timing for changing the write bit line drive signal WBLDRV to "H" or "L", i.e. timings for starting and ending the supply of a write current.

In the description of the present example, the four delay circuits DBS<0> to DBS<3> are provided. Naturally, the number of selectable delay amounts increases consistently with the number of delay circuits. An increased number of selectable delay amounts enable the precise control of the timings for starting and ending the supply of a write current. However, in this case, the number of timing control signals used to select one of the delay circuits also increases.

The current sink timing determining circuit 26Y is composed of the NAND gate ND2 and the delay circuit 28. The current sink timing determining circuit 26Y changes the write bit line sink signal WBLSNK to "H" at almost the same time when the write bit line drive signal WBLDRV changes to "H" and then after a delay time determined by the delay circuit 28, changes the write bit line sink signal WBLSNK to "L".

By thus changing the write bit line drive signal WBLDRV to "L" and after a specified interval, changing the write bit line sink signal WBLSNK to "L", the voltage across the write bit line WBLi can be completely zeroed after a write operation.

Now, description will be given of the setting circuit 23, which generates timing control signals WS<0> to WS<3>, bWS<0> to bWS<3>, BS<0> to BS<3>, and bBS<0> to bBS<3>, shown in FIGS. 38 to 40.

Figure 41:
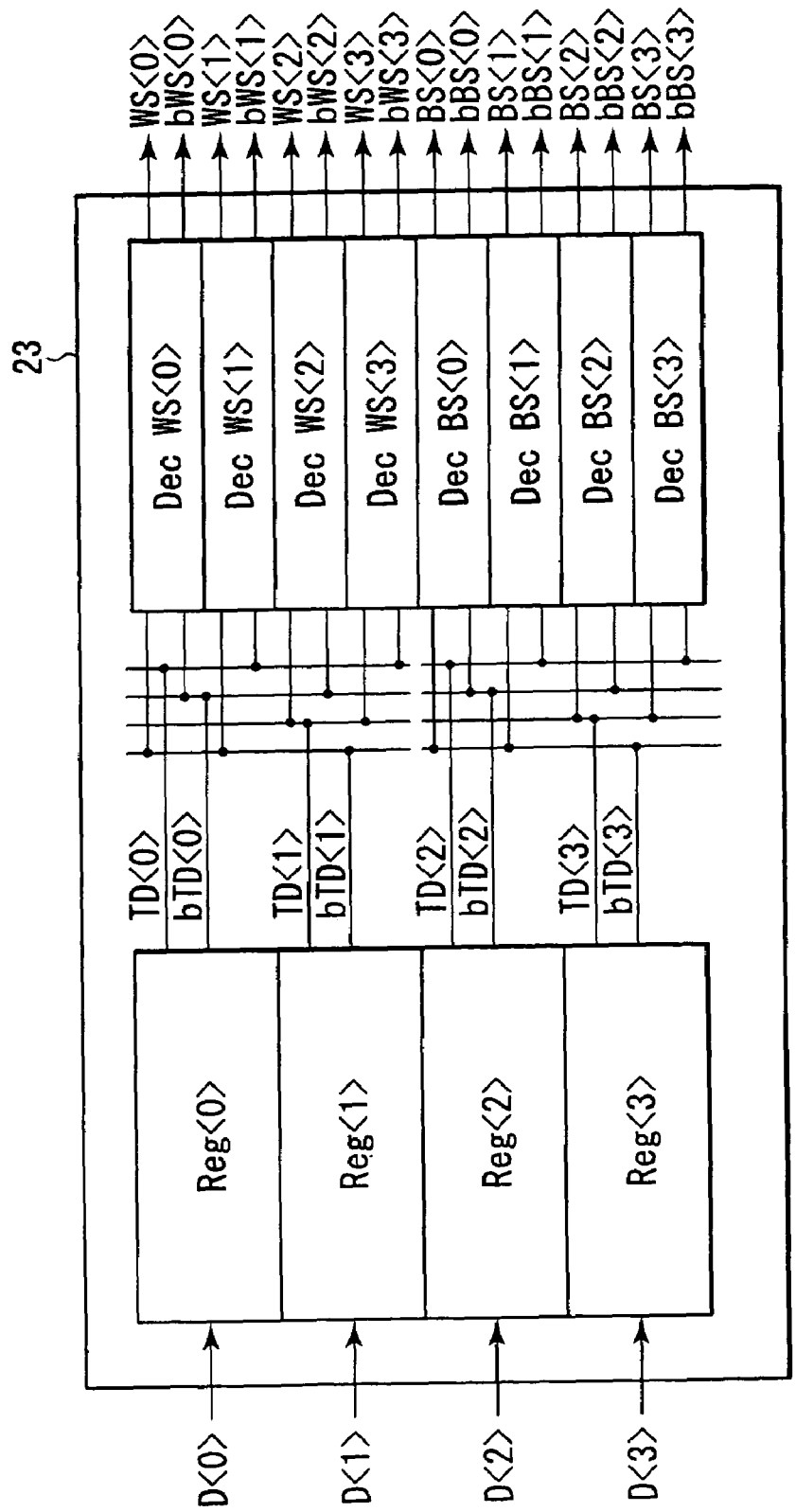
FIG. 41 is a circuit diagram of a setting circuit in FIG. 37.

FIG. 41 shows an example of the setting circuit 23 in FIG. 37.

The setting circuit 23 is composed of registers Reg<0> to Reg<3> in which setting data used to determine the timings for starting and ending the supply of a write current is programmed and decoders DecWS<0> to DecWS<3> and DecBS<0> to DecBS<3> which decode output signals TD<0> to TD<3> and bTD<0> to bTD<3>, respectively, from the respective registers Reg<0> to Reg<3> to output timing control signals WS<0> to WS<3>, bWS<0> to bWS<3>, BS<0> to BS<3>, and bBS<0> to bBS<3>, respectively.

The setting data used to determine the timings for starting and ending the supply of a write current to the write word line WWLi is programmed in the registers Reg<0> and Reg<1>.

If the write word line driver/sinker trigger circuit 25 is provided with the four delay circuits DWS<0> to DWS<3> as shown in FIG. 39, at least 2-bit setting data is required.

Thus, in the present example, to determine the timings for starting and ending the supply of a write current to the write word line WWLi, the two registers Reg<0> and Reg<1> are provided and 1-bit setting data is programmed in each the registers Reg<0> and Reg<1>.

Reference characters D<0> and D<1> denote setting data input by equipment located outside the MRAM. In a test mode, the timings for starting and ending the supply of a write current to the write word line WWLi can be determined on the basis of the setting data.

The two registers Reg<0> and Reg<1> output a pair of 2-bit complementary signals TD<0> and bTD<0> and a pair of 2-bit complementary signals TD<1> and bTD<1>, respectively. The decoders DecWS<0> to DecWS<3> decode the 2-bit complementary signal pairs TD<0> and bTD<0> as well as TD<1> and bTD<1>, respectively, to output timing control signals WS<0> to WS<3> and bWS<0> to bWS<3>, respectively.

For example, when two input signals are "H", the decoder DecWS<j> changes the output signal WS<j> to "H", while changing the output signal bWS<j> to "L" (j=0, 1, 2, 3). That is, in the present example, the two input signals are "H" for only one of the four decoders DecWS<0> to DecWS<3>. Accordingly, for only one of the four complementary signal pairs WS<j> and bWS<j>, WS<j>="H" and bWS<j>="L". For the remaining three complementary signal pairs, WS<j>="L" and bWS<j>="H".

Similarly, the setting data used to determine the timings for starting and ending the supply of a write current to the write bit line WBLi is programmed in the registers Reg<2> and Reg<3>.

If the write bit line driver/sinker trigger circuit 26 is provided with the four delay circuits DBS<0> to DBS<3> as shown in FIG. 40, at least 2-bit setting data is required.

Thus, in the present example, to determine the timings for starting and ending the supply of a write current to the write bit line WBLi, the two registers Reg<2> and Reg<3> are provided and 1-bit setting data is programmed in each the registers Reg<2> and Reg<3>.

Reference characters D<2> and D<3> denote setting data input by equipment located outside the MRAM device in the test mode. In the test mode, the timings for starting and ending the supply of a write current to the write bit line WBLi can be determined on the basis of the setting data.

The two registers Reg<2> and Reg<3> output a pair of 2-bit complementary signals TD<2> and bTD<2> and a pair of 2-bit complementary signals TD<3> and bTD<3>, respectively. The decoders DecWS<0> to DecWS<3> decode the 2-bit complementary signal pairs TD<2> and bTD<2> as well as TD<3> and bTD<3>, respectively, to output timing control signals BS<0> to BS<3> and bBS<0> to bBS<3>, respectively.

For example, when two input signals are "H", the decoder DecBS<j> changes the output signal BS<j> to "H", while changing the output signal bBS<j> to "L". That is, in the present example, the two input signals are "H" for only one of the four decoders DecBS<0> to DecBS<3>. Accordingly, for only one of the four complementary signal pairs BS<j> and bBS<j>, BS<j>="H" and bBS<j>="L". For the remaining three complementary signal pairs, BS<j>="L" and bBS<j>="H".

Figure 42:
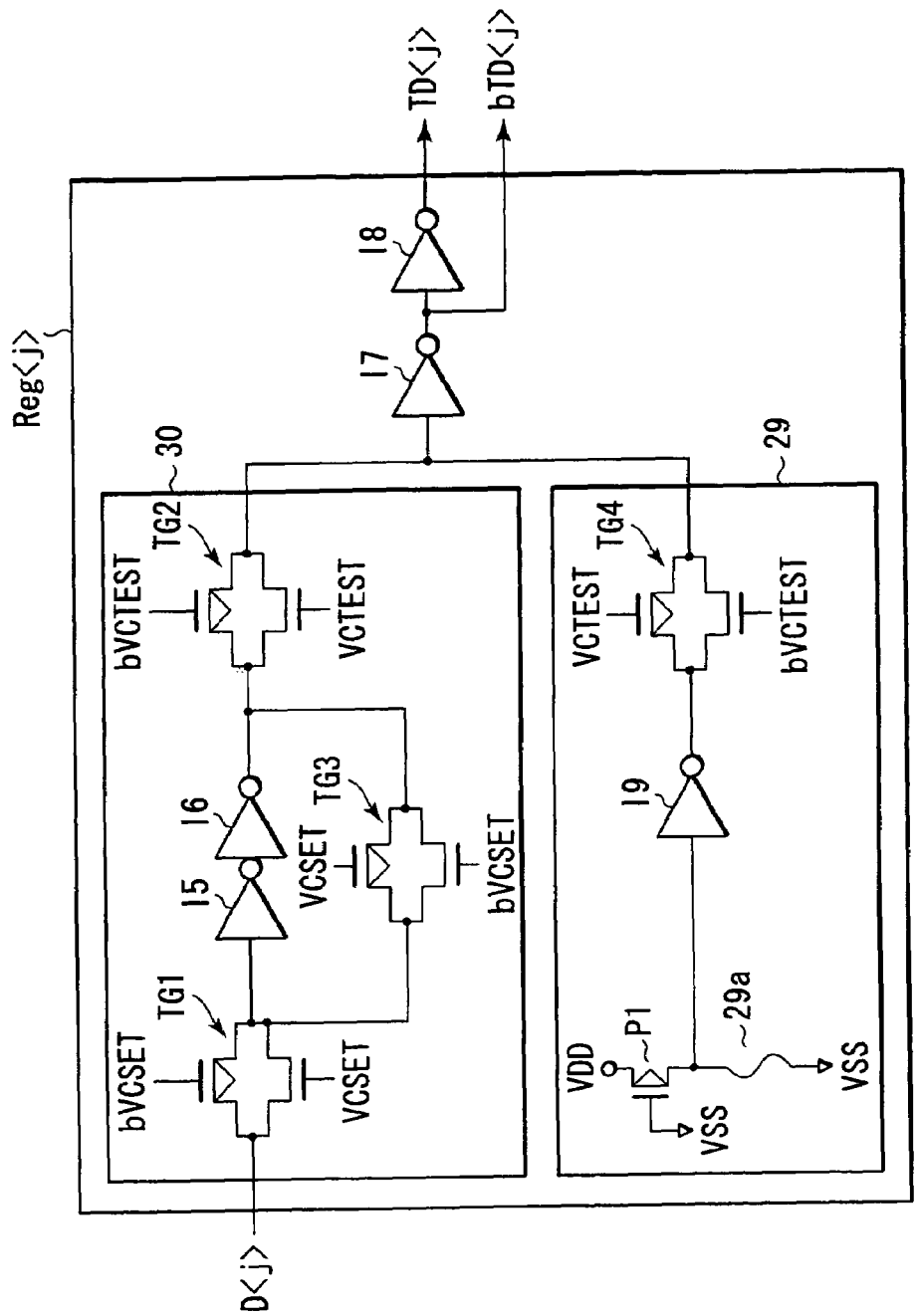
FIG. 42 is a circuit diagram showing an example of the configuration of a register in FIG. 41.

FIG. 42 shows an example of the configuration of an arbitrary register Reg<j> in FIG. 41.

The register Reg<j> is composed of a program data output circuit 29 that outputs signals TD<j> and bTD<j> on the basis of programmed setting data and an input data transfer circuit 30 that outputs signals TD<j> and bTD<j> on the basis of setting data input by equipment located outside the MRAM device.

The program data output circuit 29 has a laser blow fuse 29a used to store setting data. One bit data is stored depending on whether or not the laser blow fuse 29a is cut. A P channel MOS transistor P1 and the laser blow fuse 29a are connected in series between the power node VDD and the ground node VSS. A gate of the P channel MOS transistor P1 is connected to the ground node VSS. Accordingly, the P channel MOS transistor P1 is always on.

The connection between the P channel MOS transistor P1 and the laser blow fuse 29a is connected to an input end of an inverter I7 via a transfer gate TG4 and an inverter I9. The signal bTD<j> is output by the inverter I7, and the signal TD<j> is output by an inverter I8.

The input data transfer circuit 30 is composed of transfer gates TG1 to TG3 and inverters I5 and I6. The inverters I5 and I6 and the transfer gate TG3 constitute a latch circuit.

For a write operation in a normal operation mode, a test signal VCTEST changes to "L", while a test signal bVCTEST changes to "H". At this time, the transfer gate TG4 is turned on, while the transfer gate TG2 is turned off.

Consequently, the setting data programmed in the laser blow fuse 29a is output as the signals TD<j> and bTD<j> via the transfer gate TG4 and the inverters I7 to I9.

For a write operation in the test mode, the test signal VCTEST changes to "H", while the test signal bVCTEST changes to "L". At this time, the transfer gate TG2 is turned on, while the transfer gate TG4 is turned off.

Consequently, setting data D<j> is output via the transfer gate G2 and the inverters I7 to I9 as the signals TD<j> and bTD<j>, the setting data D(j) having been input to an external terminal composed of a data I/O terminal or an address terminal and latched in the latch circuit composed of the transfer gate TG3 and the inverters I5 and I6.

As the data used in the test mode, the setting data D<j> input through the external terminal is latched by setting signals VCSET and bVCSET in the latch circuit composed of the transfer gate TG3 and the inverters I5 and I6. Specifically, the setting signal VCSET changes to "H", while the setting signal bVCSET changes to "L", to turn on the transfer gate TG1, while turning off the transfer gate TG3. Then, the setting data D<j> can be input through the external terminal. Subsequently, the setting signal VCSET changes to "L", while the setting signal bVCSET changes to "H", to turn off the transfer gate TG1, while turning on the transfer gate TG3. Then, the setting data D<j> input through the external terminal is latched in the latch circuit composed of the transfer gate TG3 and the inverters I5 and I6. Subsequently, write tests can be carried out on the basis of the setting data latched in the latch circuit.

Instead of the laser blow fuse 29a, the storage element storing setting data may be composed of, for example, an MTJ element that stores data on the basis of a magnetization state or an MTJ element as an anti-fuse which stores data depending on whether or not the tunnel barrier is dielectrically broken down.

Figure 43:
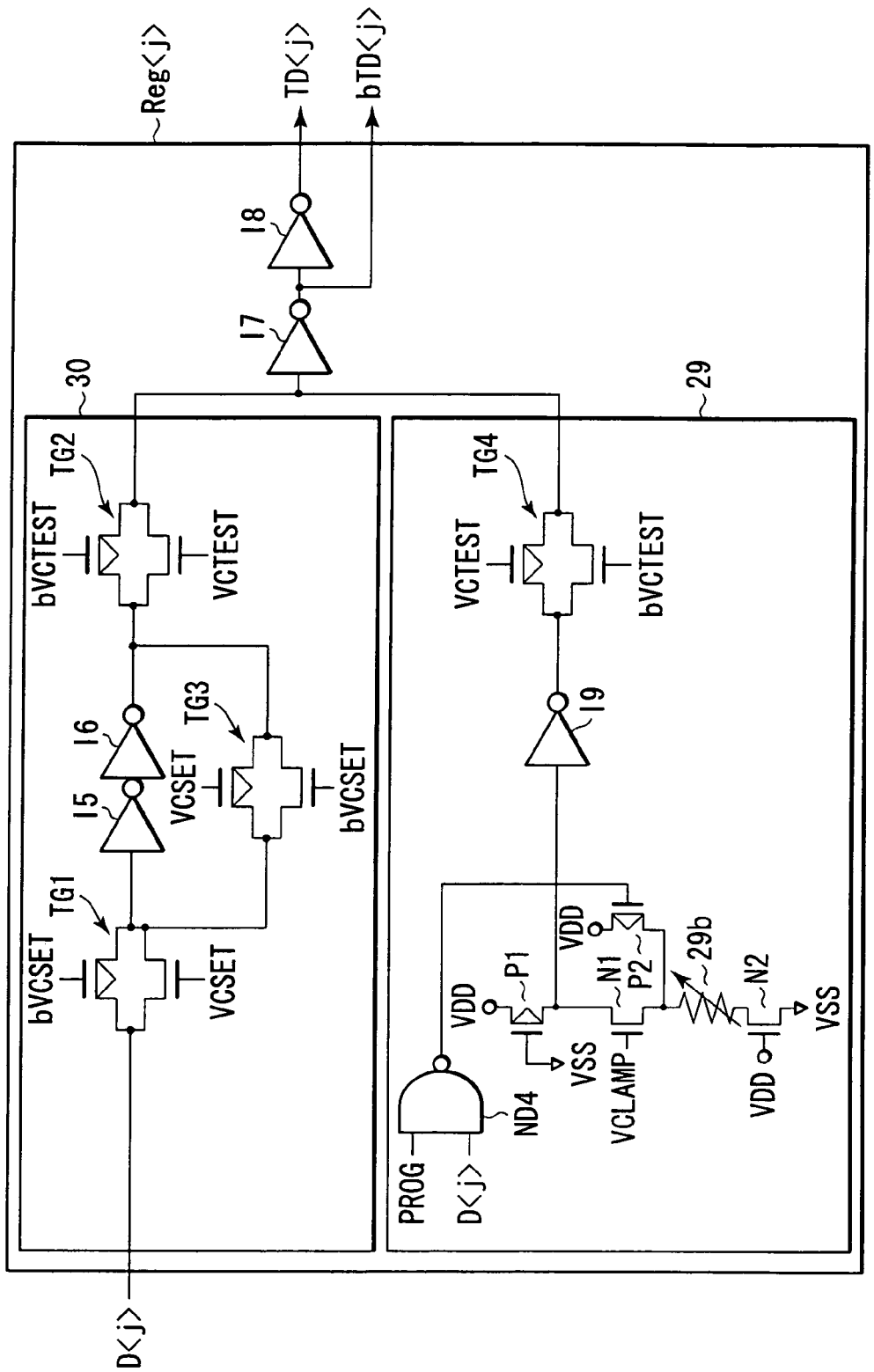
FIG. 43 is a circuit diagram showing another example of the configuration of the register in FIG. 41.

FIG. 43 shows another example of a circuit in the register Reg<j> in FIG. 41.

Compared to the register Reg<j> in FIG. 42, the register Reg<j> in the present example is characterized by the configuration of the program data output circuit 29. Specifically, in the register Reg<j> in FIG. 42, the laser blow fuse 29a is used as an element that stores setting data. However, in the register Reg<j> in the present example, an MTJ element 29b is used as an element that stores setting data.

The program data output circuit 29 has the MTJ element 29b that stores setting data. In this case, setting data can be stored in the MTJ element 29b on the basis of its magnetization state, i.e. the relationship between the direction of the magnetization in the fixed layer and the direction of the magnetization in the recording layer (parallel or anti-parallel). The present example uses a method of programming setting data in the MTJ element 29b, which stores setting data, depending on whether or not the tunnel barrier is dielectrically broken down rather than on the basis of the relationship between the direction of the magnetization in the fixed layer and the direction of the magnetization in the recording layer.

This is because the value of setting data need not be rewritten after having been written in the MTJ element. Setting data can be almost permanently stored by the setting data programming method utilizing the dielectric breakdown of the MTJ element.

One end of the MTJ element 29b is connected to the power node VDD via the P channel MOS transistor P1 and an N channel MOS transistor N1. The other end of the MTJ element 29b is connected to the ground node VSS via an N channel MOS transistor N2.

The gate of the P channel MOS transistor P1 is connected to the ground node VSS. A gate of the N channel MOS transistor N2 is connected to the power node VDD. Accordingly, these MOS transistors P1 and N2 are always on.

The connection between the P channel MOS transistor P1 and the N channel MOS transistor N1 is connected to the input end of an inverter I7 via the inverter I9 and the transfer gate TG4. The signal bTD<j> is output by the inverter I7, and the signal TD<j> is output by the inverter I8.

A clamp potential Vclamp is input to the gate of the N channel MOS transistor N1. By setting an appropriate value for the clamp potential Vclamp, it is possible to prevent a high voltage from being applied between electrodes of the MTJ element while setting data is being read.

Figure 44:
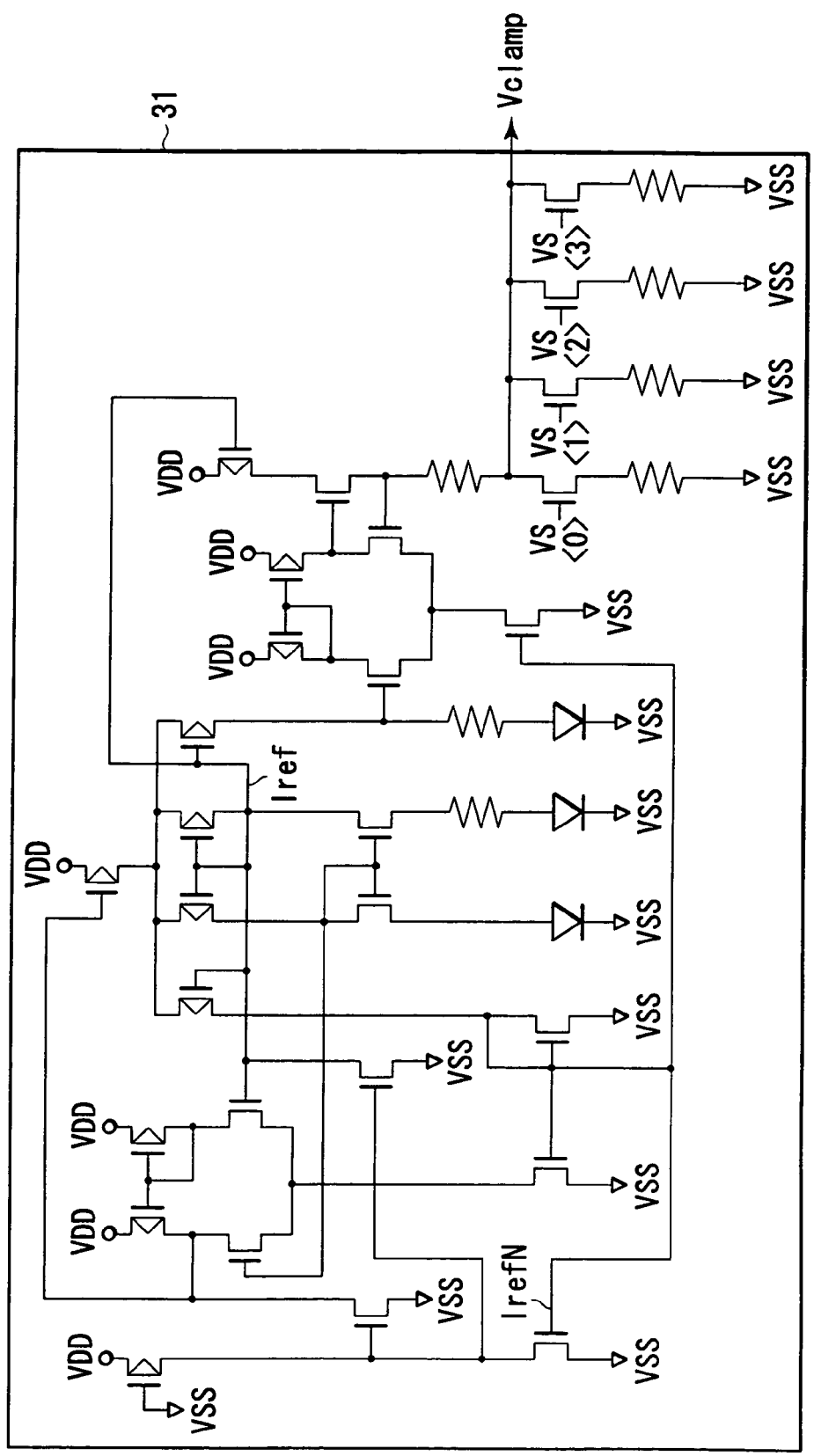
FIG. 44 is a circuit diagram of a clamp potential generating circuit in FIG. 43 which generates a clamp potential.

FIG. 44 shows an example of a potential generating circuit 31 that generates a clamp potential Vclamp, shown in FIG. 43.

The potential generating circuit 31 in the present example obtains the clamp voltage Vclamp by subjecting an output voltage from a BGR circuit to resistance division. The clamp voltage Vclamp has a value of 0.3 to 0.5 V.

The NAND gate circuit ND4 and P channel MOS transistor P2 in FIG. 43 are required to use the setting data programming method utilizing the dielectric breakdown of the MTJ element.

When setting data is programmed, a program signal PROG changes to "H". To write setting data "1" in the MTJ element, "1" (="H") is input, as the setting data D<j>, through the external terminal composed of a data I/O terminal, an address terminal, an exclusive terminal, or the like.

At this time, an output signal from the NAND gate circuit ND4 changes to "L" to turn on the P channel MOS transistor P2. Accordingly, a high voltage is applied across the MTJ element to destroy the tunnel barrier in the MTJ element. As a result, setting data "1" is programmed in the MTJ element. In this case, TD<j> changes to "L", while bTD<j> changes to "H".

On the other hand, to write setting write setting data "0" in the MTJ element, "0" (="L") is input through the external terminal as the setting data D<j>.

At this time, the output signal from the NAND gate circuit ND4 changes to "H" to turn off the P channel MOS transistor P2. Accordingly, no high voltages are applied across the MTJ element, so that the tunnel barrier in the MTJ element is not destroyed. As a result, setting data "0" is programmed in the MTJ element. In this case, TD<j> changes to "H", while bTD<j> changes to "L".

Figure 45:
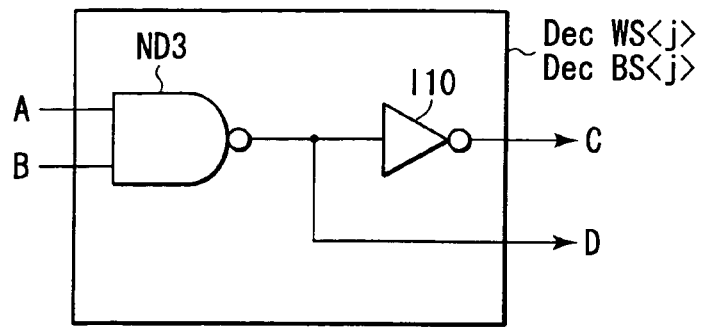
FIG. 45 is a circuit diagram showing an example of the configuration of a decoder in a setting circuit in FIG. 41.

FIG. 45 shows an example of a circuit in the decoder DecWS<j> or DecBS<j> in the setting circuit 23 in FIG. 41.

This decoder is composed of the NAND gate circuit ND3 and an inverter I10. Two input signals A and B are input to the NAND gate circuit ND3. An output signal from the NAND gate circuit ND3 is input to the inverter 110. An output signal C from the inverter I10 becomes the signal WS<j> or BS<j>. An output signal from the NAND gate circuit ND3 becomes the inverted output signal bWS<j> or bBS<j>.

Table 1 shows the relationships between input signals and output signals for the decoders DecWS<j> and DecBS<j>.

TABLE 1

| Input signal | | Output signal | |
|---|---|---|---|
| bTD<0> | bTD<1> | WS<0> | bWS<0> |
| TD<0> | bTD<1> | WS<1> | bWS<1> |
| bTD<0> | TD<1> | WS<2> | bWS<2> |
| TD<0> | TD<1> | WS<3> | bWS<3> |
| bTD<2> | bTD<3> | BS<0> | bBS<0> |
| TD<2> | bTD<3> | BS<1> | bBS<1> |
| bTD<2> | TD<3> | BS<2> | bBS<2> |
| TD<2> | TD<3> | BS<3> | bBS<3> |

When the delay times in the delay circuits DWS<0> to DWS<3> and DBS<0> to DBS<3> in FIGS. 39 and 40 are dependent on temperature as in the case with the delay circuits A and B in the previously described first embodiment, the pulse width of the pulse-like current can be made independent of temperature or made to have a desired temperature dependence.

Figure 46:
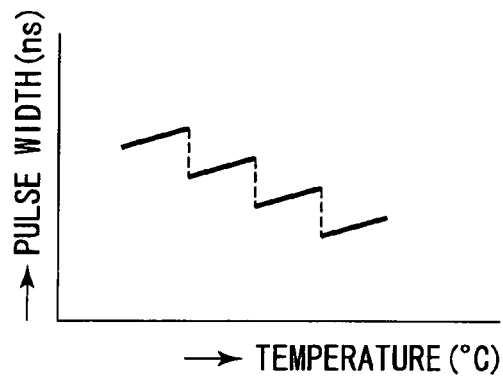
FIG. 46 is a characteristic diagram showing the relationship between the temperature and pulse width observed if delay circuits composed of CMOS inverters are used as the delay circuits in the trigger circuit in FIGS. 39 and 40.

FIG. 46 is a characteristic diagram showing an example of the relationship between the temperature and output pulse width observed if a delay circuit composed of CMOS inverters are used as each of the delay circuits DWS<0> to DWS<3> and DBS<0> to DBS<3> in FIGS. 39 and 40.

Figure 47:
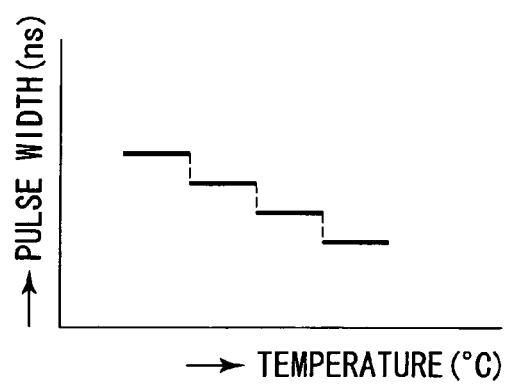
FIG. 47 is a characteristic diagram showing the relationship between the temperature and pulse width observed if the current control type delay circuit in FIG. 13 controlled by the current control input source in FIG. 14 is used as each of the delay circuits in the trigger circuit in FIGS. 39 and 40.

FIG. 47 is a characteristic diagram showing an example of the relationship between the temperature and output pulse width observed if the current control type delay circuit in FIG. 13, controlled by a current output by the current source circuit in FIG. 14, is used as each of the delay circuits DWS<0> to DWS<3> and DBS<0> to DBS<3> in FIGS. 39 and 40.

Figure 48:
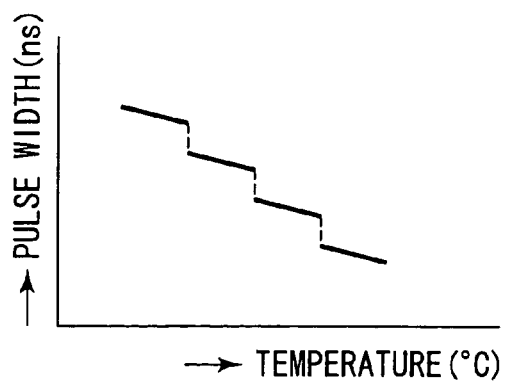
FIG. 48 is a characteristic diagram showing the relationship between the temperature and pulse width observed if the current control type delay circuit in FIG. 13 controlled by the current control input source in FIG. 16 is used as each of the delay circuits in the trigger circuit in FIGS. 39 and 40.

FIG. 48 is a characteristic diagram showing an example of the relationship between the temperature and output pulse width observed if the current control type delay circuit in FIG. 13, controlled by a current output by the current source circuit in FIG. 16, is used as each of the delay circuits DWS<0> to DWS<3> and DBS<0> to DBS<3> in FIGS. 39 and 40.

Now, description will be given of an example of a current control type delay circuit for which a delay time double that in the delay circuit described in the first embodiment can be set, the current control type delay circuit being used as each of the delay circuits DWS<0> to DWS<3> and DBS<0> to DBS<3> in FIGS. 39 and 40.

Figure 49:
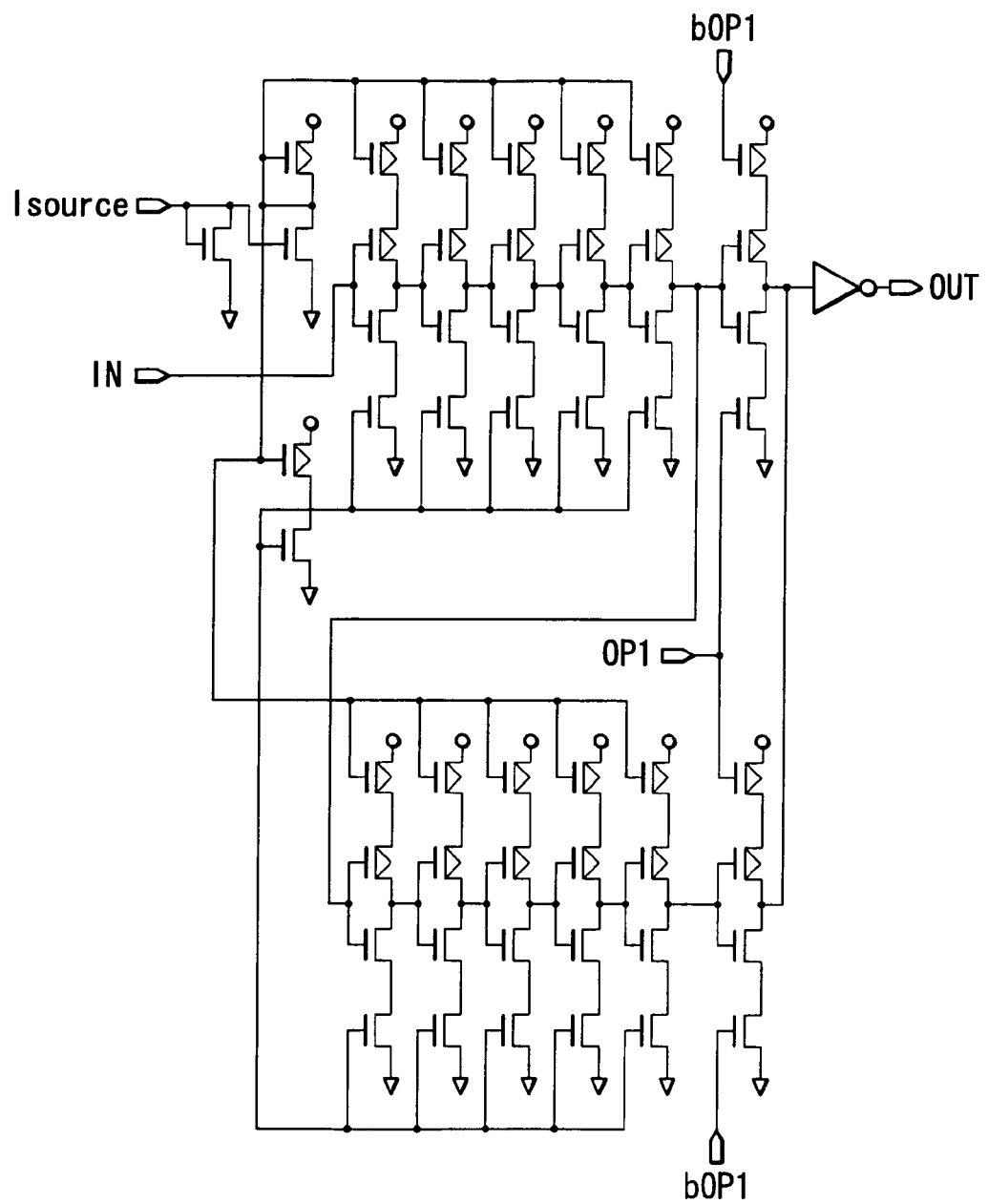
FIG. 49 is a circuit diagram showing an example of the configuration of a current control type delay circuit that can be used as each of the delay circuits in the trigger circuit in FIGS. 39 and 40.

The current control type delay circuit shown in FIG. 49 differs from the current control type delay circuit previously described with reference to FIG. 13 in that two signal propagating circuits are provided and cascaded together and that complementary selection control signals OP1/bOP1 selectively switch an output from the first signal propagating circuit and an output from the succeeding signal propagating circuit.

The signals OP1/bOP1 are output signals from the register Reg<j> in the setting circuit 23 or are obtained by decoding these output signals.

Now, description will be given of a current source circuit which can be used to supply a current to the current control type delay circuit shown in FIG. 13 or 49 and which can adjust the amount of current and the temperature dependence.

Figure 50:
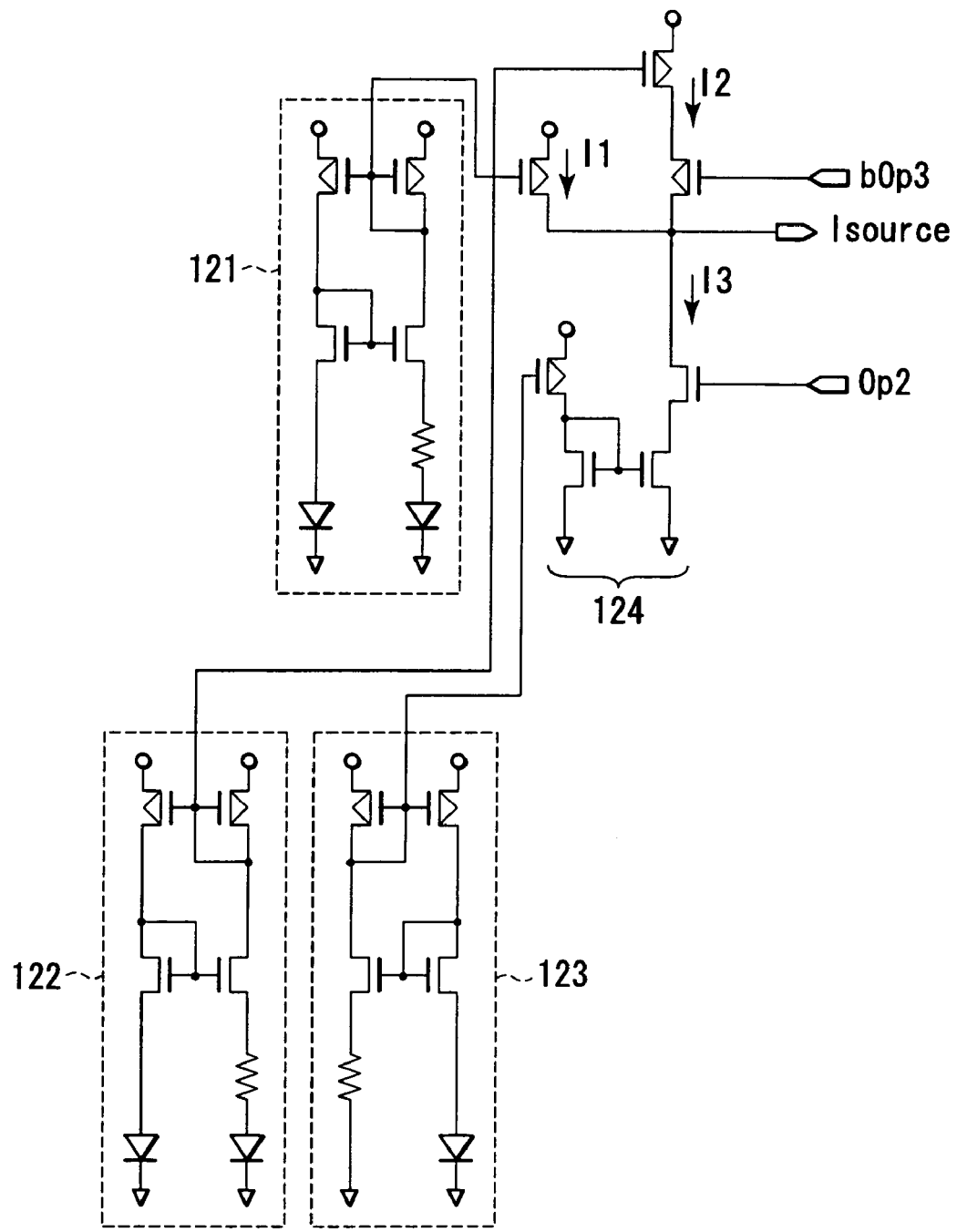
FIG. 50 is a circuit diagram showing an example of the configuration of a current source circuit that supplies an input current to the delay circuit shown in FIG. 13 or 49.

FIG. 50 shows an example of a current source circuit that can adjust the amount of current and the temperature dependence.

This current source circuit is composed of the first current source 121 and second current source 122 each of which provides a current having a value increasing in proportion to temperature, the third current source 123 that provides a current having a value decreasing in proportion to temperature, and the combinatorial circuit 124 that can switch combinations of outputs from the above three current sources in accordance with selection control signals OP2 and bOP3.

When the signals OP2 and bOP3 are at the "L" and "H" levels, respectively, the combinatorial circuit 124 outputs the current I1 obtained by copying the current through the first current source 121. On the other hand, when the signals OP2 and bOP3 are both at the "L" level, the combinatorial circuit 124 adds the current I2 obtained by copying the current through the second current source 122 to the current I1 obtained by copying the current through the first current source 121, and then outputs the synthetic current (I1+I2). On the other hand, when the signals OP2 and bOP3 are both at the "H" level, the combinatorial circuit 124 subtracts the current I3 obtained by copying the current through the third current source 123, from the current I1 obtained by copying the current through the first current source 121, and then outputs the resultant current (I1−I3). On the other hand, when the signals OP2 and bOP3 are at the "H" and "L" levels, respectively, the combinatorial circuit 124 adds the current I2 obtained by copying the current through the second current source 122 to the current I1 obtained by copying the current through the first current source 121, then subtracts the current I3 obtained by copying the current through the third current source 123, from the synthetic current, and finally outputs the resultant current (I1+I2−I3).

Figure 51:
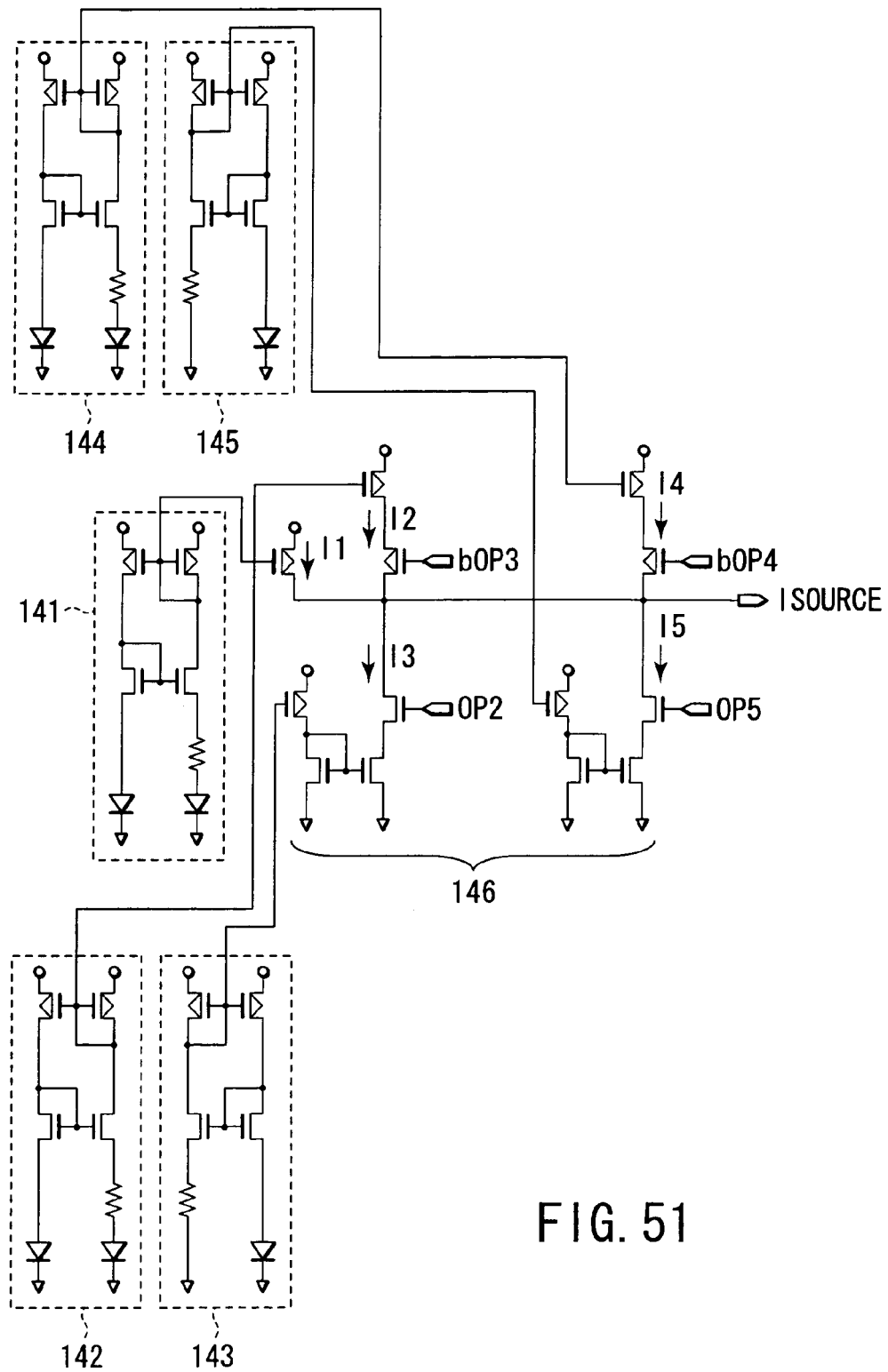
FIG. 51 is a circuit diagram showing another example of the configuration of the current source circuit that supplies an input current to the delay circuit shown in FIG. 13 or 49.

FIG. 51 shows an example of a current source circuit which can adjust the amount of current and the temperature dependence but which is different from the current source circuit shown in FIG. 50.

This current source circuit is composed of a first current source 141, a second current source 142, and a fourth current source 144 each of which provides a current having a value increasing in proportion to temperature, a third current source 143 and a fifth current source 145 each of which provides a current having a value decreasing in proportion to temperature, and a combinatorial circuit 146 that can switch combinations of outputs from the above five current sources in accordance with selection control signals OP2, bOP3, bOp4, and OP5.

When the signals OP2, bOP3, bOP4, and OP5 are at the "L", "H", "H", and "L" levels, respectively, the combinatorial circuit 146 outputs a current I1 obtained by copying a current through the first current source 141. On the other hand, when the signal OP2 is at the "H" level, the combinatorial circuit 146 reduces a current I3 obtained by copying a current through the third current source 143, from the current I1. On the other hand, when the signal bOP3 is at the "L" level, the combinatorial circuit 146 adds a current I2 obtained by copying a current through the second current source 142, to the current I1. On the other hand, when the signal bOP4 is at the "L" level, the combinatorial circuit 146 adds a current I4 obtained by copying a current through the fourth current source 144, to the current I1. On the other hand, when the signal OP5 is at the "H" level, the combinatorial circuit 146 reduces a current I5 obtained by copying a current through the fifth current source 145, from the current I1.

Seventh Embodiment

An MRAM device according to a seventh embodiment enables the pulse width of a write current and its temperature dependence to be adjusted in programmably setting the magnitude of a current through the write word line/bit line and a temporal variation in the magnitude (current waveform).

Figure 52:
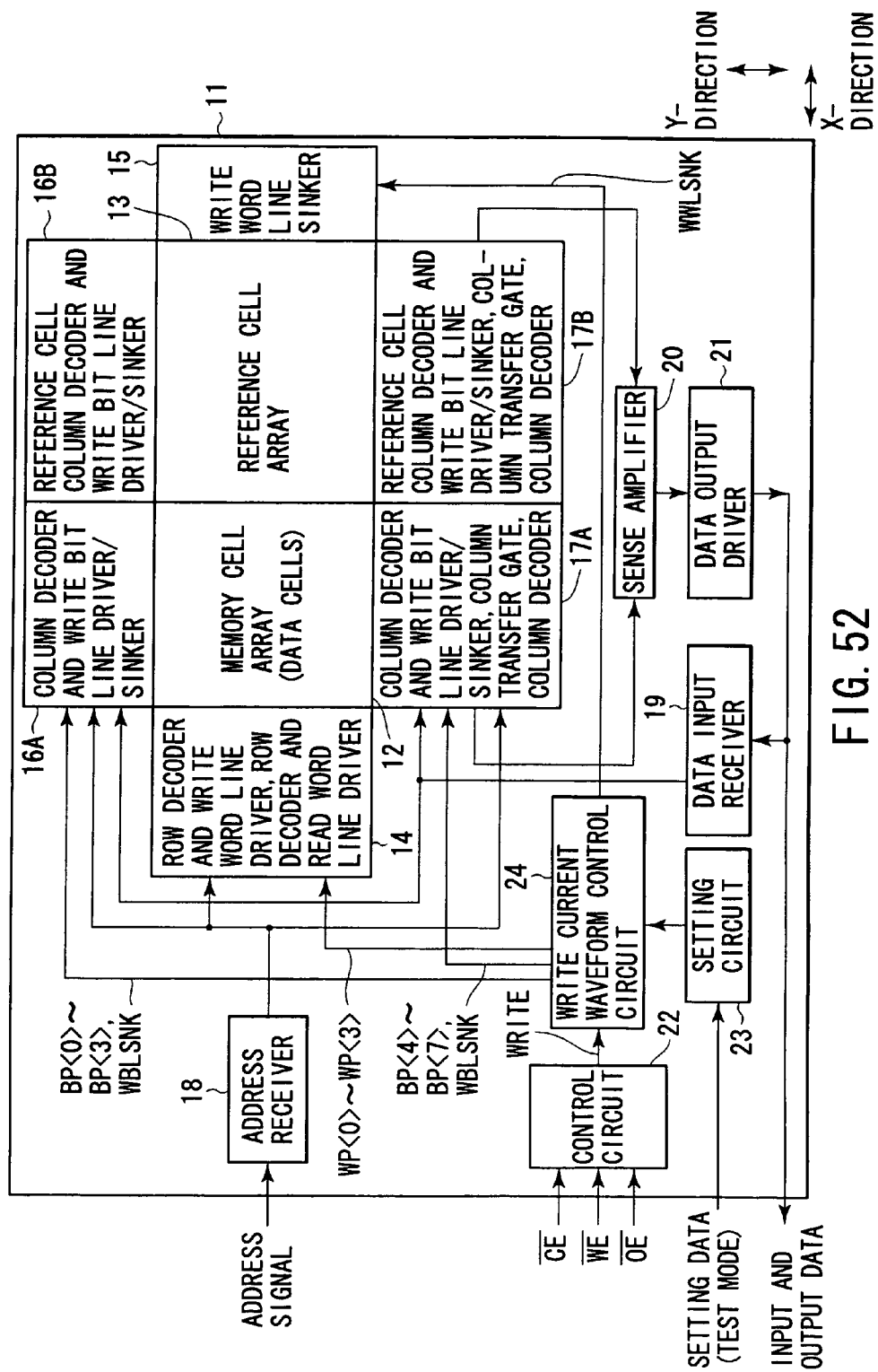
FIG. 52 is a block diagram showing the whole configuration of an MRAM device according to a seventh embodiment of the present invention.

FIG. 52 shows the whole configuration of the MRAM device according to the seventh embodiment.

This MRAM device is the same as the MRAM device according to the previously described sixth embodiment except for the (1) functions of the setting circuit 23 and the (2) functions of the write current waveform control circuit 24. Accordingly, those components which correspond to FIG. 37 are denoted by the same reference numerals. Their description is omitted.

The write current waveform control circuit 24, provided in the MRAM device in FIG. 52, has a function of receiving the write signal WRITE to determine the timings for starting and ending the supply of a write current as well as the magnitude of the write current and its temporal variation (current waveform), on the basis of the setting data already programmed in the setting circuit 23.

Specifically, for a write operation, write word line drive signals (current waveform generation signals) WP<0> to WP<3> are provided to the row decoder and driver 14, and the write word line sink signal WWLSNK is provided to the write word line sinker 15. Furthermore, write bit line drive signals (current waveform generation signals) BP<0> to BP<7> and the write bit line sink signal WBLSNK are provided to the column decoder and write bit line drivers/sinkers 16A and 17A.

During a write operation, for example, the row decoder and driver 14 is operative when at least one of the write word line drive signals WP<0> to WP<3> is "H". Likewise, the write word line sinker 15 and the column decoder and write bit line drivers/sinkers 16A and 17A are operative when the write word line sink signal WWLSNK, at least one of the write bit line drive signals BP<0> to BP<7>, and the write bit line sink signal WBLSNK, respectively, are "H".

It is thus possible to determine the timings for starting and ending the supply of a write current, i.e. the timings for applying the magnetic fields Hx and Hy, as well as the magnitude of the write current and a temporal variation in the magnitude (current waveform), by using the write current waveform control circuit 24 to control the timings for changing the write word line drive signals WP<0> to WP<3>, the write word line sink signal WWLSNK, the write bit line drive signals BP<0> to BP<7>, and the write bit line sink signal WBLSNK to "H".

For the timing for sinking a write current, the potential across the write word/bit line can be completely zeroed by, for example, changing the sink signals WWLSNK and WBLSNK from "H" to "L" after the drive signals WP<0> to WP<3> and BP<0> to BP<7> have changed from "H" to "L".

Description will be given below of examples of circuits in the write current waveform control circuit 24 and the drivers/sinkers 14, 15, 16A, and 17A, which receive signals from the write current waveform control circuit 24.

FIG. 53 shows an example of circuits in the row decoder and write word line driver 14/sinker 15 in FIG. 52.

One row of the row decoder and write word line driver 14 is composed of the AND gate circuit AD1, NAND gate circuits NDWP0 to NDWP3, and the P channel MOS transistors WP0 to WP3. A gate of the P channel MOS transistor WPi (i=0, 1, 2, 3) is connected to an output terminal of the NAND gate circuit NDWPi. Its source is connected to the power node VDD. Its drain is connected to one end of the write word line WWLi (i=1, 2, 3, . . . ).

The write word line drive signal (current waveform generation signal) WP<i> is input to one of the two input terminals of the NAND gate circuit NDWPi. An output signal from the AND gate circuit AD1 is input to the other input terminal. A row address signal (varying with rows i) composed of a plurality of bits is input to the AND gate circuit AD1. The row address signal varies with the rows i.

One row of the write word line sinker 15 is composed of the N channel MOS transistor TN1. A source of the N channel MOS transistor TN1 is connected to the ground terminal VSS. Its drain is connected to the other end of the write word line WWLi. The write word line sink signal WWLSNK signal is input to a gate of the N channel MOS transistor TN1.

For the selected row i, all the bits of the row address signal change to "H". Thus, for the selected row i, when at least one of the write word line drive signals WP<0> to WP<3> changes to "H", at least one of the P channel MOS transistors WP0 to WP3 is turned on. On the other hand, when the write word line sink signal WWLSNK changes to "H", the N channel MOS transistors TN1 is turned on.

When at least one of the P channel MOS transistors WP0 to WP3 and the N channel MOS transistor TN1 are turned on, a write current flows from the row decoder and write word line driver 14 to the write word line sinker 15 via the write word line WWLi.

According to such a row decoder and write word line driver/sinker, by controlling the timing for changing the write word line drive signals WP<0> to WP<3> and the write word line sink signal WWLSNK from "H" to "L", it is possible to determine the timings for starting and ending the supply of a write current to the write word line WWLi in the selected row i as well as the magnitude of the write current and a temporal variation in the magnitude (current waveform).

Further, by setting all the write word line drive signals WP<0> to WP<3> to "L" and then setting the write word line sink signal WWLSNK to "L", the potential across the write word line WWLi can be completely zeroed after a write operation. To control the magnitude of a write current or its temporal variation (current waveform), the methods described below can be used. First, this value can be controlled by setting the sizes of the plurality of P channel MOS transistors WP0 to WP3, e.g. their channel widths, in other words, their driving capabilities to the same value and using the write word line drive signals WP<0> to WP<3> to change the number of those of the P channel MOS transistors WP0 to WP3 which are to be turned on.

Second, this value can be controlled by setting the sizes of the plurality of P channel MOS transistors WP0 to WP3, e.g. their channel widths, in other words, their driving capabilities to different values and using the write word line drive signals WP<0> to WP<3> to turn on one of the P channel MOS transistors WP0 to WP3 selectively.

Third, a temporal variation in the magnitude of a write current (current waveform) can be controlled by combining the above first and second control methods, i.e. setting the sizes of the P channel MOS transistors WP0 to WP3 to different values and changing the number of P channel MOS transistors WP0 to WP3 to be turned on.

Figure 54:
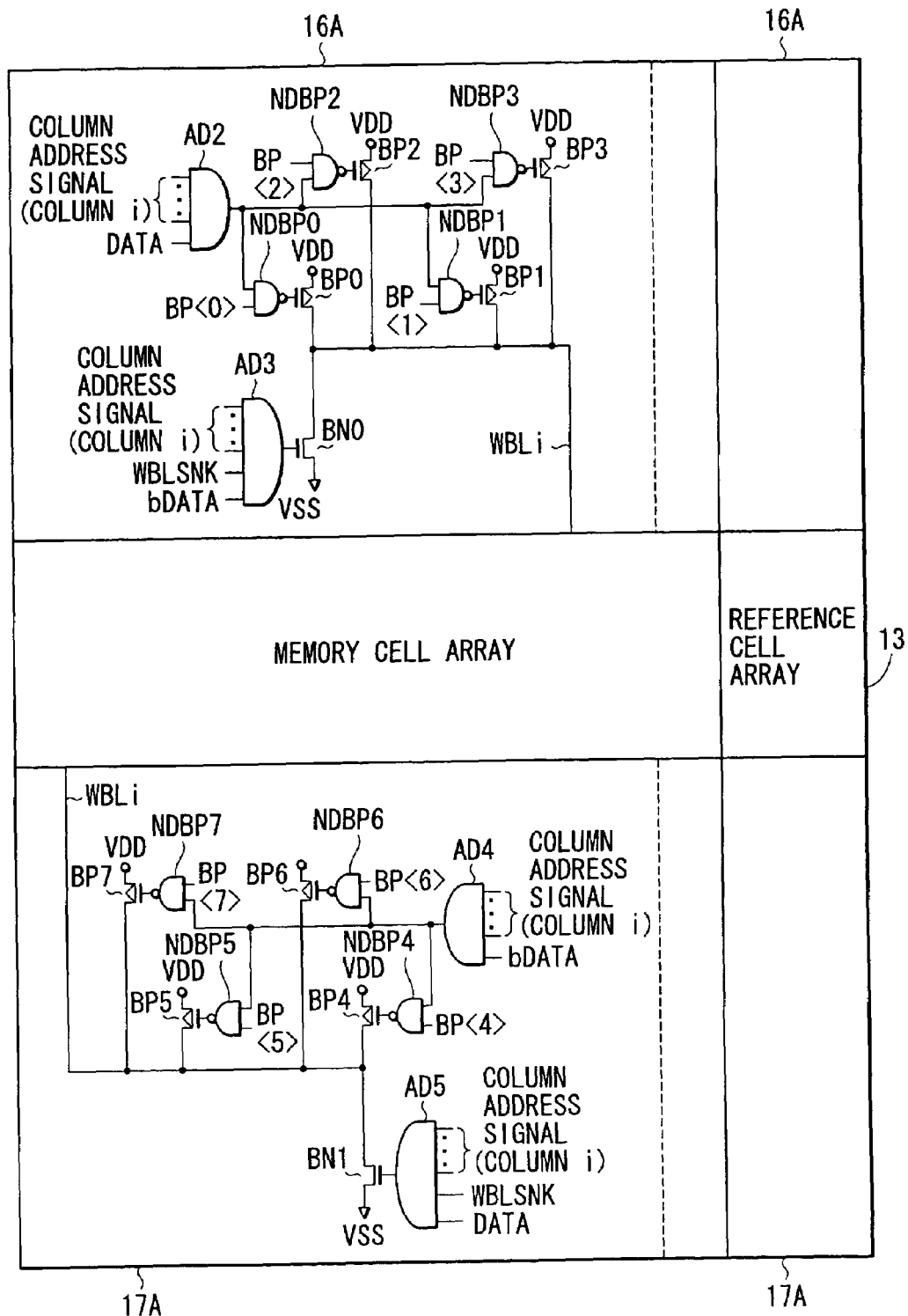
FIG. 54 is a circuit diagram of a column decoder and write bit line driver/sinker in FIG. 52.

FIG. 54 shows an example of circuits in the column decoder and write bit line drivers/sinkers 16A and 17A in FIG. 52.

One column of the column decoder and write bit line driver/sinker 16A is composed of NAND gate circuits NDBP0 to NDBP3, the AND gate circuits AD2 and AD3, the P channel MOS transistors BP0 to BP3, and the N channel MOS transistor BN0.

A gate of the P channel MOS transistor BPi (i=0, 1, 2, 3) is connected to an output terminal of the NAND gate circuit NDBPi. Its source is connected to the power node VDD. Its drain is connected to one end of the write bit line WBLi (i=1, 2, 3, ... ).

The write word line drive signal (current waveform generation signal) BP<i> is input to one of the two input terminals of the NAND gate circuit NDBPi. An output signal from the AND gate circuit AD2 is input to the other input terminal. A column address signal composed of a plurality of bits and write data DATA are input to the AND gate circuit AD2. The column address signal varies with columns i.

Similarly, one column of the column decoder and write bit line driver/sinker 17A is composed of NAND gate circuits NDBP4 to NDBP7, AND gate circuits AD4 and AD5, P channel MOS transistors BP4 to BP7, and the N channel MOS transistor BN1.

A gate of the P channel MOS transistor BPi (i=4, 5, 6, 7) is connected to the output terminal of the NAND gate circuit NDBPi. Its source is connected to the power node VDD. The drains of all the P channel MOS transistors BPi are connected to the other end of the write bit line WBLi (i=1, 2, 3, ... ).

The write word line drive signal (current waveform generation signal) BP<i> is input to one of the two input terminals of the NAND gate circuit NDBPi (i=4, 5, 6, 7). An output signal from the AND gate circuit AD4 is input to the other input terminal. A column address signal composed of a plurality of bits and an inversion data bDATA of the write data are input to the AND gate circuit AD2. The column address signal varies with the columns i.

A gate of the N channel MOS transistor BN1 is connected to an output terminal of the AND gate circuit AD5. Its source is connected to the ground node VSS. Its drain is connected to the other end of the write bit line WBLi (i=1, 2, 3, ... ). A column address signal composed of a plurality of bits, the write bit line sink signal WBLSNK, and the write data DATA are input to the AND gate circuit AD5. The column address signal varies with the columns i.

For the selected column i, all the bits of the column address signal change to "H". Thus, for the selected column i, when at least one of the write bit line drive signals BP<0> to BP<7> and the write bit line sink signal change to "H", a write current oriented in accordance with the value of the write data DATA flows through the write bit line WBLi.

For example, when the write data DATA is "1" (="H"), at least one of the P channel MOS transistors BP0 to BP3 and the N channel transistor BN1 are turned on. Accordingly, a write current flows from the column decoder and write bit line driver/sinker 16A to the column decoder and write bit line driver/sinker 17A.

On the other hand, when the write data DATA is "0" (="L"), at least one of the P channel MOS transistors BP4 to BP7 and the N channel transistor BN0 are turned on. Accordingly, a write current flows from the column decoder and write bit line driver/sinker 17A to the column decoder and write bit line driver/sinker 16A.

According to such column decoder and write bit line drivers/sinkers, by controlling the timing for changing at least one of the write bit line drive signals BP<0> to BP<7> and the write bit line sink signal WBLSNK from "H" to "L", it is possible to determine the timings for starting and ending the supply of a write current to the write bit line WBLi in the selected column i as well as the magnitude of the write current and a temporal variation in the magnitude (current waveform).

Further, by setting all the write bit line drive signals BP<0> to BP<3> to "L" and then setting the write bit line sink signal WBLSNK to "L", the potential across the write bit line WBLi can be completely zeroed after a write operation.

To control the magnitude of a write current or its temporal variation (current waveform), the methods described below can be used. First, this value can be controlled by setting the sizes of the plurality of P channel MOS transistors BP0 to BP7, e.g. their channel widths, in other words, their driving capabilities to the same value and using the write bit line drive signals BP<0> to BP<7> to change the number of those of the P channel MOS transistors BP0 to BP7 which are to be turned on.

Second, this value can be controlled by setting the sizes of the plurality of P channel MOS transistors BP0 to BP7, e.g. their channel widths, in other words, their driving capabilities to different values and using the write bit line drive signals BP<0> to BP<7> to turn on one of the P channel MOS transistors BP0 to BP7 selectively.

Third, a temporal variation in the magnitude of a write current (current waveform) can be controlled by combining the above first and second control methods, i.e. setting the sizes of the P channel MOS transistors BP0 to BP7 to different values and changing the number of P channel MOS transistors BP0 to BP7 to be turned on.

Now, description will be given of an example of the write current waveform control circuit that generates write word line drive signals WP<0> to WP<3>, a write word line sink signal WWLSNK, write bit line drive signals BP<0> to BP<7>, and a write bit line sink signal WBLSNK.

Figure 55:
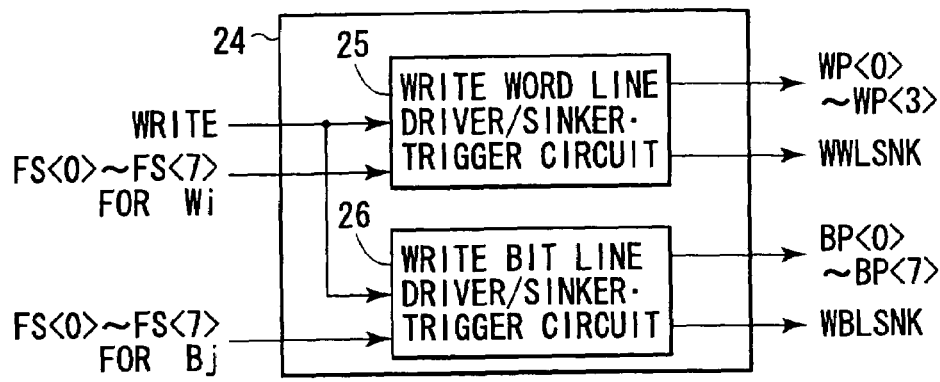
FIG. 55 is a circuit diagram showing an example of a write current waveform control circuit in FIG. 52.

FIG. 55 shows an example of the write current waveform control circuit 24 in FIG. 52.

The write current waveform control circuit 24 is composed of the write word line driver/sinker trigger circuit 25 and the write bit line driver/sinker trigger circuit 26.

The write word line driver/sinker trigger circuit 25 generates write word line drive signals (current waveform generation signals) WP<0> to WP<3> and a write word line sink signal WWLSNK on the basis of the write signal WRITE and current waveform control signals FS<0> to FS<7> FOR Wi (i=0, 1, 2, 3).

The write bit line driver/sinker trigger circuit 26 generates write bit line drive signals (current waveform generation signals) BP<0> to BP<7> and a write bit line sink signal WBLSNK on the basis of the write signal WRITE and current waveform control signals FS<0>to FS<7> FOR Bj (j=0, 1, 2, 3).

Here, "FOR Wi" and "FOR Bj" in the current waveform control signals FS<0> to FS<7> FOR Wi and FS<0> to FS<7> FOR Bi mean that the values of the current waveform control signals FS<0> to FS<7> are set for each of a plurality of waveform generating circuits Wi and Bj provided in the write bit line driver/sinker trigger circuits 25 and 26, respectively, and described later.

The current waveform control signals FS<0> to FD<7> FOR Wi determine the timings for starting and ending the supply of a write current to the write word line WWLi as well as the magnitude of the write current and its temporal variation (current waveform), i.e. the timings for changing the write word line drive signals WP<0> to WP<3> and the write word line sink signal WWLSNK to "H" or "L".

The current waveform control signals FS<0> to FD<7> FOR Bj determine the timings for starting and ending the supply of a write current to the write bit line WBLi as well as the magnitude of the write current and its temporal variation (current waveform), i.e. the timings for changing the write bit line drive signals BP<0> to BP<7> and the write bit line sink signal WBLSNK to "H" or "L".

The setting circuit 23 generates current waveform control signals FS<0> to FS<7> FOR Wi and FS<0> to FS<7> FOR Bj.

Figure 56:
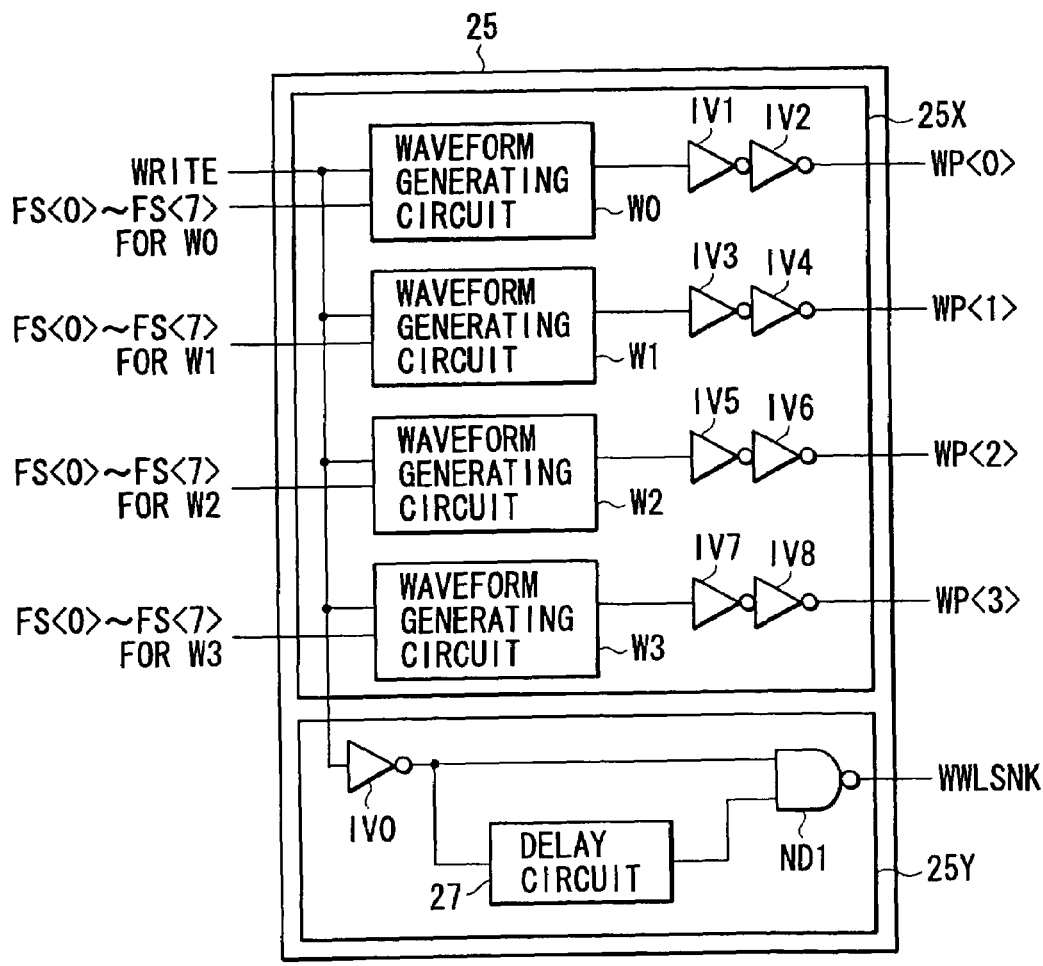
FIG. 56 is a circuit diagram of a write word line driver/sinker trigger circuit in FIG. 55.

FIG. 56 shows an example of the write word line driver/sinker trigger circuit 25 in FIG. 55.

The write word line driver/sinker trigger circuit 25 is composed of the current supply start/end timing determining circuit 25X that determines the timings for starting and ending the supply of a write current and the current sink timing determining circuit 25Y that determines the timing for sinking a write current.

The current supply start/end timing determining circuit 25X determines a timing for changing the write word line drive signals WP<0> to WP<3> to "H" or "L" after the write signal WRITE has changed to "H" or "L". The current supply start/end timing determining circuit 25X is composed of a plurality of, in the present example, four wave generating circuits W0 to W3 and inverters IV1 to IV8.

The wave generating circuits W0 to W3 generate write word line drive signals WP<0> to WP<3> on the basis of the write signal WRITE and the current waveform control signals FS<0> to FS<7> FOR Wi. Since the write word line drive signals WP<0> to WP<3> drive the write word line driver in FIG. 53, the waveform of a write current to the write word line WWLi is almost equal to a synthetic waveform obtained by synthesizing the waveforms of the write word line drive signals WP<0> to WP<3>.

In the present example, the four waveform generating circuits W0 to W3 are provided. However, the use of more waveform generating circuits enables the more precise control of the waveform of a current through the write word line WWLi.

The current sink timing determining circuit 25Y is composed of an inverter IV0, the NAND gate circuit ND1, and the delay circuit 27.

The current sink timing determining circuit 25Y changes the write word line sink signal WWLSNK to "H" at almost the same time when the write signal WRITE changes to "H" and then after a delay time determined by the delay circuit 27, changes the write word line sink signal WWLSNK to "L".

By thus changing the write signal WRITE to "L" and after a specified interval, changing the write word line sink signal WWLSNK to "L", the voltage across the write bit line WWLi can be completely zeroed after a write operation.

Figure 57:
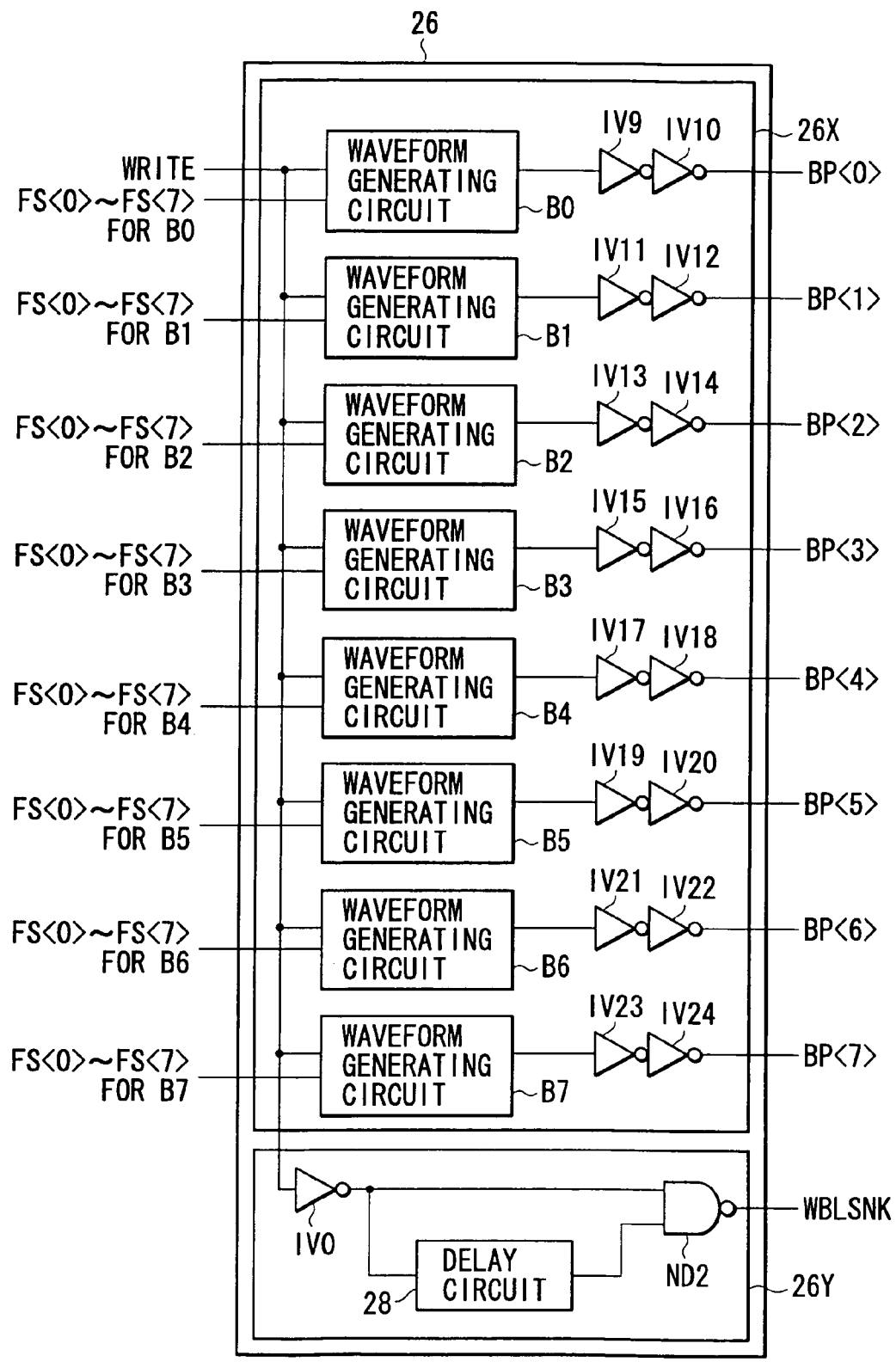
FIG. 57 is a circuit diagram of a write bit line driver/sinker trigger circuit in FIG. 55.

FIG. 57 shows an example of the write bit line driver/sinker trigger circuit 26 in FIG. 55.

The write bit line driver/sinker trigger circuit 26 is composed of the current supply start/end timing determining circuit 26X that determines the timings for starting and ending the supply of a write current and the current sink timing determining circuit 26Y that determines the timing for sinking a write current.

The current supply start/end timing determining circuit 26X determines a timing for changing the write bit line drive signals BP<0> to BP<7> to "H" or "L" after the write signal WRITE has changed to "H" or "L".

The current supply start/end timing determining circuit 26X is composed of a plurality of, in the present example, eight wave generating circuits B0 to B7 and inverters IV9 to IV24.

The wave generating circuits B0 to B7 generate write bit line drive signals BP<0> to BP<7> on the basis of the write signal WRITE and the current waveform control signals FS<0> to FS<7> FOR Bi. The write bit line drive signals BP<0> to BP<7> drive the write bit line driver in FIG. 54.

When the write data DATA is "1" (="H"), a write current flows from the write bit line driver/sinker 16A to the write bit line driver/sinker 17A. The waveform of this current is almost equal to a synthetic waveform obtained by synthesizing the waveforms of the write bit line drive signals BP<0> to BP<3>.

When the write data DATA is "0" (="L"), a write current flows from the write bit line driver/sinker 17A to the write bit line driver/sinker 16A. The waveform of this current is almost equal to a synthetic waveform obtained by synthesizing the waveforms of the write bit line drive signals BP<4> to BP<7>.

In the present example, the eight waveform generating circuits B0 to B7 are provided. However, the use of more waveform generating circuits enables the more precise control of the waveform of a current through the write bit line WBLi.

Furthermore, in the present example, the write bit line drive signals BP<0> to BP<3>, which drive the write bit line driver/sinker 16A, are different from the write bit line drive signals BP<4> to BP<7>, which drive the write bit line driver/sinker 17A. However, both the write bit drivers/sinkers 16A and 17A may be driven by the write bit line drive signals BP<0> to BP<3>.

The current sink timing determining circuit 26Y is composed of the inverter IV0, the NAND gate circuit ND2, and the delay circuit 28.

The current sink timing determining circuit 26Y changes the write bit line sink signal WBLSNK to "H" at almost the same time when the write signal WRITE changes to "H" and then after a delay time determined by the delay circuit 27, changes the write bit line sink signal WBLSNK to "L".

By thus changing the write signal WRITE to "L" and after a specified interval, changing the write bit line sink signal WBLSNK to "L", the voltage across the write bit line WBLi can be completely zeroed after a write operation.

Now, description will be given of an example of the waveform generating circuit Wi (i=0, 1, 2, 3) or Bj (j=0, 1, ..., 7) in the write word/bit line driver/sinker trigger circuit 25 or 26 in FIG. 56 or 57, respectively.

Figure 58:
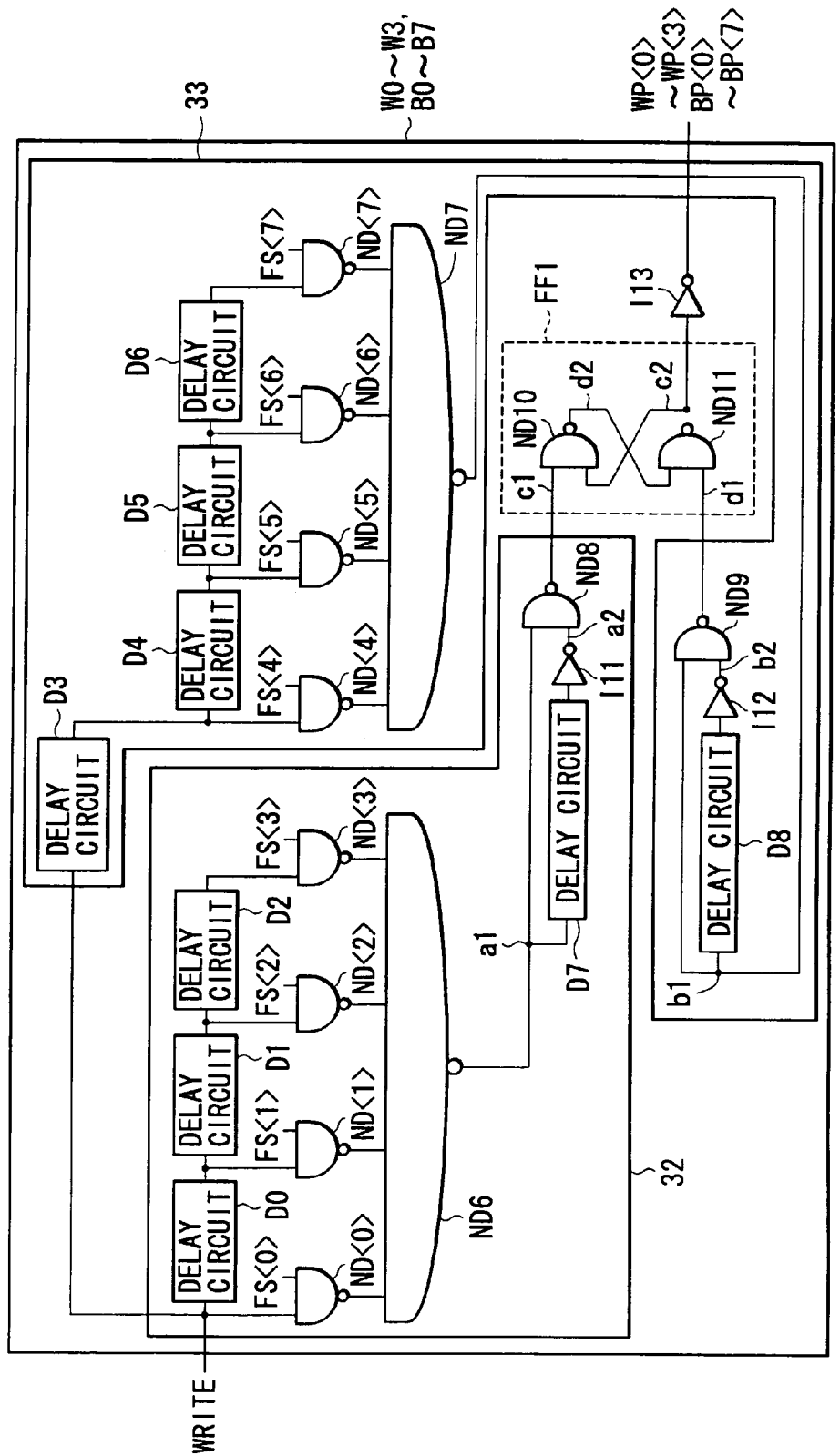
FIG. 58 is a circuit diagram of waveform generating circuits in FIGS. 56 and 57.

FIG. 58 shows an example of the waveform generating circuit Wi or Bj in FIG. 56 or 57, respectively.

Each of the waveform generating circuits W0 to W3 and B0 to B7 has a rise timing determining circuit 32 that determines a rising edge of a corresponding one of the write word/bit line drive signals WP<0> to WP<3> and BP<0> to <7>, i.e. the point in time when the signal changes from "L" to "H", and a fall timing determining circuit 33 that determines a falling edge of the corresponding one of the write word/bit line drive signals WP<0> to WP<3> and BP<0> to <7>, i.e. the point in time when the signal changes from "H" to "L".

Furthermore, each of the waveform generating circuits W0 to W3 and B0 to B7 has a flip flop circuit FF1 that retains the "L" or "H" level of a corresponding one of the write word/bit line drive signals WP<0> to WP<3> and BP<0> to <7> and an inverter circuit I13 that outputs an output signal from the flip flop circuit FF1 as the corresponding one of the write word/bit line drive signals WP<0> to WP<3> and BP<0> to <7>.

The rise timing determining circuit 32 is composed of delay circuits D0, D1, and D2 all of which are connected in series, NAND gate circuits ND<0> to ND<3>, ND6, and ND8, an inverter I11, and a delay circuit D7. The fall timing determining circuit 33 is composed of delay circuits D3, D3, D5, and D6 all of which are connected in series, NAND gate circuits ND<4> to ND<7>, ND7, and ND9, an inverter I12, and a delay circuit D8. The flip-flop circuit FF1 is composed of two NAND gate circuits ND10 and ND11.

The delay circuits D0 to D8 may have an identical circuit configuration or different circuit configurations. Furthermore, the delay times in the delay circuits D0 to D8 may be identical or different from one another. However, it is easier to control the waveform of a write current when the delay circuits D0 to D6 have the identical configuration and delay time.

When the delay time in the delay circuit D3 is longer than the sum of the delay times in the delay circuits D0 to D2, a timing for a rise in the write word/bit line drive signals WP<0> to WP<3> and BP<0> to BP<7> is determined when one of the current waveform control signals FS<0> to FS<3> changes to "H". On the other hand, a timing for a fall in the write word/bit line drive signals WP<0> to WP<3> and BP<0> to BP<7> is determined when one of the current waveform control signals FS<4> to FS<7> changes to "H".

Then, the rise timings for the write word/bit line drive signals WP<0> to WP<3> and BP<0> to BP<7> are determined by the setting of each current waveform control signals FS<0> to FS<3> for the write word/bit line drive signals WP<0> to WP<3> and BP<0> to BP<7>. On the other hand, the fall timings for the write word/bit line drive signals WP<0> to WP<3> and BP<0> to BP<7> are determined by the setting of each current waveform control signals FS<4> to FS<7> for the write word/bit line drive signals WP<0> to WP<3> and BP<0> to BP<7>.

Now, operations of the waveform generating circuit Wi or Bj will be specifically described.

First, initially, the write signal WRITE is "L", and the output signal WP<i> or BP<j> is "L".

Subsequently, the write signal WRITE changes to "H". After the delay time selected by the current waveform control signal FS<0> to FS<3> has elapsed, an output node a1 of the NAND gate circuit ND6 changes to "H". This delay time determines the rise timings for the write word line/bit line drive signal WP<i> or BP<j>.

For example, it is assumed that the current waveform control signal FS<0> is "H", while the current waveform control signals FS<1> to FS<3> are "L". Then, when the write signal WRITE changes to "H", the output node a1 of the NAND gate circuit ND6 changes immediately to "H". On the other hand, it is assumed that the current waveform control signal FS<1> is "H", while the current waveform control signals FS<0>, FS<2>, and FS<3> are "L". Then, when the write signal WRITE changes to "H", the output node a1 of the NAND gate circuit ND6 changes to "H" after the delay time in the delay circuit D0 has elapsed.

When the output node a1 of the NAND gate circuit ND6 changes to "H", an input node c1 of the flip-flop circuit FF1 changes from "H" to "L". Thus, an output node c2 of the flip-flop circuit FF1 changes to "L". Therefore, the output signal WP<i> or BP<j> from the waveform generating circuit Wi or Bj, respectively, changes to "H".

Subsequently, the delay time in the delay circuit D7 elapses. Then, an input node a2 of the NAND gate circuit ND8 changes to "L", whereas the input node c1 of the flip-flop circuit FF1 changes to "H". However, the output signal WP<i> or BP<j> from the waveform generating circuit Wi or Bj, respectively, remains "H".

Next, the write signal WRITE changes to "H", and then the delay time selected by the current waveform control signal FS<4> to FS<7> elapses. Then, an output node b1 of the NAND gate circuit ND7 changes to "H". This delay time determines the rise timings for the write word line/bit line drive signal WP<i> or BP<j>.

For example, it is assumed that the current waveform control signal FS<4> is "H", while the current waveform control signals FS<5> to FS<7> are "L". Then, when the write signal WRITE changes to "H" and subsequently the delay time in the delay circuit D3 elapses, the output node b1 of the NAND gate circuit ND6 changes to "H". On the other hand, it is assumed that the current waveform control signal FS<5> is "H", while the current waveform control signals FS<4>, FS<6>, and FS<7> are "L". Then, when the write signal WRITE changes to "H" and subsequently the sum of the delay times in the delay circuits D3 and D4 elapses, the output node b1 of the NAND gate circuit ND7 changes to "H".

When the output node b1 of the NAND gate circuit ND7 changes to "H", an input node d1 of the flip-flop circuit FF1 changes from "H" to "L". Thus, the output node c2 of the flip-flop circuit FF1 changes to "H". Therefore, the output signal WP<i> or BP<j> from the waveform generating circuit Wi or Bj, respectively, changes to "L".

Subsequently, the delay time in the delay circuit D8 elapses. Then, an input node b2 of the NAND gate circuit ND9 changes to "L", whereas the input node d1 of the flip-flop circuit FF1 changes to "H". However, the output signal WP<i> or BP<j> from the waveform generating circuit Wi or Bj, respectively, remains "H".

Finally, the write signal WRITE changes from "H" to "L". Then, the values for the input nodes a1, a2, b1, and b2 of the NAND gate circuits ND8 and ND9 change to return to the initial state.

Figure 59:
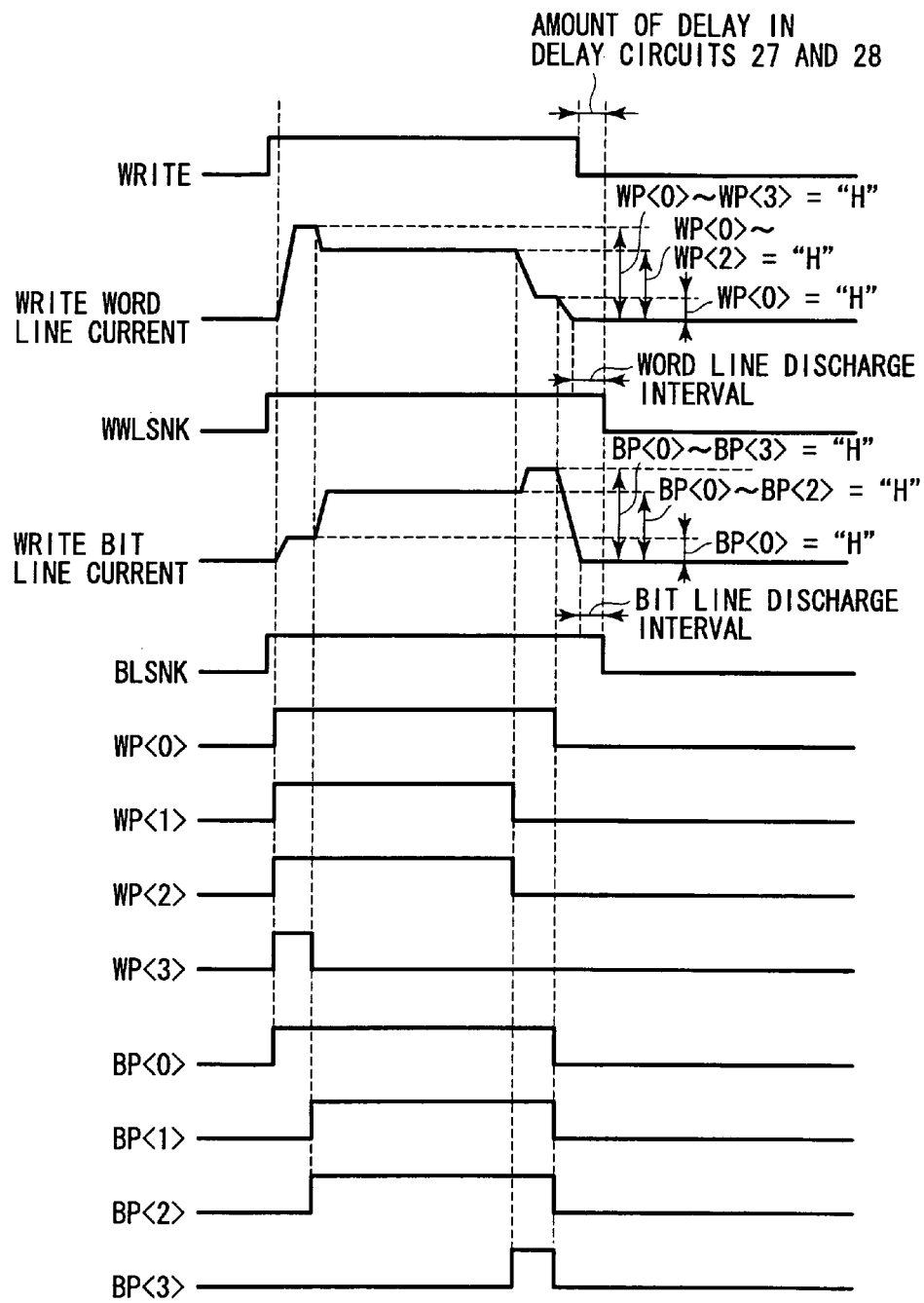
FIG. 59 is a waveform diagram showing examples of write word/bit line drive signals generated using the waveform generating circuit in FIG. 58 and write word/bit line currents controlled by these signals.

FIG. 59 shows examples of waveforms of write word line/bit line drive signals WP<0> to WP<3> and BP<0> to BP<7> generated by the waveform generating circuit in FIG. 58 as well as resultant write word/bit line currents.

Each of the waveforms shown in FIG. 59 corresponds to the waveform of a write current provided with a variation in the magnitude of a rise and/or fall, i.e. these waveforms are not trapezoidal. These waveforms are obtained if the current waveform control signals FS<0> to FS<7> for each waveform generating circuits registered in the setting circuit, described later, are as shown below.

Waveform generating circuit WP<0>: FS<0> (for WP<0>)="H", FS<7> (for WP<0>)="H"

Waveform generating circuit WP<1>: FS<0> (for WP<1>)="H", FS<6> (for WP<1>)="H"

Waveform generating circuit WP<2>: FS<0> (for WP<2>)="H", FS<6> (for WP<2>)="H"

Waveform generating circuit WP<3>: FS<0> (for WP<3>)="H", FS<4> (for WP<3>)="H"

Waveform generating circuit BP<0>: FS<0> (for BP<0>)="H", FS<7> (for BP<0>)="H"

Waveform generating circuit BP<1>: FS<1> (for BP<1>)="H", FS<7> (for BP<1>)="H"

Waveform generating circuit BP<2>: FS<1> (for BP<2>)="H", FS<7> (for BP<2>)="H"

Waveform generating circuit BP<3>: FS<3> (for BP<3>)="H", FS<7> (for BP<3>)="H"

However, the remaining signals FS<i> are all "L". Furthermore, since the write data DATA is assumed to be "1" (="H"), the output signals BP<4> to BP<7> from the waveform generating circuits B4 to B7, respectively, do not affect the write bit current. If the write data DATA is assumed to be "0" (="L"), the output signals BP<4> to BP<7> from the waveform generating circuits B4 to B7, respectively, are enabled in place of the output signals BP<0> to BP<3> from the waveform generating circuits B0 to B3, respectively.

This waveform diagram indicates that a combination of the "H" and "L" levels of the four write word line drive signals WP<0> to WP<3> determines the timings for starting and ending the supply of a write word line current as well as the magnitude of the write current and its temporal variation (current waveform). Likewise, a combination of the "H" and "L" levels of the four write bit line drive signals BP<0> to BP<3> determines the timings for starting and ending the supply of a write bit line current as well as the magnitude of the write current and its temporal variation (current waveform). This is apparent from the configuration of the circuit in the row decoder and write word line driver/sinker, shown in FIG. 53, and the configuration of the circuit in the column decoder and write bit line driver/sinker, shown in FIG. 54.

The amounts of delay in the delay circuits 27 and 28 in FIGS. 56 and 57, respectively, and the delay times in the delay circuits D0 to D6 in FIG. 58 are adjusted so that the write word/bit line sink signals WWLSNK and WBLSNK change from "H" to "L" after all the write word/bit line drive signals WP<0> to WP<3> and BP<0> to BP<7> have changed to "L".

Figure 60:
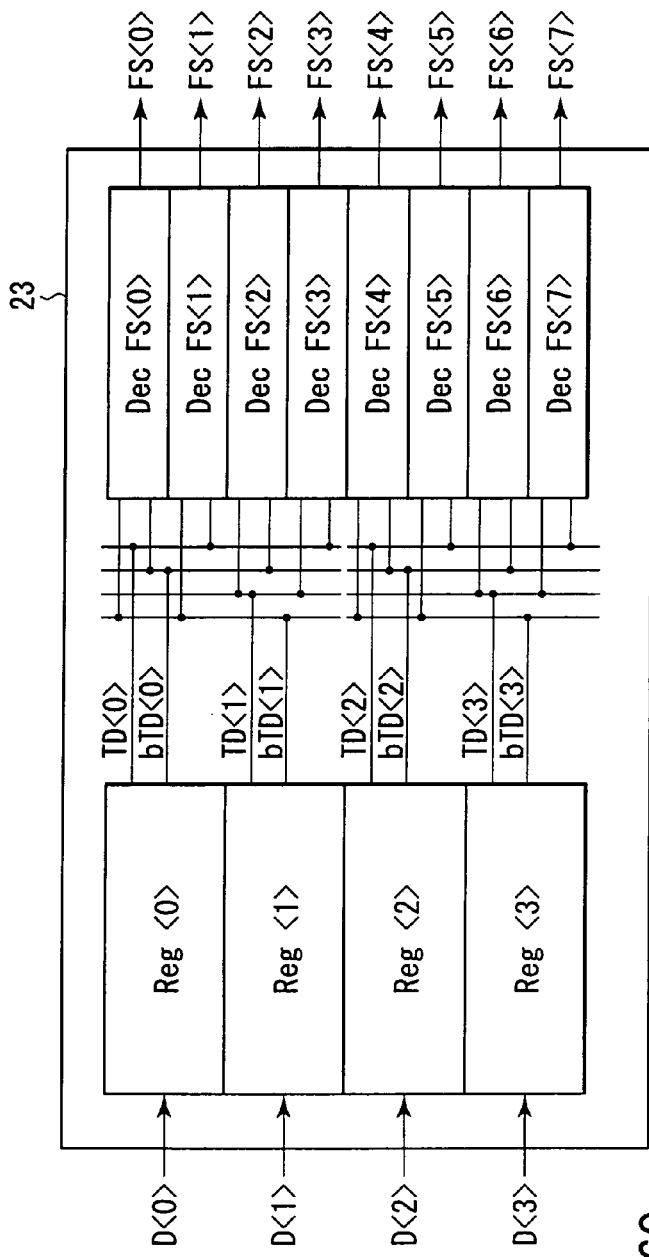
FIG. 60 is a circuit diagram of a setting circuit shown in FIG. 58 and generating a current waveform control signal.

FIG. 60 shows an example of the setting circuit 23 in FIG. 52, which generates current waveform control signals FS<0> to FS<7>, shown in FIG. 58.

The setting circuit 23 is composed of the plurality of registers Reg<0> to Reg<3> in which setting data used to set the timings for starting and ending the supply of a write current as well as the magnitude of the write current and its temporal variation (current waveform) and a plurality of decoders DecFS<0> to DecFS<7> which decode the complementary output signals TD<0> to TD<3> and bTD<0> to bTD<3>, respectively, from the respective registers Reg<0> to Reg<3> to output current waveform control signals FS<0> to FS<7>.

One setting circuit 23 is provided for one waveform generating circuit. In the present example, the four waveform generating circuits W0 to W3 are provided in the write word line driver/sinker trigger circuit. The eight waveform generating circuits B0 to B7 are provided in the write bit line driver/sinker trigger circuit. Accordingly, there are 12 setting circuits in total.

Setting data used to determine the rise timings for the write word line/bit line drive signals WP<0> to WP<3> and BP<0> to BP<7> is programmed in the registers Reg<0> and Reg<1> in the setting circuit 23. There are four rise timings for the write word line/bit line drive signals WP<0> to WP<3> and BP<0> to BP<3> based on the 2-bit setting data registered in the registers Reg<0> and Reg<1>.

Reference characters D<0> and D<1> denote setting data input by equipment located outside the MRAM in the test mode. In the test mode, it is possible to determine the rise timings for the write word line/bit line drive signals WP<0> to WP<3> and BP<0> to BP<7> on the basis of this setting data.

Setting data used to determine the fall timings for the write word line/bit line drive signals WP<0> to WP<3> and BP<0> to BP<7> is programmed in the registers Reg<2> and Reg<3> in the setting circuit 23. There are four fall timings for the write word line/bit line drive signals WP<0> to WP<3> and BP<0> to BP<3> based on the 2-bit setting data registered in the registers Reg<2> and Reg<3>.

Reference characters D<2> and D<3> denote setting data input by equipment located outside the MRAM in the test mode. In the test mode, it is possible to determine the fall timings for the write word line/bit line drive signals WP<0> to WP<3> and BP<0> to BP<7> on the basis of this setting data.

The registers Reg<0> to Reg<3> in the setting circuit 23 are configured similarly to the registers shown in FIG. 42 or 43. The decoders DecFS<0> to DecFS<7> are configured similarly to the decoders shown in FIG. 45.

Figure 61:
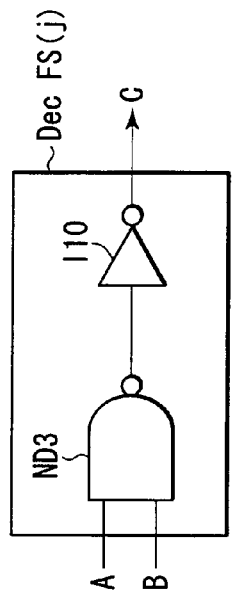
FIG. 61 is a circuit diagram of each of the decoders in the setting circuit shown in FIG. 60.

FIG. 61 shows an example of a circuit in the decoder DecFS<j> (j=0, 1, . . . , 7) in the setting circuit shown in FIG. 60.

The decoder DecFS<j> is composed of the NAND gate circuit ND3 and the inverter I10.

Two input signals A and B are input to the NAND gate circuit ND3. An output signal from the NAND gate circuit is input to the inverter I10. The inverter I10 outputs a signal C as a signal FS<j>.

Table 2 shows the relationships among the input and output signals in the decoder DecFS<j>.

TABLE 2

| Input signal | | Output signal |
| --- | --- | --- |
| A | B | C |
| bTD<0> | bTD<1> | FS<0> |
| TD<0> | bTD<1> | FS<1> |
| bTD<0> | TD<1> | FS<2> |
| TD<0> | TD<1> | FS<3> |
| bTD<2> | bTD<3> | FS<4> |
| TD<2> | bTD<3> | FS<5> |
| bTD<2> | TD<3> | FS<6> |
| TD<2> | TD<3> | FS<7> |

As described above, the MRAM device according to the seventh embodiment enables the setting, for each chip or memory cell array, of the timings for starting and ending the supply of a write current to the write word line/bit line as well as the magnitude of the write current and its temporal variation (current waveform). This realizes writes that reliably switch the magnetization in the recording layer in the MTJ element to improve the write characteristics.

Furthermore, although the orientation of a current through the write bit line varies with the value of write data, it is possible to set, individually for the orientation of the write bit line current, the timings for starting and ending the supply of the write current as well as the magnitude of the write current and its temporal variation (current waveform).

Specifically, when the write data is "1" (="H"), the write bit line drive signals BP<0> to BP<3> control the timings for starting and ending the supply of a write bit line current as well as the magnitude of the write bit line current and its temporal variation (current waveform). When the write data is "0" (="L"), the write bit line drive signals BP<4> to BP<7> control the timings for starting and ending the supply of a write bit line current as well as the magnitude of the write bit line current and its temporal variation (current waveform).

Thus, in accordance with the orientation of a write current flowing through the write bit line, the timings for starting and ending the supply of the write current as well as the magnitude of the write current and its temporal variation (current waveform) can be set taking the characteristics of the MTJ element into account. This makes it possible to switch reliably the magnetization in the recording layer in the MTJ element to improve the write characteristics.

Effects similar to those described previously are produced by using, as each of the delay circuits D0 to D6 in FIG. 58, a current control type delay circuit controlled by a current source circuit outputting a current Isource as described in the previously described first to sixth embodiments.

Variation of the Seventh Embodiment

The seventh embodiment can be changed so that the timings for starting and ending the supply of a write current as well as the magnitude of the write current and its temporal variation (current waveform) is set for each chip or memory cell array, with the orientation of the write bit line current remaining unchanged.

Specifically, the column decoder and write bit line driver/sinker shown in FIG. 54 is changed so that the write bit line drive signals BP<0> to BP<3> are input to the NAND gate circuits NDBP4 to NDBP7, respectively, in one column of the column decoder and write bit line driver/sinker 17A. That is, the write bit line drive signals input to the NAND gate circuits NDBP0 to NDBP3, respectively, in one column of the column decoder and write bit line driver/sinker 17A are the same as the write bit line drive signals input to the NAND gate circuits NDBP4 to NDBP7, respectively, in the column decoder and write bit line driver/sinker 17A.

As a result, the number of write bit line drive signals decreases to half compared to the seventh embodiment. That is, the number of waveform generating circuits in the write bit line driver/sinker trigger circuit decreases. It is thus possible to reduce the area of the write current waveform control circuit 24 on the chip. This contributes to a reduction in chip size and the like.

Eighth Embodiment

Description will be given of an MRAM device according to the eighth embodiment in which a write current source circuit is constructed inside the MRAM chip and outputs a current that changes the wave height of a write current so as to make the pulse width of the write current dependent on temperature.

Figure 62:
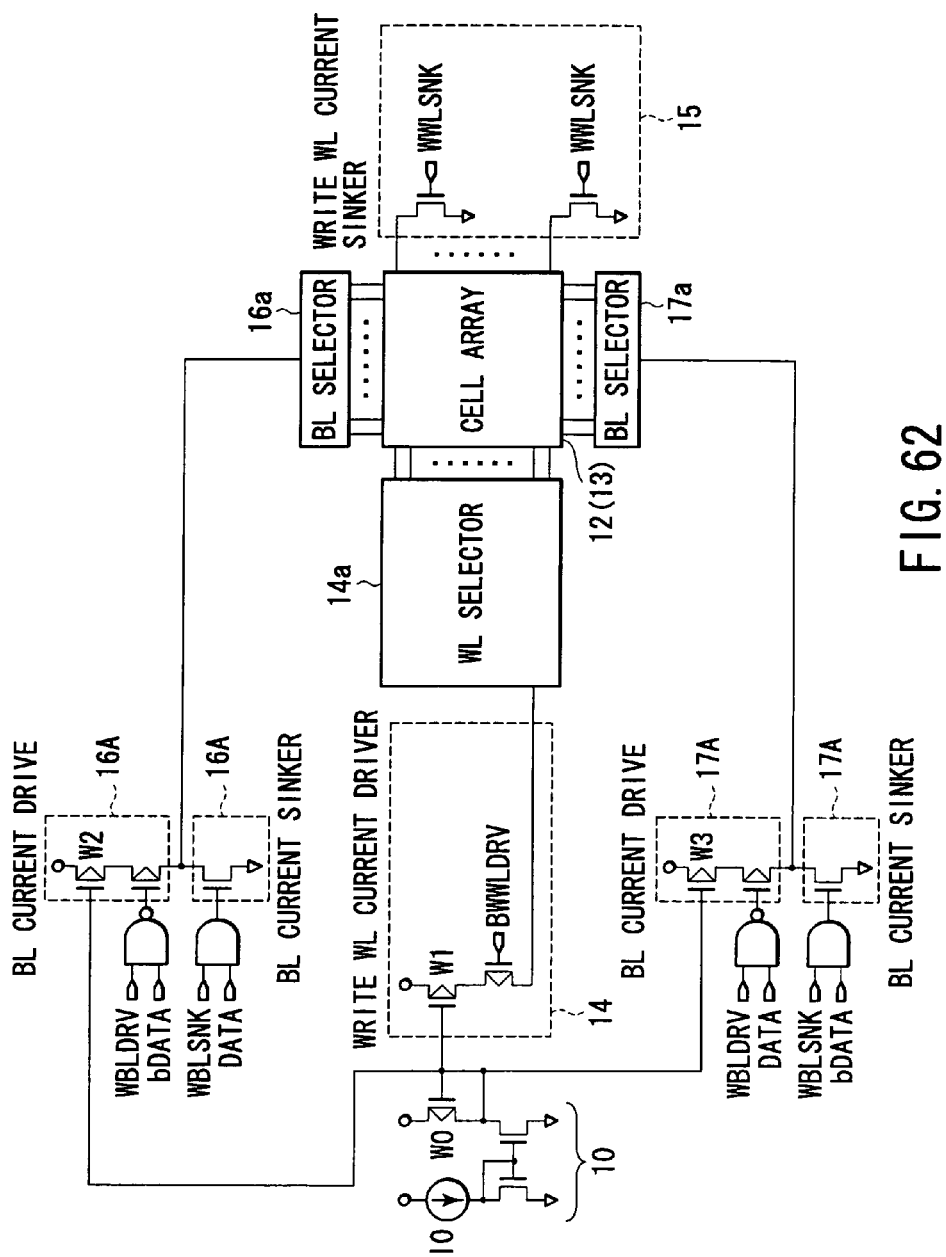
FIG. 62 is a block diagram partly showing an MRAM device according to an eighth embodiment.

FIG. 62 shows the configuration of circuits in a part of the MRAM device according to the eighth embodiment.

In the figure, reference numerals 12 and 13 denote memory arrays. Reference numerals 14, 14a, and 15 denote a write word line current driver, word line selector, and a write word line current sinker, respectively. Reference numerals 16A and 17A denote bit line current drivers/sinkers. Reference numerals 16a and 17a denote bit line selectors. Reference character Io denotes a current source. Reference numeral 10 denotes a current control circuit that distributes and controls a current from the current source Io to the write word line current driver 14 and the bit line current drivers/sinkers 16A and 17A.

Figure 63:
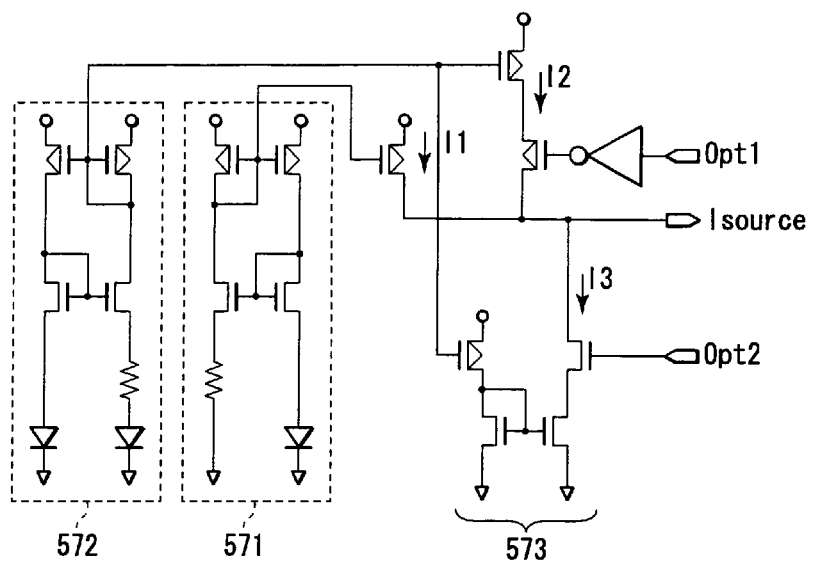
FIG. 63 is a circuit diagram of a current source circuit used in FIG. 62 to output a current that is dependent on temperature.

FIG. 63 shows an example of a temperature-dependent current source circuit used as the current source Io in FIG. 62.

This current source circuit is composed of a first current source 571 that provides a current having a value decreasing in proportion to temperature as in the case with the current source 81, shown in FIG. 14, a second current source 572 that provides a current having a value increasing in proportion to temperature as in the case with the current source 82, shown in FIG. 14, and a current combining circuit 573 that combines the currents from these current sources on the basis of a selection control signal Opt1 to output the resultant current Isource.

The current combining circuit 573 is configured to add a current I2 obtained by copying a current from the second current source 572 to a current I1 obtained by copying a current from the first current source 571 to output the resultant current Isource when the signal Opt1 is active ("H" level). The current combining circuit 573 is also configured to subtract a current I3 obtained by copying a current from the second current source 572 from the current I1 obtained by copying the current from the first current source 571 to output the resultant current Isource when a signal Opt2 is active ("H" level).

Figure 64:
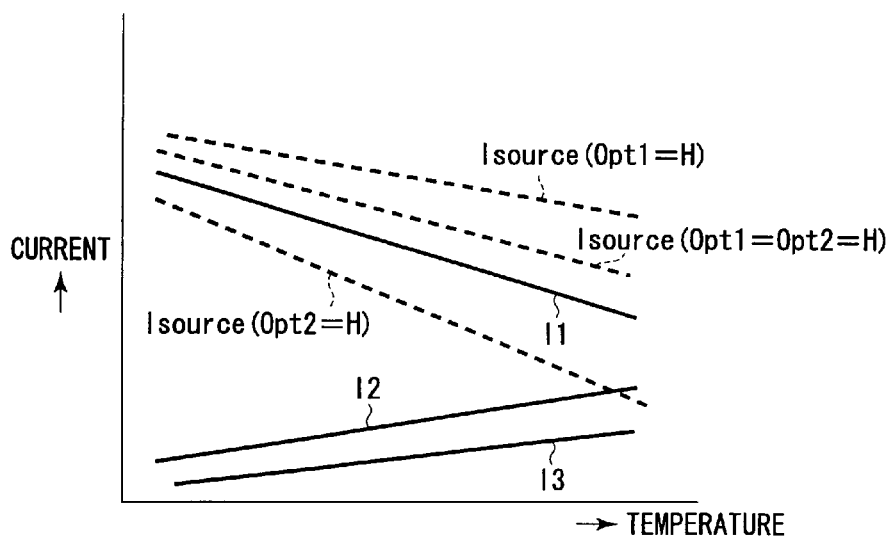
FIG. 64 is a characteristic diagram showing the relationship between the temperature of and a current from the current source circuit shown in FIG. 63.

FIG. 64 shows the relationship between the temperature of and a current from the current source circuit shown in FIG. 63.

Figure 65:
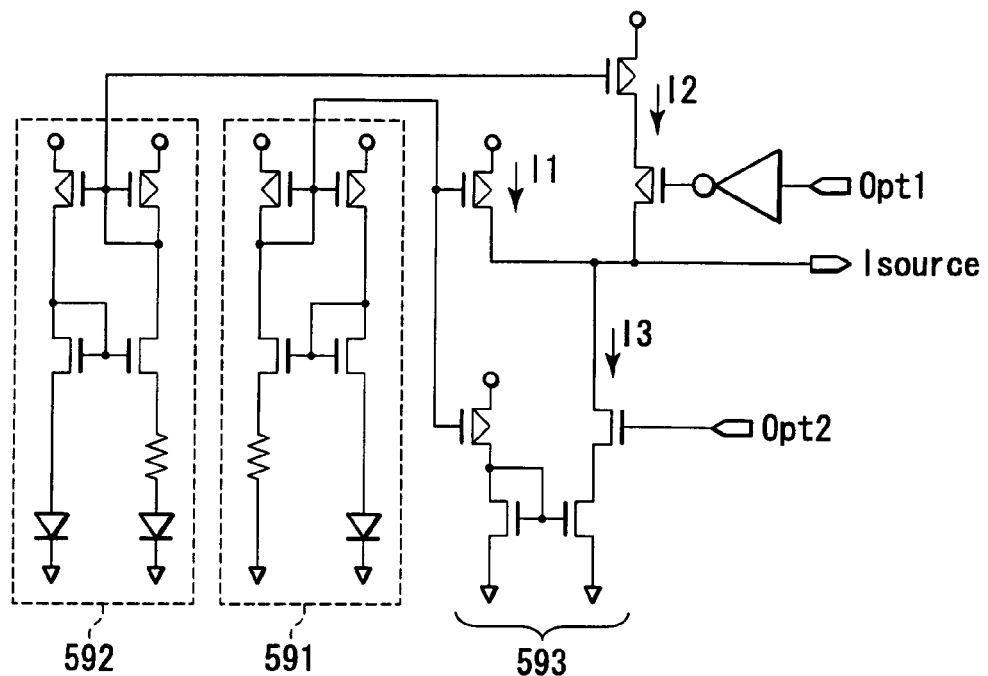
FIG. 65 is a circuit diagram showing another example of the current source circuit used in FIG. 62 to output a current that is dependent on temperature.

FIG. 65 shows another example of a temperature-dependent current source circuit used as the current source Io in FIG. 62.

This current source circuit is composed of a first current source 591 that provides a current having a value decreasing in proportion to temperature as in the case with the current source 81, shown in FIG. 14, a second current source 592 that provides a current having a value increasing in proportion to temperature as in the case with the current source 82, shown in FIG. 14, and a current combining circuit 593 that combines the currents from these current sources on the basis of the selection control signals Opt1 and Opt2 to output the resultant current Isource.

The current combining circuit 593 is configured to add a current I2 obtained by copying a current from the second current source 592 to a current I1 obtained by copying a current from the first current source 591 to output the resultant current Isource when the signal Opt1 is active ("H" level). The current combining circuit 593 is also configured to subtract a current I3 obtained by copying the current from the first current source 591 from the current I1 obtained by copying the current from the first current source 591 to output the resultant current Isource when the signal Opt2 is active ("H" level).

Figure 66:
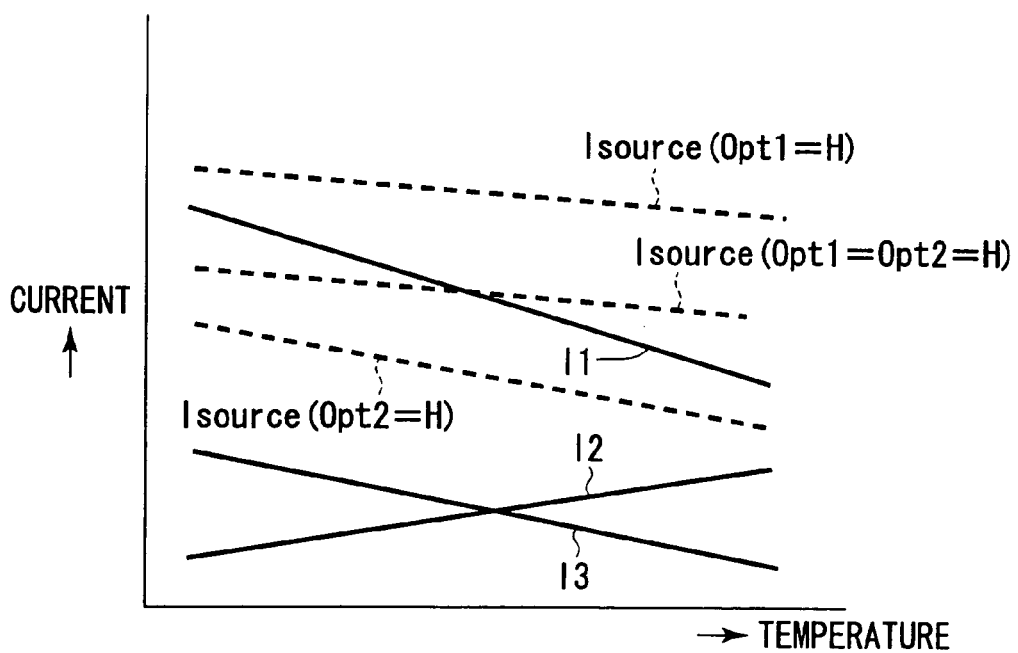
FIG. 66 is a characteristic diagram showing the relationship between the temperature of and a current from the current source circuit shown in FIG. 65.

FIG. 66 shows the relationship between the temperature of and a current from the current source circuit shown in FIG. 65.

Each of the current source circuits in FIGS. 63 and 65 has a temperature dependence such that the output current Isource decreases in high temperature regions.

The point at which the write current is switched in the write test mode is applicable regardless of the type of cell array structure of the MRAM device. Specifically, it is applicable, for example, not only to an MRAM device having a cross point type cell array structure such as the one shown in FIG. 3 but also to an MRAM device having a cell array structure in which one read selection switch is connected to one or more MTJ elements as shown in FIG. 4. Moreover, it is applicable to an MRAM device not having any read selection switches, an MRAM device in which read bit lines are provided separately from write bit lines, an MRAM device in which a plurality of bits are stored in one MTJ element. And the circuit is applicable not restricted the MTJ configuration, for example, the double junction or the synthetic anti-ferromagnetic pinned layer structure or the synthetic anti-ferromagnetic free layer structure, etc.

The MRAM devices according to the embodiments of the present invention can be applied in various manners. Some of these applied examples will be described below.

APPLIED EXAMPLE 1

Figure 67:
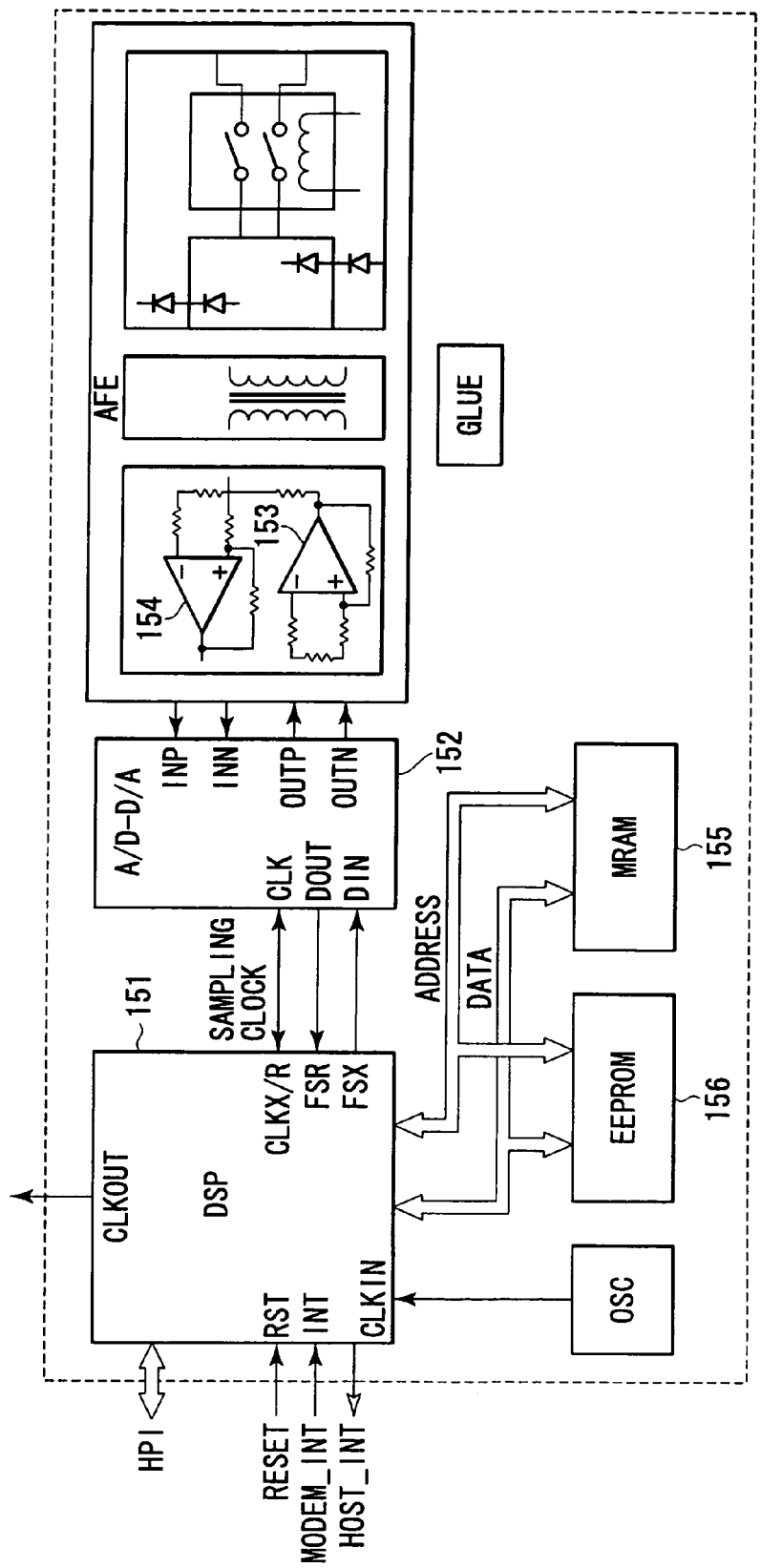
FIG. 67 is a block diagram showing a DLS data path portion of a digital subscriber modem that is a first example of the application of the MRAM device.

As an example in which the MRAM device is applied, FIG. 67 shows a DSL data path portion of a digital subscriber line (DSL) modem. This modem includes a programmable digital signal processor (DSP) 151, an analog-to-digital converter (ADC) and digital-to-analog converter (DAC) 152, a transmission driver 153, and a receiver amplifier 154. In FIG. 67, a band pass filter is omitted. Instead, this figure shows an MRAM 155 and an EEPROM 156 according to the present invention as optional memories of the type that can hold a circuit code program.

In the present applied example, the two types of memories, i.e. the MRAM and the EEPROM, are used as a memory for holding the circuit code program. However, the EEPROM may be replaced with an MRAM. That is, the MRAMs alone may be used instead of the two types of memories.

APPLIED EXAMPLE 2

Figure 68:
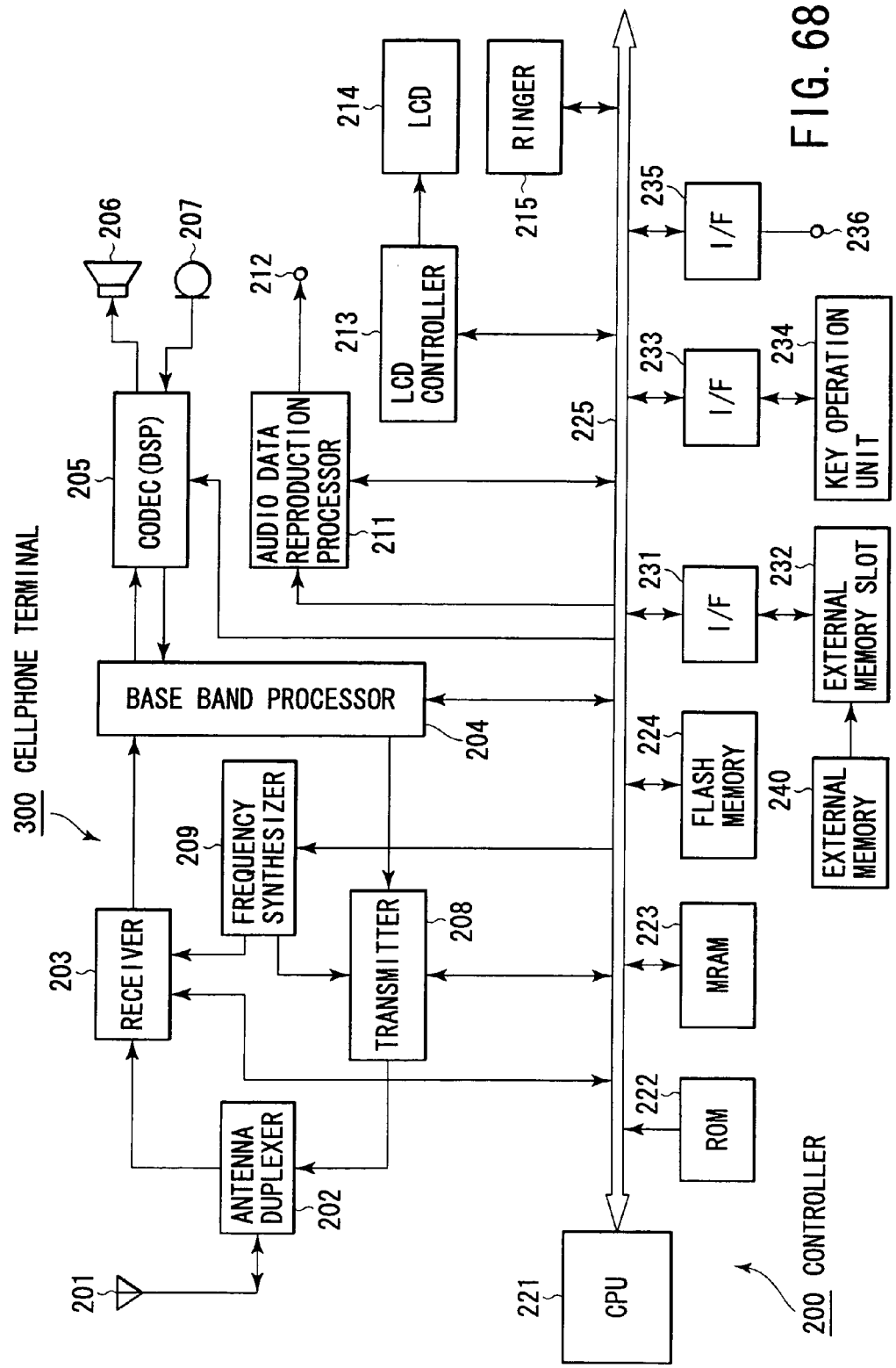
FIG. 68 is a block diagram showing a portion of a cellphone which implements a communication function, the cellphone being a second example of the application of the MRAM device.

As another example in which the MRAM device is applied, FIG. 68 shows a portion of a cellphone terminal 300 which realizes a communication function. As shown in FIG. 68, the portion realizing the communication function comprises a transmission and reception antenna 201, an antenna duplexer 202, a receiver 203, a base band processor 204, a digital signal processor (DSP) used as a sound codec, a speaker 206, a microphone 207, a transmitter 208, and a frequency synchronizer 209.

Further, as shown in FIG. 68, the cellphone terminal 300 is provided with a controller 200 that controls each section of the cellphone terminal. The controller 200 is a microcomputer composed of a CPU 221, a ROM 222, an MRAM 223 according to the present invention, and a flash memory 224 all of which are connected together through a CPU bus 225.

Here, the ROM 222 already stores programs executed in the CPU 221 and required data such as display fonts. Further, the MRAM 223 is mainly used as a work area to store, as required, data being calculated while the CPU 221 is running a program or to store temporarily data transmitted to or received from a relevant section. Furthermore, if for example, the cellphone terminal 300 is used in such a manner that when the cellphone terminal 300 is powered off, the last set conditions and the like are stored so that the same settings are effected the next time the terminal 300 is powered on, the flash memory 224 stores these setting parameters. That is, the flash memory 224 is non-volatile, so that even when the cellphone terminal is powered off, the data stored in this memory is not lost.

In the present applied example, the ROM 222, the NRAM 223, and the flash memory 224 are used. However, the flash memory 224 may be replaced with the MRAM according to the present invention. Furthermore, the ROM 222 may also be replaced with the MRAM according to the present invention.

In FIG. 68, reference numerals 211 and 212 denote an audio data reproduction processor and an external terminal connected to the sound data processing section 211, respectively. Reference numerals 213 and 214 denote an LCD controller and an LCD connected to the LCD controller 213, respectively. Reference numerals 215 and 231 denote a ringer and an interface provided between the CPU bus 225 and an external memory slot 232, respectively. Reference numerals 233 and 235 denote an interface provided between the CPU bus 225 and a key operation unit 234, and an interface provided between the CPU bus 225 and an external terminal 236, respectively. An external memory 240 is inserted into an external memory slot 232.

APPLIED EXAMPLE 3

FIGS. 69 to 73 show an example in which the MRAM device according to the present invention is applied to a card (MRAM card) that embodies a removable medium such as a Smart Media card.

Figure 69:
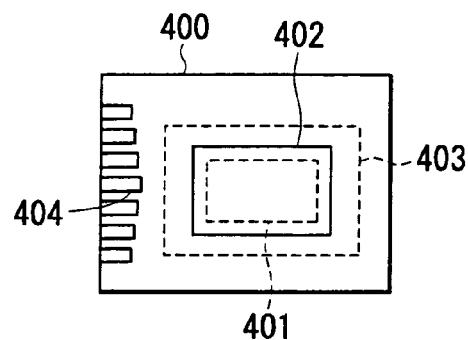
FIG. 69 is a plan view showing an example in which the MRAM device is applied to an MRAM card that houses media contents such as a Smart Media.

In the plan view in FIG. 69, reference numerals 400, 401, and 402 denote an MRAM card main body, an MRAM chip, and an opening, respectively. Reference numerals 403 and 404 denote a shutter and a plurality of external terminals, respectively. The MRAM chip 401 is housed inside the card main body 400 and exposed from the opening 402. When the MRAM card is carried, the MRAM chip 401 is covered with the shutter 403. The shutter 403 is composed of a material that is effective in blocking external magnetic fields, e.g. ceramics. To transfer data, the shutter 403 is opened to expose the MRAM chip 401. The external terminal 404 is used to unload and transmit contents data stored in the MRAM card to external equipment.

Figure 70:
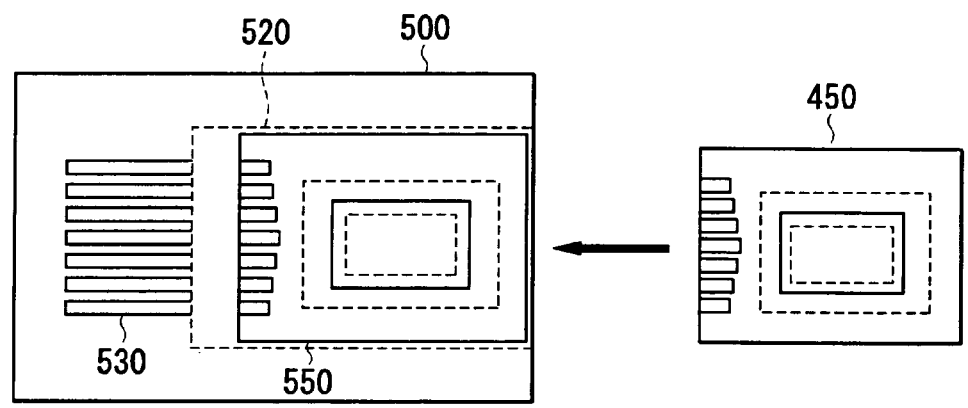
FIG. 70 is a plan view showing an insertion type data transfer apparatus as an example of an electronic apparatus that uses the MRAM card.

FIGS. 70 and 71 are a plan and side views, respectively, of a card insertion type transfer apparatus that transfers data to the MRAM card. A second MRAM card 450 used by an end user is inserted through an insertion section 510 of a transfer apparatus 500 and is pushed until it is stopped by a stopper 520. The stopper 520 is also used as a member for aligning a first MRAM card 550 with the second MRAM card 450. Once the second MRAM card 450 is placed in position, the data stored in the first MRAM 550 is transferred to the second MRAM 450.

Figure 72:
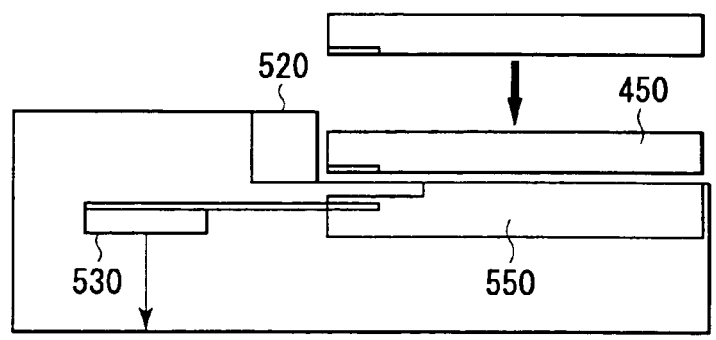
FIG. 72 is a sectional view showing a fit-in type data transfer apparatus as another example of the electronic apparatus that uses the MRAM card.

FIG. 72 is a side view of a fit-in type transfer apparatus. With this type of transfer apparatus, the second MRAM card 450 is fitted over the first MRAM card 550 so as to abut the stopper 520 as shown by the arrow in the figure. A transfer method used by this type is similar to that for the card insertion type. Accordingly, its description is omitted.

FIG. 73 is a side view of a slide-type transfer apparatus. As in the case with a CD-ROM drive or a DVD drive, a sliding tray 560 is provided in the transfer apparatus 500. The sliding tray 560 slides as shown by the horizontal arrow in the figure. When the sliding tray 560 moves as shown by the broken lines in the figure, the second MRAM card 450 is placed on the sliding tray 560. Subsequently, the sliding tray 560 conveys the second MRAM card 450 to the interior of the transfer apparatus 500. This type is the same as the card insertion type in terms of the point that the second MRAM card is conveyed so that its tip abuts the stopper 520 and in terms of the transfer method. Accordingly, the description of these points is omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory device comprising:
   a memory cell array in which a plurality of memory cells two-dimensionally arranged in a row direction and a column direction and each composed of a magneto-resistive effect element;
   a plurality of first write lines each of which is provided along a row direction of the memory cell array and generates a magnetic field in a row direction of the memory cell array when a pulse-like first write current is applied to the plurality of first write lines along the row direction;
   a plurality of second write lines each of which is provided along a column direction of the memory cell array and generates a magnetic field in a column direction of the memory cell array when a pulse-like second write current is applied to the plurality of second write lines along the column direction of the memory cell array, data being written in each memory cell by applying a combined magnetic field of the magnetic field generated in the column direction and the magnetic field generated in the row direction; and
   a control circuit connected to the plurality of first and second write lines to control a dependence on temperature of a pulse width of at least one of the first write current and second write current.

2. A magnetic random access memory device according to claim 1, wherein the control circuit controls the temperature dependence of the pulse width so that the pulse width of the at least one of the write currents is independent of temperature.

3. A magnetic random access memory device according to claim 1, wherein the control circuit controls the temperature dependence of the pulse width so that the pulse width of the at least one of the write currents increases consistently with temperature.

4. A magnetic random access memory device according to claim 3, wherein the control circuit provides control such that a time for which the second write current is applied varies depending on data written in the memory cell.

5. A magnetic random access memory device according to claim 3, wherein the control circuit provides control such that a time for which the first write current is applied differs from the time for which the second write current is applied, in accordance with the data written in the memory cell.

6. A magnetic random access memory device according to claim 3, wherein the control circuit controls the magnitude of the at least one of the first and second write currents to vary between a front edge and/or rear edge and a central portion of the pulse width.

7. A magnetic random access memory device according to claim 3, wherein the control circuit controls the time for which the at least one of the write currents is applied to decrease with increasing temperature.

8. A magnetic random access memory device according to claim 3, wherein the control circuit controls a temperature dependence of the time for which the first write current is applied to differ from a temperature dependence of the time for which the second write current is applied.

9. A magnetic random access memory device according to claim 2, wherein the control circuit controls a timing for starting application of the first write current and a timing for starting application of the second write current as well as a timing for ending the application of the first write current and a timing for ending the application of the second write current to vary with temperature.

10. A magnetic random access memory device according to claim 3, wherein the control circuit adjusts a relationship between the timing for starting the application of the first write current and the timing for starting the application of the second write current and a relationship between the timing for ending the application of the first write current and the timing for ending the application of the second write current.

11. A magnetic random access memory device according to claim 10, further comprising a storage element that stores, in a nonvolatile manner, information used to control the timings for applying the first and second currents.

12. A magnetic random access memory device according to claim 11, wherein the storage element is a laser blow fuse element.

13. A magnetic random access memory device according to claim 11, wherein the storage element is a tunnel magnetoresistive element.

14. A magnetic random access memory device according to claim 11, wherein the storage element is an anti-fuse that stores data depending on whether or not the tunnel magnetoresistive element is dielectrically broken down.

15. A magnetic random access memory device according to claim 2, further comprising:
   a first driver connected to the plurality of first write lines to supply the first write current;
   a second driver connected to the plurality of second write lines to supply the second write current;
   a first sinker connected to the plurality of first write lines to sink the first write current;
   a second sinker connected to the plurality of second write lines to sink the second write current;
   a setting circuit which is connected to the control circuit and in which first setting data used to control a current waveform of the first write current and second setting data used to control a current waveform of the second write current are registered;
   a first trigger circuit connected to the first driver and the first sinker to generate a first trigger signal to control the first driver and the first sinker; and
   a second trigger circuit connected to the second driver and the second sinker to generate a second trigger signal to control the second driver and the second sinker, wherein the control circuit receives the first and second setting data or data obtained by decoding the first and second setting data, and controls at least one of the first trigger circuit and second trigger circuit on the basis of these data to control at least one of the time for which the write currents are applied by the first driver and the second driver, respectively, the application timings, the magnitude of the write current, and the waveform of the write current.

16. A magnetic random access memory device according to claim 15, wherein the first sinker finishes operations a specified period after the first driver has finished operations.

17. A magnetic random access memory device according to claim 15, wherein the second sinker finishes operations a specified period after the second driver has finished operations.

18. A magnetic random access memory device according to claim 15, wherein the first trigger circuit has a first delay circuit for which a delay time is set in accordance with a value of an input current, and the first trigger circuit receives a write signal to generate, on the basis of the write signal, the first trigger signal having a period corresponding to the delay time of the first delay circuit, and the second trigger circuit has a second delay circuit for which a delay time is set in accordance with the value of the input current, and the second trigger circuit receives the write signal to generate, on the basis of the write signal, the second trigger signal having a period corresponding to the delay time of the second delay circuit.

19. A magnetic random access memory device according to claim 18, further comprising a current source circuit which outputs and supplies the input current to the first and second trigger circuits.

20. A magnetic random access memory device according to claim 19, wherein the input current generated by the current source circuit is independent of temperature.

21. A magnetic random access memory device according to claim 19, wherein the current source circuit includes:
a first current source which outputs a first current having a value increasing in proportion to temperature;
a second current source which outputs a second current having a value decreasing in proportion to temperature; and
a current summing circuit which adds up the first and second currents to generate the input current.

22. A magnetic random access memory device according to claim 3, further comprising:
a first driver connected to the plurality of first write lines to supply the first write current;
a second driver connected to the plurality of second write lines to supply the second write current;
a first sinker connected to the plurality of first write lines to sink the first write current;
a second sinker connected to the plurality of second write lines to sink the second write current;
a setting circuit which is connected to the control circuit and in which first setting data used to control a current waveform of the first write current and second setting data used to control a current waveform of the second write current are registered;
a first trigger circuit connected to the first driver and the first sinker to generate a first trigger signal to control the first driver and the first sinker; and
a second trigger circuit connected to the second driver and the second sinker to generate a second trigger signal to control the second driver and the second sinker, wherein the control circuit receives the first and second setting data or data obtained by decoding the first and second setting data, and controls at least one of the first trigger circuit and second trigger circuit on the basis of these data to control at least one of the time for which the write currents are applied by the first driver and the second driver, respectively, the application timings, the magnitude of the write current, and the waveform of the write current.

23. A magnetic random access memory device according to claim 22, wherein the first sinker finishes operations a specified period after the first driver has finished operations.

24. A magnetic random access memory device according to claim 22, wherein the second sinker finishes operations a specified period after the second driver has finished operations.

25. A magnetic random access memory device according to claim 22, wherein the first trigger circuit has a first delay circuit for which a delay time is set in accordance with a value of an input current, and the first trigger circuit receives a write signal to generate, on the basis of the write signal, the first trigger signal having a period corresponding to the delay time of the first delay circuit, and the second trigger circuit has a second delay circuit for which a delay time is set in accordance with the value of the input current, and the second trigger circuit receives the write signal to generate, on the basis of the write signal, the second trigger signal having a period corresponding to the delay time of the second delay circuit.

26. A magnetic random access memory device according to claim 25, further comprising a current source circuit which generates and supplies the input current to the first and second trigger circuits.

27. A magnetic random access memory device according to claim 26, wherein the input current generated by the current source circuit has a temperature dependence that the value of the input current increases consistently with temperature.

28. A magnetic random access memory device according to claim 27, wherein the current source circuit includes:
a first current source which outputs a first current having a value increasing in proportion to temperature;
a second current source which outputs a second current having a value decreasing in proportion to temperature; and
a current subtraction circuit which subtracts the second current from the first current to generate the input current.

29. A magnetic random access memory device according to claim 26, wherein the temperature dependence of the input current from the current source circuit is exhibited as a folded line.

30. A magnetic random access memory device according to claim 1, wherein the magnetoresistive element is a tunnel magnetoresistive element having a tunnel barrier film sandwiched between two ferromagnetic layers.

31. A magnetic random access memory device according to claim 1, wherein the plurality of first write lines are write word lines, and the plurality of second write lines are write bit lines.

* * * * *